United States Patent
Iwase et al.

(10) Patent No.: US 10,473,958 B2
(45) Date of Patent: Nov. 12, 2019

(54) SHIFT REGISTER, DISPLAY DEVICE PROVIDED WITH SAME, AND METHOD FOR DRIVING SHIFT REGISTER

(71) Applicant: Sharp Kabushiki Kaisha, Osaka (JP)

(72) Inventors: Yasuaki Iwase, Osaka (JP); Takuya Watanabe, Osaka (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 209 days.

(21) Appl. No.: 15/511,427

(22) PCT Filed: Sep. 17, 2015

(86) PCT No.: PCT/JP2015/076429
§ 371 (c)(1),
(2) Date: Mar. 15, 2017

(87) PCT Pub. No.: WO2016/047544
PCT Pub. Date: Mar. 31, 2016

(65) Prior Publication Data
US 2017/0285375 A1    Oct. 5, 2017

(30) Foreign Application Priority Data

Sep. 22, 2014 (JP) .................... 2014-192434

(51) Int. Cl.
*G11C 19/00* (2006.01)
*G02F 1/133* (2006.01)
(Continued)

(52) U.S. Cl.
CPC .......... *G02F 1/133* (2013.01); *G09G 3/2011* (2013.01); *G09G 3/3677* (2013.01);
(Continued)

(58) Field of Classification Search
None
See application file for complete search history.

(56) References Cited

U.S. PATENT DOCUMENTS 7,817,771 B2 * 10/2010 Tsai ................... G11C 19/28
377/64
8,107,586 B2 * 1/2012 Shin ................... G09G 3/3677
377/64
(Continued)

FOREIGN PATENT DOCUMENTS

JP       2010-140593 A   6/2010
WO       2010/067641 A1  6/2010

*Primary Examiner* — Tuan T Lam
(74) *Attorney, Agent, or Firm* — ScienBiziP, P.C.

(57) ABSTRACT

The present invention provides a monolithic gate driver that includes fewer elements than in conventional configurations. In one aspect, a plurality of stages included in a shift register are divided into a plurality of stage circuit groups, where each stage circuit group includes the stage circuits of P adjacent stages (two stages, for example). Each stage circuit group includes a stabilization node and a stabilization node controller that controls the voltage of the stabilization node. The stabilization node controller includes: thin-film transistors in which the gate terminals thereof are connected to output control nodes, the drain terminals thereof are connected to the stabilization node, and the source terminals thereof are connected to an input terminal for a DC supply voltage; and a thin-film transistor for changing the voltage of the stabilization node to a high level.

2 Claims, 42 Drawing Sheets

(51) Int. Cl.
   *G11C 19/28* (2006.01)
   *G09G 3/36* (2006.01)
   *G09G 3/20* (2006.01)
   *G11C 8/04* (2006.01)

(52) U.S. Cl.
   CPC ............ *G09G 3/3688* (2013.01); *G11C 8/04* (2013.01); *G11C 19/28* (2013.01); *G09G 2300/0408* (2013.01); *G09G 2310/0248* (2013.01); *G09G 2310/0286* (2013.01); *G09G 2330/021* (2013.01)

(56) References Cited

U.S. PATENT DOCUMENTS

| | | | |
|---|---|---|---|
| 2010/0150302 A1* | 6/2010 | Tsai | G11C 19/28 377/79 |
| 2011/0140108 A1* | 6/2011 | Kimura | H01L 29/786 257/57 |
| 2011/0199354 A1 | 8/2011 | Iwase et al. | |
| 2011/0199365 A1* | 8/2011 | Umezaki | G09G 3/3677 345/212 |
| 2013/0088265 A1* | 4/2013 | Chen | H03K 5/153 327/108 |
| 2014/0010341 A1* | 1/2014 | Wu | G11C 19/00 377/78 |
| 2014/0168044 A1 | 6/2014 | Hu et al. | |
| 2014/0168050 A1 | 6/2014 | Gu et al. | |

\* cited by examiner

RELATED ART

RELATED ART

RELATED ART

SHIFT REGISTER, DISPLAY DEVICE PROVIDED WITH SAME, AND METHOD FOR DRIVING SHIFT REGISTER

TECHNICAL FIELD

The present invention relates to an active-matrix display device, and more particularly to a shift register in a scanning signal line driver circuit for driving scanning signal lines in a display unit of an active-matrix display device.

BACKGROUND ART

Active-matrix liquid crystal display devices that include a plurality of source bus lines (image signal lines) and a plurality of gate bus lines (scanning signal lines) are a conventionally well-known technology. In past implementations of this type of liquid crystal display device, a gate driver (scanning signal line driver circuit) for driving the gate bus lines was often packaged as an integrated circuit (IC) chip that was then mounted on the periphery of a substrate included in the liquid crystal panel. In recent years, however, it has gradually become more common to form the gate driver directly on a TFT substrate, which is one of the two glass substrates included in the liquid crystal panel. Such gate drivers are known as "monolithic" gate drivers, for example.

The display unit of an active-matrix liquid crystal display device includes a plurality of source bus lines, a plurality of gate bus lines, and a plurality of pixel formation regions that are respectively formed at the intersections between the source bus lines and the gate bus lines. These pixel formation regions are arranged in a matrix pattern to form a pixel array. Each pixel formation region includes a thin-film transistor (a switching element) in which the gate terminal is connected to the gate bus line that passes through the corresponding intersection and the source terminal is connected to the source bus line that passes through the corresponding intersection, a pixel capacitor for maintaining the pixel voltage, and the like. Such active-matrix liquid crystal display devices also include a gate driver of the type described above as well as a source driver (image signal line driver circuit) for driving the source bus lines.

Image signals that represent pixel voltages are transmitted via the source bus lines. However, the source bus lines cannot simultaneously transmit several rows worth of the image signals that represent pixel voltages. As a result, the image signals (charges) must be sequentially written, row by row, to the pixel capacitors in the pixel formation regions that are arranged in a matrix pattern. Therefore, the gate driver is implemented as a multistage shift register so that the gate bus lines can be sequentially selected each prescribed interval of time. Moreover, the stages of the shift register sequentially output active scanning signals in order to sequentially write the image signals to the pixel capacitors one row at a time, as described above. Note that in the present specification, the circuits that form the stages of the shift register will be referred to as "stage circuits."

FIG. 38 is a circuit diagram of the most basic conventional configuration of a stage circuit. This stage circuit includes four thin-film transistors T81 to T84 and a single capacitor CAP. The stage circuit also includes an input terminal for a low-level DC supply voltage VSS, an output terminal 80, and four input terminals 81 to 84. The gate terminal of the thin-film transistor T81, the source terminal of the thin-film transistor T83, and the drain terminal of the thin-film transistor T84 are all connected together. As will be described below, the voltage of the region in which these terminals are connected to one another controls the state of the thin-film transistor T81 (that is, the ON and OFF states). In this way, the output of the stage circuit can be controlled. This region will therefore be referred to as the "output control node" below. The output control node is indicated by the reference character netA. Note that although typically whichever of the drain or source has the higher electric potential is referred to as the "drain," in the present specification one side is simply defined to be the drain side and the other side to be the source side. Accordingly, the source voltage may potentially be greater than the drain voltage. Furthermore, for convenience, the magnitude of the low-level DC supply voltage VSS will be referred to simply as the "VSS voltage."

The output terminal 80 outputs a scanning signal GOUT to be applied to the gate bus line that is connected to the stage circuit. A first gate clock signal CKA is input to the input terminal 81. A second gate clock signal CKB is input to the input terminal 82. Here, the phases of the first gate clock signal CKA and the second gate clock signal CKB are shifted from one another by 180°. A scanning signal that is output from the stage circuit of the previous stage is input to the input terminal 83 as a set signal S. A scanning signal that is output from the stage circuit of the next stage is input to the input terminal 84 as a reset signal R. Note that in the following description, the stage circuit of the previous stage will sometimes be referred to simply as "the previous stage," and the stage circuit of the next stage will sometimes be referred to simply as "the next stage."

In the thin-film transistor T81, the gate terminal is connected to the output control node netA, the drain terminal is connected to the input terminal 81, and the source terminal is connected to the output terminal 80. In the thin-film transistor T82, the gate terminal is connected to the input terminal 82, the drain terminal is connected to the output terminal 80, and the source terminal is connected to the input terminal for the DC supply voltage VSS. In the thin-film transistor T83, the gate terminal and the drain terminal are both connected to the input terminal 83 (that is, are diode-connected), and the source terminal is connected to the output control node netA. In the thin-film transistor T84, the gate terminal is connected to the input terminal 84, the drain terminal is connected to the output control node netA, and the source terminal is connected to the input terminal for the DC supply voltage VSS. In the capacitor CAP, one terminal is connected to the output control node netA, and the other terminal is connected to the output terminal 80.

Next, the operation of the stage circuit configured as illustrated in FIG. 38 will be described with reference to FIG. 39. Note that here, the period of time during which each stage circuit writes (charges) the pixel capacitor in the pixel formation region that is connected the corresponding gate bus line will be referred to as the "write operation period." Moreover, periods of time other than the write operation period will be referred to as "normal operation periods." In FIG. 39, the period from time t90 to time t92 corresponds to the write operation period, and the period prior to time t90 as well as the period after time t92 correspond to normal operation periods.

First, the operation of the stage circuit during the write operation period will be described. At time t90, a pulse in the set signal S is input to the input terminal 83. As illustrated in FIG. 38, the gate and drain terminals of the thin-film transistor T83 are diode-connected, and therefore the pulse in the set signal S sets the thin-film transistor T83 to the ON state, thereby charging the capacitor CAP. This causes the voltage of the output control node netA to increase, thereby setting the thin-film transistor T81 to the ON state. During the period from time t90 to t91, the first gate clock signal CKA is at the low level. Therefore, during this period of time, the scanning signal GOUT is maintained at the low level. Moreover, during the period from time t90 to t91, the reset signal R is also at the low level, and therefore the thin-film transistor T84 remains in the OFF state. As a result, the voltage of the output control node netA never decreases during this period of time.

At time t91, the first gate clock signal CKA switches from the low level to the high level. Because the thin-film transistor T81 is in the ON state at this time, as the voltage of the input terminal 81 increases, the voltage of the output terminal 80 also increases. Here, as illustrated in FIG. 38, the capacitor CAP is connected between the output control node netA and the output terminal 80, and therefore the increase in the voltage of the output terminal 80 causes an increase in the voltage of the output control node netA as well (the output control node netA is bootstrapped). As a result, a large voltage is applied to the gate terminal of the thin-film transistor T81, and the voltage of the scanning signal GOUT (that is, the voltage of the output terminal 80) increases to the high-level voltage of the first gate clock signal CKA. Due to this, the gate bus line that is connected to the output terminal 80 of the stage circuit enters the selected state. Moreover, during the period from time t91 to t92, the second gate clock signal CKB is at the low level. As a result, during this period, the thin-film transistor T82 remains in the OFF state, and the voltage of the scanning signal GOUT never decreases.

At time t92, the first gate clock signal CKA switches from the high level to the low level. Therefore, the voltage of the input terminal 81 decreases, the voltage of the output terminal 80 decreases, and the voltage of the output control node netA that is connected via the capacitor CAP decreases as well. Moreover, at time t92, a pulse in the reset signal R is input to the input terminal 84. This sets the thin-film transistor T84 to the ON state. As a result, the voltage of the output control node netA switches from the high level to the low level. Furthermore, at time t92, the second gate clock signal CKB switches from the low level to the high level. This sets the thin-film transistor T82 to the ON state. As a result, the voltage of the scanning signal GOUT decreases to the low level.

As described above, an active scanning signal GOUT is applied to the gate bus line corresponding to this stage circuit during the latter half of the write operation period. The scanning signal GOUT output from the stage circuit in a given stage is input to the next stage as the set signal S. In this way, the gate bus lines in the liquid crystal display device are sequentially selected, and DATa is written to the pixel capacitors one row at a time.

However, in the configuration described above, any noise that occurs due to the clock signal (that is, due to the first gate clock signal CKA) during the normal operation period can potentially cause fluctuations in the voltage of the scanning signal GOUT, which is supposed to be fixed at the low level during this period. Next, this problem will be described in more detail. Parasitic capacitance is formed between the electrodes of the thin-film transistors in the stage circuits included in shift registers. Accordingly, in the configuration illustrated in FIG. 38 as well, parasitic capacitance is formed between the gate and drain and between the gate and source of the thin-film transistor T81. As a result, when the first gate clock signal CKA switches from the low level to the high level, the gate voltage of the thin-film transistor T81 also increases due to this parasitic capacitance. In other words, the voltage of the output control node netA increases slightly (that is, the voltage of the output control node netA floats) despite being supposed to remain fixed at the low level. This causes a leakage current to flow through the thin-film transistor T81, thereby causing the voltage of the scanning signal GOUT to fluctuate. As illustrated in FIG. 39, the first gate clock signal CKA alternates between the low level and the high level at a prescribed cycle while the liquid crystal display device is operating. Therefore, the voltage of the scanning signal GOUT fluctuates at a prescribed cycle during the normal operation period. This can potentially cause abnormal operation and increased power consumption.

Therefore, stage circuits also typically include a circuit for maintaining the voltage of the output control node netA at the low level during normal operation periods (hereinafter, an "output control node stabilizer") as well as a circuit (hereinafter, a "stabilization node controller") for controlling the output control node stabilizer by controlling the voltage levels of nodes that are connected to the output control node stabilizer (hereinafter, "stabilization nodes," and denoted by the reference character netB). FIG. 40 schematically illustrates a configuration of a stage circuit that includes an output control node stabilizer and a stabilization node controller. As illustrated in FIG. 40, this stage circuit includes a buffer 910, a scanning signal stabilizer 920, an output control node setter 930, an output control node resetter 940, an output control node stabilizer 950, and a stabilization node controller 960. Note that the thin-film transistor T81, the thin-film transistor T82, the thin-film transistor T83, and the thin-film transistor T84 in FIG. 38 respectively correspond to the buffer 910, the scanning signal stabilizer 920, the output control node setter 930, and the output control node resetter 940 in FIG. 40.

A specific example of a conventional stage circuit configuration that includes the output control node stabilizer 950 and the stabilization node controller 960 is disclosed in WO 2010/067641 Pamphlet, for example. FIG. 41 is a circuit diagram illustrating the configuration of the stage circuit disclosed in WO 2010/067641 Pamphlet. The stage circuit illustrated in FIG. 41 includes ten thin-film transistors T91 to T100 and a single capacitor CAP. This stage circuit also includes an output terminal 90 and six input terminals 91 to 96. The gate terminal of the thin-film transistor T91, the drain terminal of the thin-film transistor T92, the source terminal of the thin-film transistor T95, the gate terminal of the thin-film transistor T96, and the drain terminal of the thin-film transistor T97 are all connected together via an output control node netA. Moreover, the gate terminal of the thin-film transistor T92, the source terminal of the thin-film transistor T93, the drain terminal of the thin-film transistor T94, the drain terminal of the thin-film transistor T96, and the gate terminal of the thin-film transistor T100 are all connected together via a stabilization node netB.

In the thin-film transistor T91, the gate terminal is connected to the output control node netA, the drain terminal is connected to the input terminal 91, and the source terminal is connected to the output terminal 90. In the thin-film transistor T92, the gate terminal is connected to the stabilization node netB, the drain terminal is connected to the output control node netA, and the source terminal is connected to an input terminal for a DC supply voltage VSS. In the thin-film transistor T93, the gate terminal and the drain terminal are both connected to the input terminal 93 (that is, are diode-connected), and the source terminal is connected to the stabilization node netB. In the thin-film transistor T94, the gate terminal is connected to the input terminal 94, the drain terminal is connected to the stabilization node netB, and the source terminal is connected to the input terminal for the DC supply voltage VSS. In the thin-film transistor T95, the gate terminal and the drain terminal are both connected to the input terminal 95 (that is, are diode-connected), and the source terminal is connected to the output control node netA. In the thin-film transistor T96, the gate terminal is connected to the output control node netA, the drain terminal is connected to the stabilization node netB, and the source terminal is connected to the input terminal for the DC supply voltage VSS. In the thin-film transistor T97, the gate terminal is connected to the input terminal 96, the drain terminal is connected to the output control node netA, and the source terminal is connected to the input terminal for the DC supply voltage VSS. In the thin-film transistor T98, the gate terminal is connected to the input terminal 96, the drain terminal is connected to the output terminal 90, and the source terminal is connected to the input terminal for the DC supply voltage VSS. In the thin-film transistor T99, the gate terminal is connected to the input terminal 92, the drain terminal is connected to the output terminal 90, and the source terminal is connected to the input terminal for the DC supply voltage VSS. In the thin-film transistor T100, the gate terminal is connected to the stabilization node netB, the drain terminal is connected to the output terminal 90, and the source terminal is connected to the input terminal for the DC supply voltage VSS. In the capacitor CAP, one terminal is connected to the output control node netA, and the other terminal is connected to the output terminal 90.

Note that in the configuration illustrated in FIG. 41, the thin-film transistor T92 constitutes the output control node stabilizer 950, and the thin-film transistor T93, the thin-film transistor T94, and the thin-film transistor T96 constitute the stabilization node controller 960.

FIG. 42 is a timing chart for explaining the operation of the stage circuit configured as illustrated in FIG. 41. As illustrated in FIG. 42, this stage circuit operates using a four-phase clock signal (which includes a first gate clock signal CKA, a second gate clock signal CKB, a third gate clock signal CKC, and a fourth gate clock signal CKD) in which the phases are each shifted by 90°. Next, the normal operation periods in FIG. 42 will be described. During the normal operation periods, the voltage of the output control node netA is maintained at the low level, and therefore the thin-film transistor T96 remains in the OFF state. Moreover, when the third gate clock signal CKC is at the high level and the fourth gate clock signal CKD is at the low level, the thin-film transistor T93 takes the ON state and the thin-film transistor T94 takes the OFF state. Conversely, when the third gate clock signal CKC is at the low level and the fourth gate clock signal CKD is at the high level, the thin-film transistor T93 takes the OFF state and the thin-film transistor T94 takes the ON state. In this way, as illustrated in FIG. 42, the voltage of the stabilization node netB is set to the high level at prescribed time intervals during the normal operation periods. Therefore, during the normal operation periods, the thin-film transistor T92 is set to the ON state and the voltage of the output control node netA is set to the VSS voltage at prescribed time intervals. This prevents the voltage of the output control node netA from floating during the normal operation periods, thereby making it possible to provide a monolithic gate driver that does not exhibit any abnormal operation. Moreover, the thin-film transistor T96 is provided to prevent the voltage of the stabilization node netB from being set to the high level during the write operation period.

RELATED ART DOCUMENT

Patent Document

Patent Document 1: WO 2010/067641 Pamphlet

SUMMARY OF THE INVENTION

Problems to be Solved by the Invention

In recent years, there has been increased demand for increasingly thinner bezels in display devices. However, in the conventional configuration illustrated in FIG. 41, each stage circuit of the shift register in the gate driver includes a large number of thin-film transistors. For example, the stabilization node controller 960 includes three thin-film transistors. Having such a large number of elements makes it more difficult to reduce the thickness of the bezels. Monolithic gate drivers that have a vertical inversion feature (a feature for switching the order in which the gate bus lines are scanned) require an even larger number of elements than the configuration illustrated in FIG. 41 and therefore make it particularly difficult to reduce the thickness of the bezels. Moreover, in the conventional configuration illustrated in FIG. 41, the large number of thin-film transistors are driven using clock signals. This results in high power consumption due to the high clock load.

The present invention therefore aims to provide a monolithic gate driver that includes fewer elements than conventional configurations. By reducing the number of elements, the present invention also aims to reduce power consumption.

Means for Solving the Problems

A first aspect of the present invention is a shift register for driving scanning signal lines of a display device, the shift register including a plurality of stages each of which includes a stage circuit that operates in accordance with a plurality of clock signals cyclically alternating between an ON level and an OFF level, wherein each stage circuit that constitutes each stage of the plurality of stages includes:

an output node for outputting a scanning signal to one of the scanning signal lines;

an output control switching element that has a control terminal, a first conduction terminal, and a second conduction terminal, the first conduction terminal receiving a clock signal of the plurality of clock signals that changes from the OFF level to the ON level at a time at which the scanning signal output from the output node should be changed from the OFF level to the ON level, and the second conduction terminal being connected to the output node;

an output control node connected to the control terminal of the output control switching element;

an output control node ON/OFF-switching unit receiving as a set signal one of an upstream-stage scanning signal that is a scanning signal output from an output node of a stage one or more stages upstream and a downstream-stage scanning signal output from an output node of a stage one or more stages downstream, the output control node ON/OFF-switching unit receiving as a reset signal another of the upstream-stage scanning signal and the downstream-stage scanning signal, changing a level of the output control node to the ON level in accordance with the set signal, and changing a level of the output control node to the OFF level in accordance with the reset signal; and
an output control node stabilization switching element including a control terminal, a first conduction terminal, and a second conduction terminal, the first conduction terminal being connected to the output control node, and an OFF-level supply voltage being input to the second conduction terminal,
wherein the plurality of stages are divided into a plurality of stage circuit groups, each of the stage circuit groups including the stage circuits of P adjacent stages, where P is an integer greater than or equal to 2, and
wherein each of the stage circuit groups includes a stabilization node that is connected to the control terminal of the output control node stabilization switching element of each of the stage circuits included in the stage circuit group and a stabilization node controller that controls a level of the stabilization node.

A second aspect of the present invention is the shift register according to the first aspect,
wherein the stabilization node controller in each of the stage circuit groups includes:
a first stabilization node OFF-switching element that has a control terminal, a first conduction terminal, and a second conduction terminal, the control terminal thereof being connected to the output control node of the first stage out of the P stage circuits included in the stage circuit group, the first conduction terminal thereof being connected to the stabilization node, and the second conduction terminal thereof being supplied with an OFF-level supply voltage;
a second stabilization node OFF-switching element that has a control terminal, a first conduction terminal, and a second conduction terminal, the control terminal thereof being connected to the output control node of the Pth stage circuit out of the P stage circuits included in the stage circuit group, the first conduction terminal thereof being connected to the stabilization node, and the second conduction terminal thereof being supplied with an OFF-level supply voltage; and
one or two stabilization node ON-switching elements that changes the level of the stabilization node to the ON level.

A third aspect of the present invention is the shift register according to the second aspect, wherein when P is greater than 2, the stabilization node controller further includes P−2 of stabilization node OFF-switching elements so that one stabilization node OFF-switching element is provided for each of the P stage circuits included in the stage circuit group.

A fourth aspect of the present invention is the shift register according to the second aspect, wherein the stabilization node controller includes one stabilization node ON-switching element, the stabilization node ON-switching element having a control terminal, a first conduction terminal, and a second conduction terminal, the control terminal being supplied with a stabilization control signal that is maintained at the ON level throughout a period during which a shift operation is performed, the first conduction terminal being supplied with the stabilization control signal or an ON-level supply voltage, and the second conduction terminal being connected to the stabilization node.

A fifth aspect of the present invention is the shift register according to the fourth aspect, wherein the output control node ON/OFF-switching unit of each of the stage circuits includes:
an output control node ON-switching element that includes a control terminal, a first conduction terminal, and a second conduction terminal, the upstream-stage scanning signal being input to the control terminal as the set signal, the set signal or an ON-level supply voltage being input to the first conduction terminal, and the second conduction terminal being connected to the output control node; and
an output control node OFF-switching element that includes a control terminal, a first conduction terminal, and a second conduction terminal, the downstream-stage scanning signal being input to the control terminal as the reset signal, the first conduction terminal being connected to the output control node, and an OFF-level supply voltage being input to the second conduction terminal.

A sixth aspect of the present invention is the shift register according to the fourth aspect,
wherein the output control node ON/OFF-switching unit of each of the stage circuits includes:
a first output control node ON/OFF-switching element that includes a control terminal, a first conduction terminal, and a second conduction terminal, the upstream-stage scanning signal being input to the control terminal, a first scanning order instruction signal that is maintained at a level that depends on a scanning order of the scanning signal lines being input to the first conduction terminal, and the second conduction terminal being connected to the output control node; and
a second output control node ON/OFF-switching element that includes a control terminal, a first conduction terminal, and a second conduction terminal, the downstream-stage scanning signal being input to the control terminal, a second scanning order instruction signal that is maintained at a level that depends on the scanning order of the scanning signal lines being input to the first conduction terminal, and the second conduction terminal being connected to the output control node, and
wherein the second scanning order instruction signal is maintained at the OFF level when the first scanning order instruction signal is maintained at the ON level, and the second scanning order instruction signal is maintained at the ON level when the first scanning order instruction signal is maintained at the OFF level.

A seventh aspect of the present invention is the shift register according to the fourth aspect,
wherein the output control node ON/OFF-switching unit of each of the stage circuits includes:
a forward scanning ON-switching element that has a control terminal, a first conduction terminal, and a second conduction terminal, the upstream-stage scanning signal being input to the control terminal, the upstream-stage scanning signal or an ON-level supply voltage being input to the first conduction terminal, and the second conduction terminal being connected to the output control node;
a forward scanning OFF-switching element that has a control terminal, a first conduction terminal, and a second conduction terminal, the downstream-stage scanning signal being input to the control terminal, the first conduction terminal being connected to the output control node, and an OFF-level supply voltage being input to the second conduction terminal;

a reverse scanning ON-switching element that has a control terminal, a first conduction terminal, and a second conduction terminal, the another downstream-stage scanning signal being input to the control terminal, the another downstream-stage scanning signal or an ON-level supply voltage being input to the first conduction terminal, and the second conduction terminal being connected to the output control node; and a reverse scanning OFF-switching element that has a control terminal, a first conduction terminal, and a second conduction terminal, another upstream-stage scanning signal being input to the control terminal, the first conduction terminal being connected to the output control node, and an OFF-level supply voltage being input to the second conduction terminal, wherein the upstream-stage scanning signal that is input to the control terminal of the forward scanning ON-switching element and the another upstream-stage scanning signal that is input to the control terminal of the reverse scanning OFF-switching element are scanning signals output from the output nodes of different upstream stages, and wherein the downstream-stage scanning signal that is input to the control terminal of the forward scanning OFF-switching element and the another downstream-stage scanning signal that is input to the control terminal of the reverse scanning ON-switching element are scanning signals output from the output nodes of different downstream stages.

An eighth aspect of the present invention is the shift register according to the second aspect, wherein the stabilization node controller in each of the stage circuit groups includes, as the one or more stabilization node ON-switching element:

a first stabilization node ON-switching element that has a control terminal, a first conduction terminal, and a second conduction terminal, a first scanning order instruction signal that is maintained at a level that depends on a scanning order of the scanning signal lines being input to the control terminal, the first scanning order instruction signal or an ON-level supply voltage being input to the first conduction terminal, and the second conduction terminal being connected to the stabilization node; and a second stabilization node ON-switching element that has a control terminal, a first conduction terminal, and a second conduction terminal, a second scanning order instruction signal that is maintained at a level that depends on the scanning order of the scanning signal lines being input to the control terminal, the second scanning order instruction signal or the ON-level supply voltage being input to the first conduction terminal, and the second conduction terminal being connected to the stabilization node, and wherein the second scanning order instruction signal is maintained at the OFF level when the first scanning order instruction signal is maintained at the ON level, and the second scanning order instruction signal is maintained at the ON level when the first scanning order instruction signal is maintained at the OFF level.

A ninth aspect of the present invention is the shift register according to the eighth aspect, the output control node ON/OFF-switching unit includes:

a first output control node ON/OFF-switching element that has a control terminal, a first conduction terminal, and a second conduction terminal, the upstream-stage scanning signal being input to the control terminal, the first scanning order instruction signal being input to the first conduction terminal, and the second conduction terminal being connected to the output control node; and a second output control node ON/OFF-switching element that has a control terminal, a first conduction terminal, and a second conduction terminal, the downstream-stage scanning signal being input to the control terminal, the second scanning order instruction signal being input to the first conduction terminal, and the second conduction terminal being connected to the output control node.

A tenth aspect of the present invention is the shift register according to the fifth aspect, wherein the plurality of clock signals are constituted by k-phase clock signals, and wherein each of the stage circuit groups includes the stage circuits of (k/2) stages.

An eleventh aspect of the present invention is the shift register according to the seventh aspect, wherein the plurality of clock signals are constituted by k-phase clock signals, and wherein each of the stage circuit groups includes the stage circuits of (k×3/4) stages.

A twelfth aspect of the present invention is the shift register according to the first aspect, wherein an on-duty cycle of each of the plurality of clock signals is less than 1/2.

A thirteenth aspect of the present invention is the shift register according to the first aspect, wherein switching elements included in the stage circuits are thin-film transistors that contain an oxide semiconductor.

A fourteenth aspect of the present invention is the shift register according to the thirteenth aspect, wherein the oxide semiconductor is indium gallium zinc oxide.

A fifteenth aspect of the present invention is the shift register according to the first aspect, wherein switching elements included in the stage circuits are thin-film transistors that contain low-temperature polysilicon.

A sixteenth aspect of the present invention is a display device, including:

a display unit in which a plurality of scanning signal lines are arranged; and the shift register according to claim 1, the plurality of stages of the shift register being matched with the plurality of scanning signal lines so as to drive the scanning signal lines of the display unit.

A seventeenth aspect of the present invention is a method of driving a shift register for driving scanning signal lines of a display device, the shift register including a plurality of stages each of which includes a stage circuit that operates in accordance with a plurality of clock signals that cyclically alternate between an ON level and an OFF level, wherein each stage circuit that constitutes each stage of the plurality of stages includes:

an output node for outputting a scanning signal to one of the scanning signal lines;

an output control switching element that has a control terminal, a first conduction terminal, and a second conduction terminal, a clock signal of the plurality of clock signals that changes from the OFF level to the ON level at a time at which the scanning signal output from the output node should be changed from the OFF level to the ON level being input to the first conduction terminal, and the second conduction terminal being connected to the output node;
an output control node that is connected to the control terminal of the output control switching element;
an output control node ON/OFF-switching unit that receives as a set signal one of an upstream-stage scanning signal that is a scanning signal output from the output node of a stage one or more stages upstream and a downstream-stage scanning signal output from the output node of a stage one or more stages downstream, receives as a reset signal an other of the upstream-stage scanning signal and the downstream-stage scanning signal, changes a level of the output control node to the ON level in accordance with the set signal, and changes the level of the output control node to the OFF level in accordance with the reset signal; and
an output control node stabilization switching element that includes a control terminal, a first conduction terminal, and a second conduction terminal, the first conduction terminal being connected to the output control node, and an OFF-level supply voltage being input to the second conduction terminal,
wherein the plurality of stages are divided into a plurality of stage circuit groups, each of the stage circuit groups including the stage circuits of P adjacent stages (where P is an integer greater than or equal to 2), and
wherein each of the stage circuit groups includes a stabilization node that is connected to the control terminal of the output control node stabilization switching element of each of the stage circuits included in the stage circuit group and a stabilization node controller that controls a level of the stabilization node,
the method of driving the shift register including, for each of the stage circuit groups:
using the stabilization node controller to maintain the stabilization node at the OFF level throughout a period in which one of the output control nodes of the P stage circuits included in the stage circuit group is at the ON level; and
using the stabilization node controller to maintain the stabilization node at the ON level throughout a period in which all of the output control nodes of the P stage circuits included in the stage circuit group should be maintained at the OFF level.

Effects of the Invention

In the first aspect of the present invention, the stabilization node that contributes to stabilizing the output control node and the stabilization node controller that controls the level (voltage) of the stabilization node are provided in each stage circuit group that includes two or more adjacent stages (stage circuits) of the shift register. In other words, the stabilization control node and the stabilization node controller are shared by multiple stage circuits. This reduces the scale of the overall shift register circuit. Therefore, the area occupied by the shift register in the corresponding region on one of the substrates of the display device can be reduced. This, in turn, makes it possible to reduce the thickness of the bezels in a display device.

In the second aspect of the present invention, the switching elements of the stabilization node controller (that is, the stabilization node OFF-switching element and the stabilization node ON-switching element) are shared by multiple stage circuits. Therefore, the stabilization node controller requires fewer switching elements per shift register stage than in conventional configurations. Applying this shift register to a monolithic gate driver for driving the scanning signal lines of a display device makes it possible to provide a monolithic gate driver that includes fewer elements than in conventional configurations. This, in turn, makes it possible to reduce the thickness of the bezels in a display device.

In the third aspect of the present invention, the load applied to the output control node is divided evenly among the stage circuits of the P stages (where P is an integer greater than or equal to 2) included in the stage circuit group. This makes it possible to further stabilize the operation of the shift register.

In the fourth aspect of the present invention, the stabilization node controller does not include any switching elements to which clock signals are input. Therefore, each stage circuit includes fewer switching elements to which a clock signal is input than in conventional configurations. This reduces the clock load in comparison with conventional configurations. This, in turn, reduces power consumption in comparison with conventional configurations.

The fifth aspect of the present invention makes it possible to provide a monolithic gate driver that does not have a vertical inversion feature (that is, a feature for switching the order in which the scanning signal lines are scanned) using fewer elements than in a conventional configuration.

The sixth aspect of the present invention makes it possible to implement a vertical inversion feature simply by including two switching elements (that is, the first output control node ON/OFF-switching element and the second output control node ON/OFF-switching element) on the input side of the output control node in each stage circuit and then controlling the levels of the first scanning order instruction signal and the second scanning order instruction signal. In other words, the number of switching elements required to implement a vertical inversion feature is less than in conventional configurations. Moreover, similar to in the second aspect of the present invention, the stabilization node controller requires fewer switching elements per shift register stage than in conventional configurations. This makes it possible to provide a monolithic gate driver that has a vertical inversion feature using significantly fewer elements than in a conventional configuration.

In the seventh aspect of the present invention, a vertical inversion feature is implemented by including four switching elements in the output control node ON/OFF-switching unit. Here, similar to in the second aspect of the present invention, the stabilization node controller requires fewer switching elements per shift register stage than in conventional configurations. This makes it possible to provide a monolithic gate driver that has a vertical inversion feature using fewer elements than in a conventional configuration.

In the eighth aspect of the present invention, the stabilization node controller does not include any switching elements to which clock signals are input. Therefore, each stage circuit includes fewer switching elements to which a clock signal is input than in conventional configurations. This reduces the clock load in comparison with conventional configurations. This, in turn, reduces power consumption in comparison with conventional configurations.

The ninth aspect of the present invention makes it possible to implement a vertical inversion feature by controlling the levels of the first scanning order instruction signal and the second scanning order instruction signal. Here, similar to in the second aspect of the present invention, the stabilization node controller requires fewer switching elements per shift register stage than in conventional configurations. This makes it possible to provide a monolithic gate driver that has a vertical inversion feature using fewer elements than in a conventional configuration.

The tenth aspect of the present invention makes it possible for a number of stages that is proportional of the number of phases in the clock signal used to operate the shift register to share the same stabilization node and stabilization node controller.

The eleventh aspect of the present invention also makes it possible for a number of stages that is proportional of the number of phases in the clock signal used to operate the shift register to share the same stabilization node and stabilization node controller.

In the twelfth aspect of the present invention, the on-duty ratio of each clock signal is less than 1/2, and therefore for two clock signals in which the phases are shifted by 180° from one another, it is not necessary to allocate an offset period between when one clock signal falls and when the other clock signal rises. This prevents a large amount of noise from occurring in the scanning signals due to differences in timing between when the two clock signals rise and fall.

In the thirteenth aspect of the present invention, each stage circuit is configured using thin-film transistors that exhibit low threshold shift. This makes it possible to prevent abnormal operation even if a bias voltage is applied to the control terminals (gate terminals) of the thin-film transistors in the stage circuit.

Similar to the thirteenth aspect of the present invention, the fourteenth aspect of the present invention makes it possible to prevent abnormal operation even if a bias voltage is applied to the control terminals (gate terminals) of the thin-film transistors in the stage circuit.

Similar to the thirteenth aspect of the present invention, the fifteenth aspect of the present invention makes it possible to prevent abnormal operation even if a bias voltage is applied to the control terminals (gate terminals) of the thin-film transistors in the stage circuit.

The sixteenth aspect of the present invention provides a display device including a shift register that achieves the same effects as in the first aspect of the present invention.

The seventeenth aspect of the present invention makes it possible to achieve the same effects as in the first aspect of the present invention in a method of driving a shift register.

DETAILED DESCRIPTION OF EMBODIMENTS

Next, embodiments of the present invention will be described with reference to the attached figures. Note that in the following description, the gate terminals (gate electrodes) of thin-film transistors correspond to "control terminals," the drain terminals (drain electrodes) correspond to "first conduction terminals," and the source terminals (source electrodes) correspond to "second conduction terminals." Moreover, in relation to the voltages of signals and the like, the high level corresponds to an "ON level" and the low level corresponds to an "OFF level." Furthermore, the following description assumes that all of the thin-film transistors included in a shift register are n-channel thin-film transistors.

<1. Embodiment 1>
<1.1 Overview of Configuration and Operation>

Figure 2:
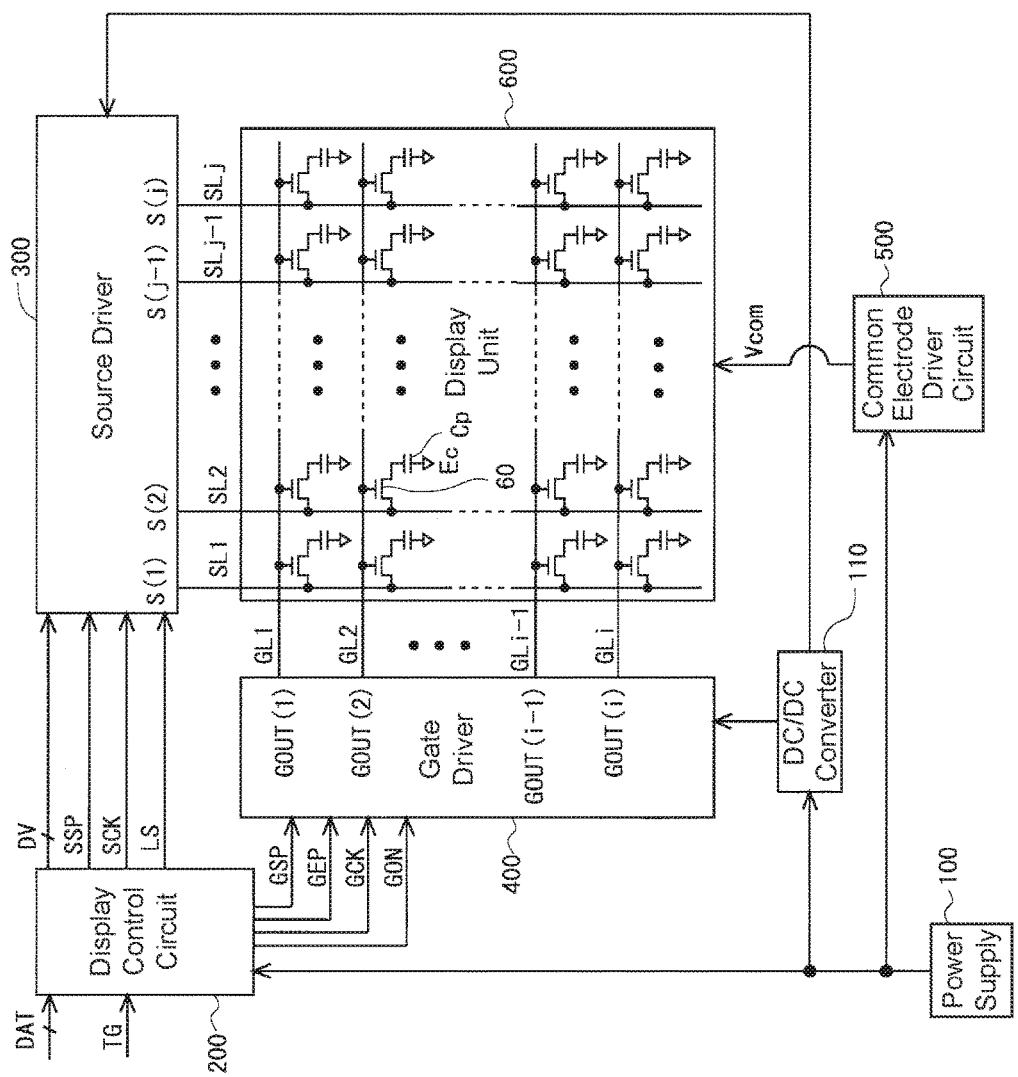
FIG. 2 is a block diagram illustrating an overall configuration of the liquid crystal display device according to Embodiment 1.

FIG. 2 is a block diagram illustrating an overall configuration of an active-matrix liquid crystal display device according to Embodiment 1 of the present invention. As illustrated in FIG. 2, this liquid crystal display device includes a power supply 100, a DC/DC converter 110, a display control circuit 200, a source driver (an image signal line driver circuit) 300, a gate driver (a scanning signal line driver circuit) 400, a common electrode driver circuit 500, and a display unit 600. In the present embodiment, the gate driver 400 and the display unit are formed on the same substrate (here, on a TFT substrate that is one of the two substrates included in a liquid crystal panel). In other words, the gate driver 400 of the present embodiment is a monolithic gate driver.

The display unit 600 includes a plurality of (j) source bus lines (image signal lines) SL1 to SLj, a plurality of (i) gate bus lines (scanning signal lines) GL1 to GLi, and a plurality of (i×j) pixel formation regions that are respectively formed at the intersections between the source bus lines SL1 to SLj and the gate bus lines GL1 to GLi. These pixel formation regions are arranged in a matrix pattern to form a pixel array. Each pixel formation region includes a thin-film transistor (a switching element; TFT) 60 in which the gate terminal is connected to the gate bus line that passes through the corresponding intersection and the source terminal is connected to the source bus line that passes through the corresponding intersection, a pixel electrode that is connected to the drain terminal of the thin-film transistor 60, a common electrode Ec which is a single opposite electrode formed in common for all of the pixel formation regions, and a liquid crystal layer that is similarly formed in common for all of the pixel formation regions and is sandwiched between the pixel electrodes and the common electrode Ec. Each pixel formation region also includes a pixel capacitor Cp formed by the capacitance of the liquid crystal between the pixel electrode and the common electrode Ec. Typically, an auxiliary capacitor is also connected in parallel to this liquid crystal capacitance in order to reliably maintain the charge of the pixel capacitor Cp. However, such auxiliary capacitors are not directly related to the present invention and will therefore not be described nor illustrated in the figures.

Examples of transistors that can be used for the thin-film transistors 60 include thin-film transistors in which amorphous silicon is used for the semiconductor layers (a-Si TFTs), thin-film transistors in which microcrystalline silicon is used for the semiconductor layers, thin-film transistors in which an oxide semiconductor is used for the semiconductor layers (oxide TFTs), and thin-film transistors in which low-temperature polysilicon is used for the semiconductor layers (LTPS-TFTs). However, it is preferable that oxide TFTs or LTPS-TFTs be used because these types of thin-film transistors exhibit low threshold shift (that is, low variation in the magnitude of the threshold voltage when a bias voltage is applied to the gate terminal). Moreover, examples of oxide TFTs include indium gallium zinc oxide (InGaZnO) thin-film transistors, for example.

The power supply 100 supplies power of a prescribed supply voltage to the DC/DC converter 110, the display control circuit 200, and the common electrode driver circuit 500. The DC/DC converter 110 generates a prescribed DC voltage for powering the source driver 300 and the gate driver 400 from this supply voltage and supplies this DC voltage to the source driver 300 and the gate driver 400. The common electrode driver circuit 500 applies a prescribed voltage Vcom to the common electrode Ec.

The display control circuit 200 takes as inputs an external image signal DAT and a timing signal group TG that includes signals such as a horizontal sync signal and a vertical sync signal, and outputs a digital image signal DV as well as the following signals for controlling the image displayed on the display unit 600: a source start pulse signal SSP, a source clock signal SCK, a latch/strobe signal LS, a gate start pulse signal GSP, a gate end pulse signal GEP, gate clock signals GCK, and a stabilization control signal GON. Moreover, in the present embodiment the gate clock signals GCK are constituted by a four-phase clock signal that includes a first gate clock signal CKA, a second gate clock signal CKB, a third gate clock signal CKC, and a fourth gate clock signal CKD. Furthermore, the gate clock signals GCK of the present embodiment have an on-duty ratio (duty cycle) of 4/8 (1/2).

The source driver 300 takes as inputs the digital image signal DV, the source start pulse signal SSP, the source clock signal SCK, and the latch/strobe signal LS that are output from the display control circuit 200 and applies drive image signals S(1) to S(j) to the source bus lines SL1 to SLj.

The gate driver 400 repeatedly applies active scanning signals GOUT(1) to GOUT(i) to the gate bus lines GL1 to GLi at a cycle of once per vertical scanning period and in accordance with the gate start pulse signal GSP, the gate end pulse signal GEP, the gate clock signals GCK, and the stabilization control signal GON that are output from the display control circuit 200. Note that in the following description, the scanning signals will be denoted simply by the reference character GOUT when it is not necessary to distinguish between the i individual scanning signals GOUT(1) to GOUT(i). The gate driver 400 will be described in more detail later.

Images are thus displayed on the display unit 600 in accordance with the externally input image signal DAT by applying the drive image signals S(1) to S(j) to the source bus lines SL1 to SLj and applying the scanning signals GOUT(1) to GOUT(i) to the gate bus lines GL1 to GLi as described above.

<1.2 Configuration and Operation of Gate Driver>

Figure 3:
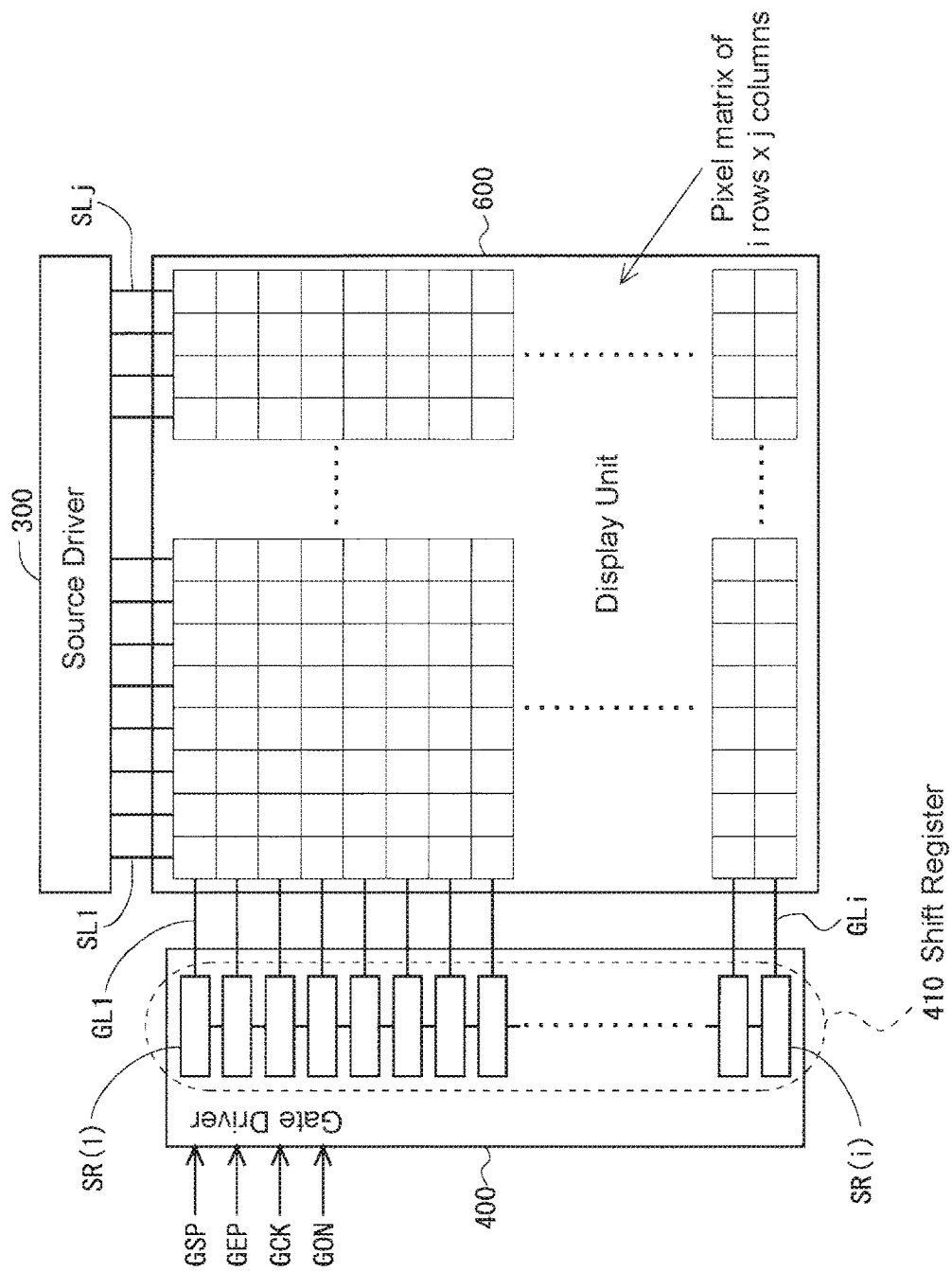
FIG. 3 is a block diagram for explaining the configuration of a gate driver in Embodiment 1.

Next, an overview of the configuration and operation of the gate driver 400 of the present embodiment will be provided with reference to FIGS. 3 to 7. As illustrated in FIG. 3, the gate driver 400 is constituted by a multistage shift register 410. The number of stages in the shift register 410 is set such that when a pixel matrix of i rows by j columns is formed in the display unit 600, a one-to-one correspondence can be achieved with the rows of that pixel matrix. Accordingly, here the shift register 410 includes i stage circuits SR(1) to SR(i). These i stage circuits SR(1) to SR(i) are connected together in series.

Figure 4:
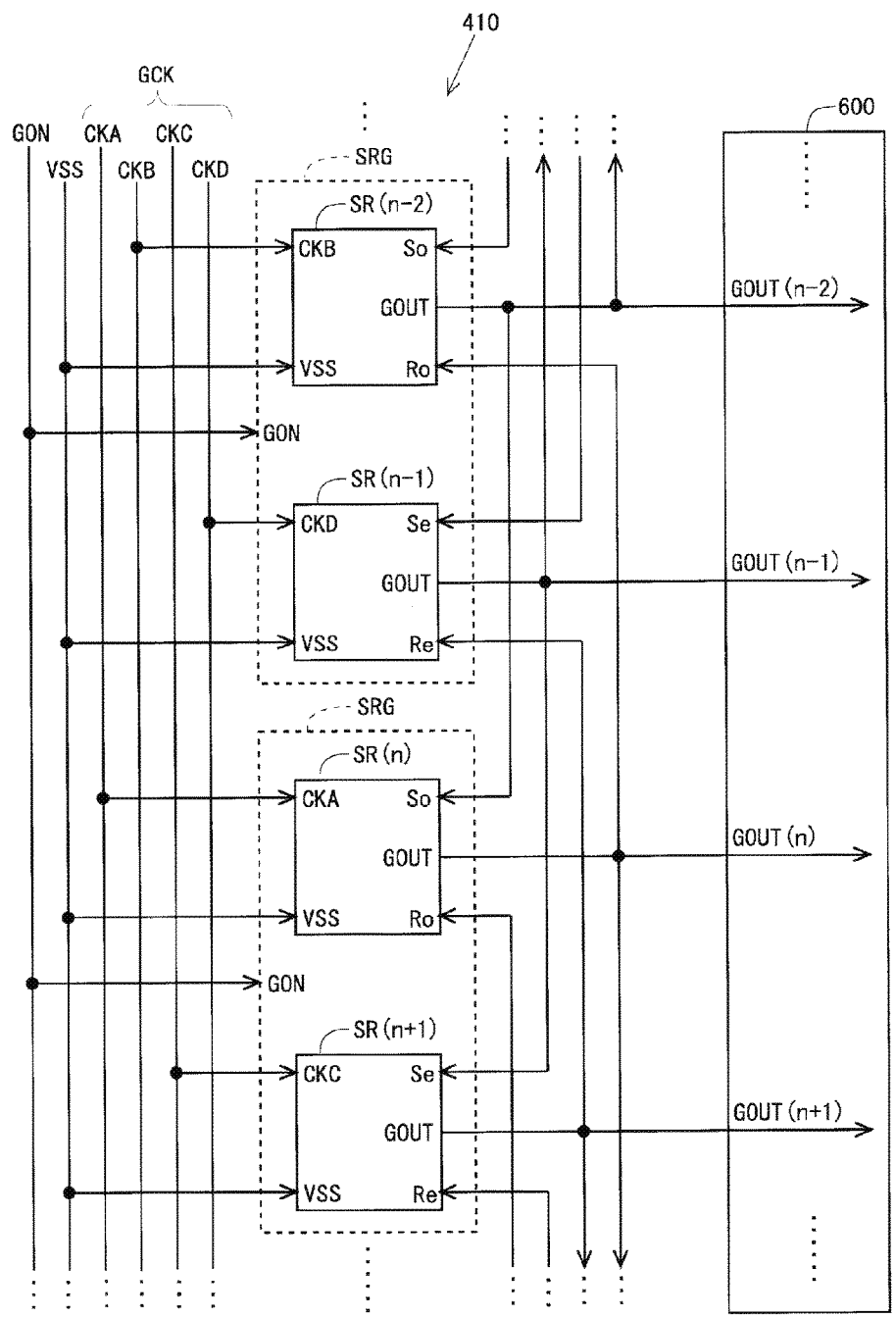
FIG. 4 is a block diagram illustrating a configuration of a shift register in the gate driver of Embodiment 1.

FIG. 4 is a block diagram illustrating a configuration of the shift register 410 in the gate driver 400. As described above, the shift register 410 includes i stage circuits SR(1) to SR(i). FIG. 4 depicts the stage circuits for stages (n−2) to (n+1). Note that in the following description, the stage circuits will be denoted simply by the reference character SR when it is not necessary to distinguish between the i individual stage circuits SR(1) to SR(i).

In the present embodiment, the i stage circuits SR(1) to SR(i) of the shift register 410 are divided up into i/2 stage circuit groups SRG, where each stage circuit group SRG includes the stage circuits SR of two adjacent stages. In other words, in the present embodiment, two adjacent stage circuits SR are treated as one stage circuit group SRG. More specifically, each stage circuit group SRG includes the stage circuit SR of an odd-numbered stage and the stage circuit SR of an even-numbered stage. As illustrated in FIG. 4, each stage circuit group SRG includes an input terminal for receiving the stabilization control signal GON. Moreover, each stage circuit SR includes an input terminal for receiving one of the gate clock signals GCK, an input terminal for receiving a low-level DC supply voltage VSS, an input terminal for receiving a set signal, an input terminal for receiving a reset signal, and an output terminal for outputting a scanning signal GOUT. Here, the set signals for the odd-numbered stages are denoted by the reference character So, the set signals for the even-numbered stages are denoted by the reference character Se, the reset signals for the odd-numbered stages are denoted by the reference character Ro, and the reset signals for the even-numbered stages are denoted by the reference character Re.

Figure 5:
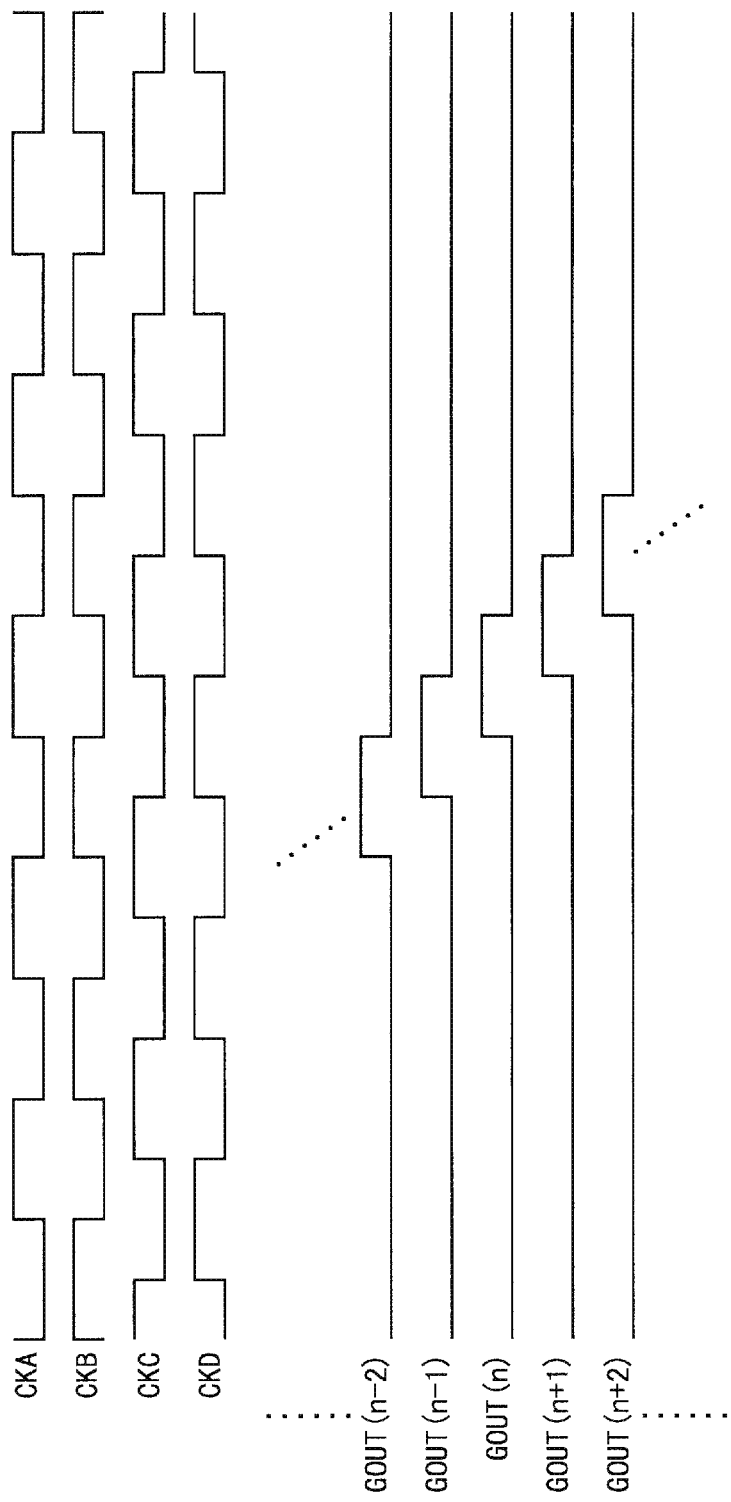
FIG. 5 is a timing chart for explaining the operation of the gate driver in Embodiment 1.

As illustrated in FIG. 4, the following signals are input to the input terminals of each stage (each stage circuit SR) of the shift register 410. The gate clock signals GCK are input as follows: the second gate clock signal CKB is input to the stage circuit SR(n−2) of the (n−2)th stage; the fourth gate clock signal CKD is input to the stage circuit SR(n−1) of the (n−1)th stage; the first gate clock signal CKA is input to the stage circuit SR(n) of the nth stage; and the third gate clock signal CKC is input to the stage circuit SR(n+1) of the (n+1)th stage. This configuration is repeated every four stages for all of the stages in the shift register 410. Moreover, as illustrated in FIG. 5, the phases of the first gate clock signal CKA and the second gate clock signal CKB are shifted from one another by 180°, the phases of the third gate clock signal CKC and the fourth gate clock signal CKD are shifted from one another by 180°, and the phase of the first gate clock signal CKA is 90° ahead of the phase of the third gate clock signal CKC. Furthermore, in a given stage, the scanning signal output from the stage two stages upstream is input as the set signal, and the scanning signal output from the stage two stages downstream is input as the reset signal. The low-level DC supply voltage VSS is input to all of the stage circuits SR(1) to SR(i) in common. The stabilization control signal GON is input to all of the stage circuit groups SRG in common. Here, the stabilization control signal GON is maintained at the high level for the duration of the operating period of the shift register 410 (that is, the period in which shift operations are performed).

Each stage (each stage circuit SR) of the shift register 410 outputs a scanning signal GOUT from the respective output terminal. The scanning signal GOUT(n) output from a given stage (here, the nth stage) is applied to the gate bus line GLn of the nth row, input to the stage circuit SR(n−2) of the (n−2)th stage as a reset signal, and input to the stage circuit SR(n+2) of the (n+2)th stage as a set signal.

In the configuration described above, when a pulse in the gate start pulse signal GSP is input as the set signal to the stage circuit SR(1) of the first stage of the shift register 410, the resulting shift pulse in the scanning signal GOUT output from the stage circuit SR is sequentially transferred from the stage circuit SR(1) of the first stage to the stage circuit SR(i) of the ith stage in accordance with the clock operations of the gate clock signals GCK. As this shift pulse is transferred, the scanning signals GOUT output from the stage circuits SR sequentially switch to the high level. In this way, as illustrated in FIG. 5, the scanning signals GOUT are sequentially switched to the high level (active) at a prescribed time interval, and are then applied to the corresponding gate bus lines in the display unit 600.

Figure 6:
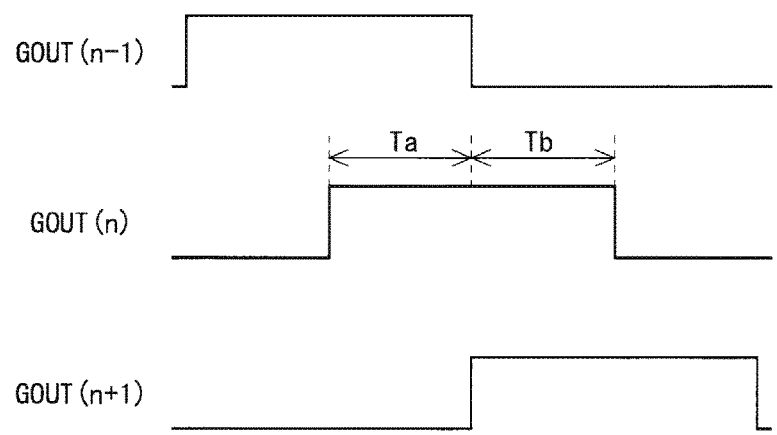
FIG. 6 is a timing chart for explaining the operation of the gate driver in Embodiment 1.
Figure 7:
FIG. 7 is a timing chart for explaining the operation of the gate driver in Embodiment 1.

As illustrated in FIG. 6, for the scanning signal GOUT(n) output from a given stage (here, the nth stage), during the first half Ta of the period in which the scanning signal GOUT(n) is at the high level, the scanning signal GOUT(n−1) output from the previous stage is also at the high level. Similarly, during the second half Tb of the period in which the scanning signal GOUT(n) is at the high level, the scanning signal GOUT(n+1) output from the next stage is also at the high level. Here, during the first half period Ta, a precharge is applied to the pixel capacitors in the row to which the scanning signal GOUT(n) is applied, and then the main charge is applied to the pixel capacitors during the second half period Tb. This ensures that a sufficient charging time is achieved and prevents decreases in display quality due to insufficient pixel capacitor charge. This also makes it possible to maintain a sufficient charging time even if, as illustrated in FIG. 7, a lag is present in the rise of the scanning signal GOUT (that is, even if the scanning signal GOUT waveform exhibits rounding when rising).

As illustrated in FIGS. 2 and 3, in the present embodiment the gate driver 400 is provided separately from the display unit 600. Therefore, the elements of the gate driver 400 (that is, the elements of the stage circuits SR) are all formed in a region outside of the display region. However, the present invention can also be applied to configurations in which some or all of the elements of the gate driver 400 (the elements of the stage circuits SR) are formed inside of the display region (inside of the pixel region). This configuration will be described later in Modification Examples 3 and 4.

<1.3 Configuration of Stage Circuit Group>

Figure 1:
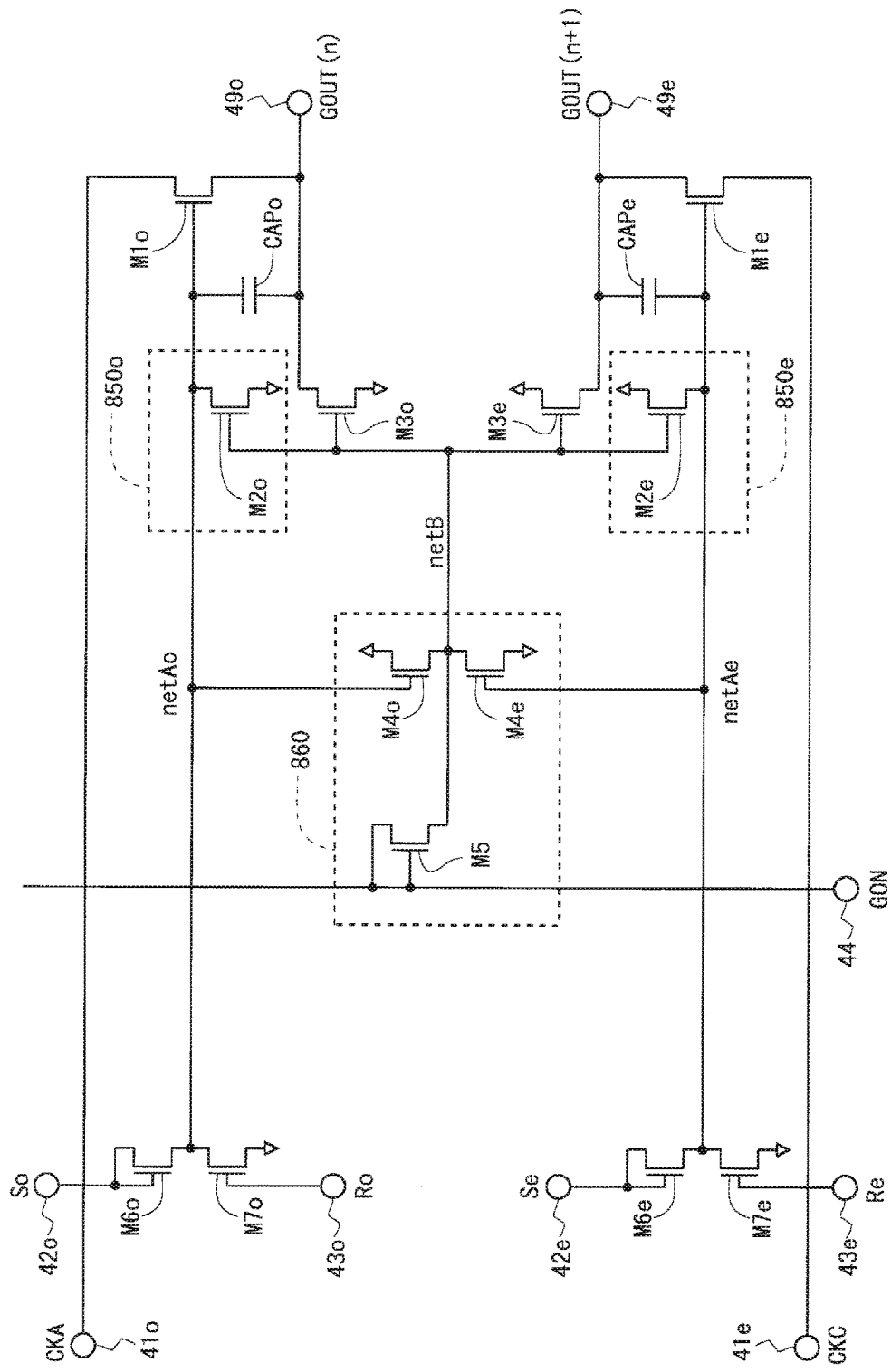
FIG. 1 is a circuit diagram illustrating a configuration of a stage circuit group (the stage circuits for two stages) in a liquid crystal display device according to Embodiment 1 of the present invention.

FIG. 1 is a circuit diagram illustrating a configuration of one of the stage circuit groups SRG (the stage circuits SR for two stages) in the present embodiment. The stage circuit group SRG illustrated in FIG. 1 includes the stage circuit SR(n) of the nth stage and the stage circuit SR(n+1) of the (n+1)th stage. The stage circuit SR(n) of the nth stage corresponds to the stage circuit of an odd-numbered stage, and the stage circuit SR(n+1) of the (n+1)th stage corresponds to the stage circuit of an even-numbered stage.

This stage circuit group SRG includes 13 thin-film transistors (M1o, M1e, M2o, M2e, M3o, M3e, M4o, M4e, M5, M6o, M6e, M7o, and M7e) and two capacitors (CAPo and CAPe). The stage circuit group SRG also includes an input terminal for the low-level DC supply voltage VSS, seven input terminals (41o, 41e, 42o, 42e, 43o, 43e, and 44), and two output terminals (49o and 49e). Here, the letter "o" is appended to the reference characters of components that belong to the stage circuit of the odd-numbered stage, and the letter "e" is appended to the reference characters of components that belong to the stage circuit of the even-numbered stage.

In FIG. 1, the input terminal that receives the first gate clock signal CKA is denoted by the reference character 41o, the input terminal that receives the third gate clock signal CKC is denoted by the reference character 41e, and the input terminal that receives the stabilization control signal GON is denoted by the reference character 44. Moreover, the input terminal that receives the set signal So is denoted by the reference character 42o, the input terminal that receives the set signal Se is denoted by the reference character 42e, the input terminal that receives the reset signal Ro is denoted by the reference character 43o, and the input terminal that receives the reset signal Re is denoted by the reference character 43e. Furthermore, the output terminal for outputting the scanning signal GOUT(n) is denoted by the reference character 49o, and the output terminal for outputting the scanning signal GOUT(n+1) is denoted by the reference character 49e. In addition, the 13 thin-film transistors included in this stage circuit group SRG are the same type of thin-film transistors as the thin-film transistors 60 (see FIG. 2) included in the pixel formation regions described above (InGaZnO thin-film transistors, for example).

Next, the connections between the components of the stage circuit group SRG will be described. The gate terminal of the thin-film transistor M1o, the drain terminal of the thin-film transistor M2o, the gate terminal of the thin-film transistor M4o, the source terminal of the thin-film transistor M6o, the drain terminal of the thin-film transistor M7o, and one terminal of the capacitor CAPo are all connected together via an output control node netAo. Similarly, the gate terminal of the thin-film transistor M1e, the drain terminal of the thin-film transistor M2e, the gate terminal of the thin-film transistor M4e, the source terminal of the thin-film transistor M6e, the drain terminal of the thin-film transistor M7e, and one terminal of the capacitor CAPe are all connected together via an output control node netAe. Moreover, the gate terminal of the thin-film transistor M2o, the gate terminal of the thin-film transistor M2e, the gate terminal of the thin-film transistor M3o, the gate terminal of the thin-film transistor M3e, the drain terminal of the thin-film transistor M4o, the drain terminal of the thin-film transistor M4e, and the source terminal of the thin-film transistor M5 are all connected together via a stabilization node netB.

Below, for components of the stage circuit SR of the odd-numbered stage and components of the stage circuit SR of the even-numbered stage that are configured identically, only the components of the stage circuit of the odd-numbered stage will be described, and redundant descriptions of the components of the stage circuit of the even-numbered stage will be omitted. In the thin-film transistor M1o, the gate terminal is connected to the output control node netAo, the drain terminal is connected to the input terminal 41o, and the source terminal is connected to the output terminal 49o. In the thin-film transistor M2o, the gate terminal is connected to the stabilization node netB, the drain terminal is connected to the output control node netAo, and the source terminal is connected to the input terminal for the DC supply voltage VSS. In the thin-film transistor M3o, the gate terminal is connected to the stabilization node netB, the drain terminal is connected to the output terminal 49o, and the source terminal is connected to the input terminal for the DC supply voltage VSS. In the thin-film transistor M4o, the gate terminal is connected to the output control node netAo, the drain terminal is connected to the stabilization node netB, and the source terminal is connected to the input terminal for the DC supply voltage VSS. In the thin-film transistor M5, the gate terminal and the drain terminal are both connected to the input terminal 44 (that is, are diode-connected), and the source terminal is connected to the stabilization node netB. In the thin-film transistor M6o, the gate terminal and the drain terminal are both connected to the input terminal 42o (that is, are diode-connected), and the source terminal is connected to the output control node netAo. In the thin-film transistor M7o, the gate terminal is connected to the input terminal 43o, the drain terminal is connected to the output control node netAo, and the source terminal is connected to the input terminal for the DC supply voltage VSS. In the capacitor CAPo, one terminal is connected to the output control node netAo, and the other terminal is connected to the output terminal 49o.

Next, the operation of each component of the stage circuit group SRG will be described. The thin-film transistor M1o applies the current voltage of the first gate clock signal CKA to the output terminal 49o when the voltage of the output control node netAo is at the high level. The thin-film transistor M2o changes the voltage of the output control node netAo to the VSS voltage when the voltage of the stabilization node netB is at the high level. The thin-film transistor M3o changes the voltage of the output terminal 49o (that is, the voltage of the scanning signal GOUT(n)) to the VSS voltage when the voltage of the stabilization node netB is at the high level. The thin-film transistor M4o changes the voltage of the stabilization node netB to the VSS voltage when the voltage of the output control node netAo is at the high level. The thin-film transistor M5 changes the voltage of the stabilization node netB to the high level when the stabilization control signal GON is at the high level. The thin-film transistor M6o changes the voltage of the output control node netAo to the high level when the set signal So is at the high level. The thin-film transistor M7o changes the voltage of the output control node netAo to the VSS voltage when the reset signal Ro is at the high level. The capacitor CAPo functions as a compensation capacitor for maintaining the voltage of the output control node netAo at the high level during the period in which the gate bus line that is connected to the output terminal 49o is selected.

In the present embodiment, the thin-film transistors M1o and M1e form an output control switching element, the thin-film transistors M2o and M2e form an output control node stabilization switching element, the thin-film transistors M4o and M4e form a stabilization node OFF-switching element, the thin-film transistor M5 forms a stabilization node ON-switching element, the thin-film transistors M6o and M6e form an output control node ON-switching element, and the thin-film transistors M7o and M7e form an output control node OFF-switching element.

<1.4 Method of Driving>

Figure 8:
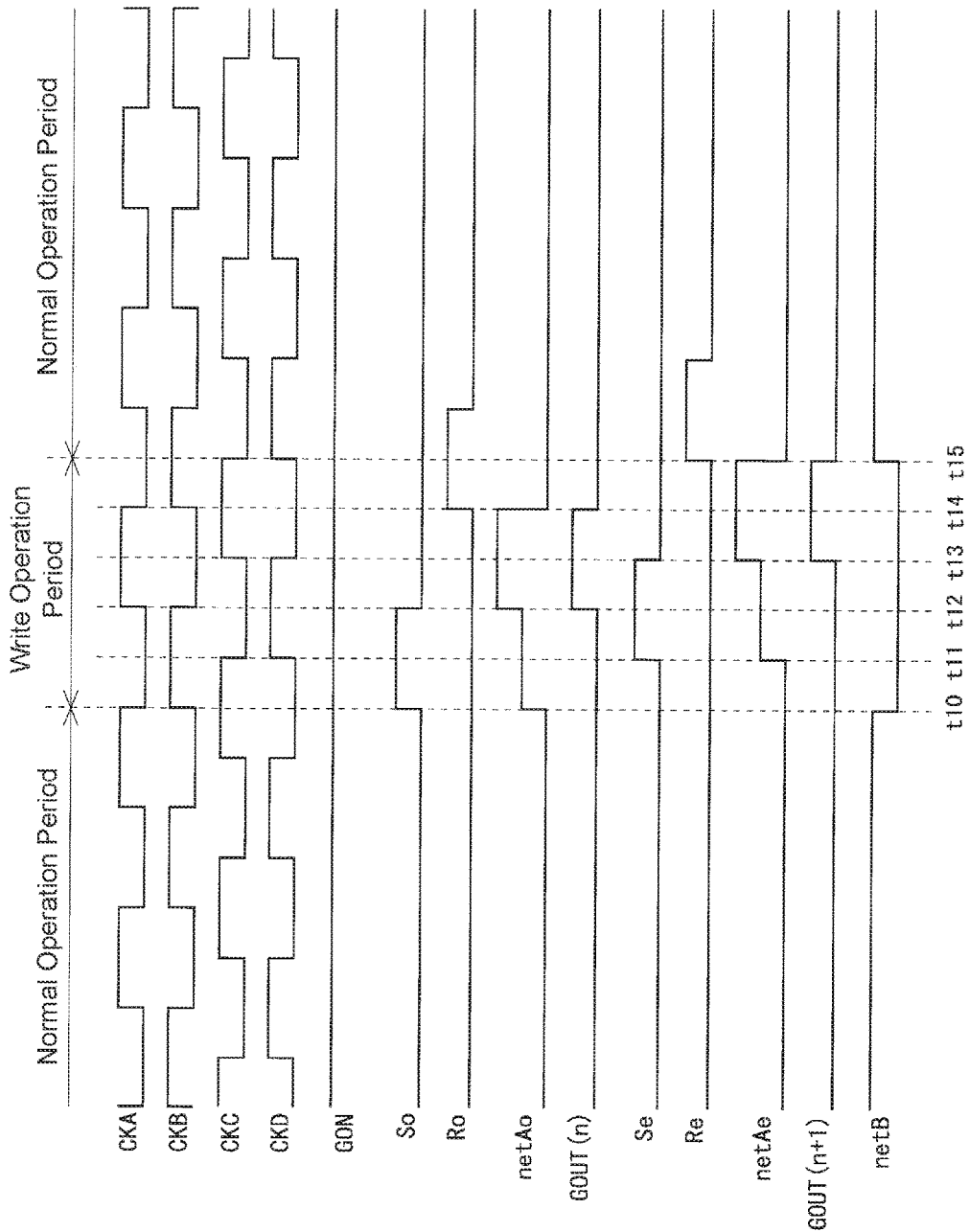
FIG. 8 is a timing chart for explaining a method of driving in Embodiment 1.
Figure 9:
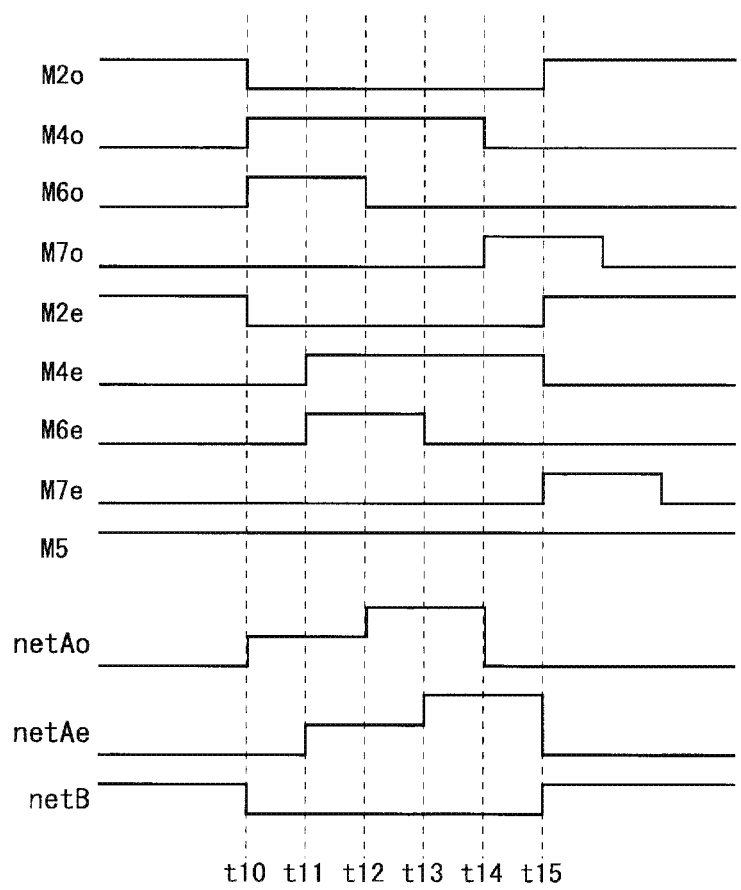
FIG. 9 is a timing chart illustrating changes in the states of thin-film transistors for controlling the states of an output control node and a stabilization node in Embodiment 1.

Next, a method of driving of the present embodiment will be described with reference to FIGS. 1, 8, and 9. FIG. 8 is a timing chart for explaining the method of driving in the present embodiment. FIG. 9 is a timing chart illustrating the changes in the states of the thin-film transistors for controlling the states of the output control node netAo and the stabilization node netB. The following description focuses on a stage circuit group SRG that includes the stage circuit SR(n) of the nth stage and the stage circuit SR(n+1) of the (n+1)th stage. Here, the period of time during which the stage circuit groups SRG write (charge) the pixel capacitors in the corresponding rows will be referred to as the "write operation period." Moreover, periods of time other than the write operation period will be referred to as "normal operation periods." In FIG. 8, the period from time t10 to time t15 corresponds to the write operation period, and the period prior to time t10 as well as the period after time t15 correspond to normal operation periods.

During the period prior to time t10, the voltages of the output control node netAo, the output control node netAe, the scanning signal GOUT(n), and the scanning signal GOUT(n+1) are all maintained at the low level, and the voltage of the stabilization node netB is maintained at the high level.

At time t10, the set signal So switches from the low level to the high level. As illustrated in FIG. 1, the gate and drain terminals of the thin-film transistor M6o are diode-connected, and therefore this pulse in the set signal So sets the thin-film transistor M6o to the ON state. Setting the thin-film transistor M6o to the ON state increases the voltage of the output control node netAo. As a result, the thin-film transistor M1o and the thin-film transistor M4o are both set to the ON state as well. Setting the thin-film transistor M4o to the ON state sets the voltage of the stabilization node netB to the low level. Here, the voltage of the stabilization node netB and the reset signal Ro remain at the low level for the duration of the period from time t10 to t14. As a result, the thin-film transistor M2o and the thin-film transistor M7o remain in the OFF state for this entire period. Therefore, the voltage of the output control node netAo never decreases to the low level during this period of time.

At time t11, the set signal Se switches from the low level to the high level. As illustrated in FIG. 1, the gate and drain terminals of the thin-film transistor M6e are diode-connected, and therefore this pulse in the set signal Se sets the thin-film transistor M6e to the ON state. Setting the thin-film transistor M6e to the ON state increases the voltage of the output control node netAe. As a result, the thin-film transistor M1e and the thin-film transistor M4e are both set to the ON state as well. Setting the thin-film transistor M4e to the ON state sets the voltage of the stabilization node netB to the VSS voltage. Here, the voltage of the stabilization node netB and the reset signal Re remain at the low level for the duration of the period from time t11 to t15. As a result, the thin-film transistor M2e and the thin-film transistor M7e remain in the OFF state for this entire period. Therefore, the voltage of the output control node netAe never decreases to the low level during this period of time.

At time t12, the first gate clock signal CKA switches from the low level to the high level. Because the thin-film transistor M1o is in the ON state at this time, as the voltage of the input terminal 41o increases, the voltage of the output terminal 49o also increases. Here, as illustrated in FIG. 1, the capacitor CAPo is connected between the output control node netAo and the output terminal 49o, and therefore the increase in the voltage of the output terminal 49o causes an increase in the voltage of the output control node netAo as well (the output control node netAo is bootstrapped). As a result, a large voltage is applied to the gate terminal of the thin-film transistor M1o, and the voltage of the scanning signal GOUT(n) increases to the level required to select the gate bus line GLn that is connected to the output terminal 49o of the stage circuit SR(n) of the nth stage. Here, during the period from time t12 to t14, the voltage of the stabilization node netB is at the low level, and therefore the thin-film transistor M3o remains in the OFF state. As a result, the voltage of the scanning signal GOUT(n) never decreases during this period of time.

At time t13, the third gate clock signal CKC switches from the low level to the high level. Because the thin-film transistor M1e is in the ON state at this time, as the voltage of the input terminal 41e increases, the voltage of the output terminal 49e also increases. Here, as illustrated in FIG. 1, the capacitor CAPe is connected between the output control node netAe and the output terminal 49e, and therefore the increase in the voltage of the output terminal 49e causes an increase in the voltage of the output control node netAe as well (the output control node netAe is bootstrapped). As a result, a large voltage is applied to the gate terminal of the thin-film transistor M1e, and the voltage of the scanning signal GOUT(n+1) increases to the level required to select the gate bus line GLn+1 that is connected to the output terminal 49e of the stage circuit SR(n+1) of the (n+1)th stage. Here, during the period from time t13 to t15, the voltage of the stabilization node netB is at the low level, and therefore the thin-film transistor M3e remains in the OFF state. As a result, the voltage of the scanning signal GOUT (n+1) never decreases during this period of time.

At time t14, the first gate clock signal CKA switches from the high level to the low level. The resulting decrease in the voltage of the input terminal 41o causes the voltage of the output terminal 49o (that is, the voltage of the scanning signal GOUT(n)) to decrease as well. This decrease in the voltage of the output terminal 49o causes the voltage of the output control node netAo to decrease as well due to the connection via the capacitor CAPo. Moreover, at time t14, the reset signal Ro switches from the low level to the high level. This sets the thin-film transistor M7o to the ON state. As a result, the voltage of the output control node netAo is set to the low level. Moreover, due to the connection via the capacitor CAPo, the voltage of the output terminal 49o (that is, the voltage of the scanning signal GOUT(n)) is set to the VSS voltage. Note that although the voltage of the output control node netAo being set to the low level at time t14 sets the thin-film transistor M4o to the OFF state, the voltage of the stabilization node netB remains at the low level because the thin-film transistor M4e is still in the ON state.

At time t15, the third gate clock signal CKC switches from the high level to the low level. The resulting decrease in the voltage of the input terminal 41e causes the voltage of the output terminal 49e (that is, the voltage of the scanning signal GOUT(n+1)) to decrease as well. This decrease in the voltage of the output terminal 49e causes the voltage of the output control node netAe to decrease as well due to the connection via the capacitor CAPe. Moreover, at time t15, the reset signal Re switches from the low level to the high level. This sets the thin-film transistor M7e to the ON state. As a result, the voltage of the output control node netAe is set to the low level. Moreover, due to the connection via the capacitor CAPe, the voltage of the output terminal 49e (that is, the voltage of the scanning signal GOUT(n+1)) is set to the VSS voltage.

Furthermore, when the voltage of the output control node netAe is set to the low level at time t15, the thin-film transistor M4e is set to the OFF state. Here, the thin-film transistor M4o has already been set to the OFF state at time t14. Moreover, while the shift register 410 is operating, the stabilization control signal GON is maintained at the high level, and therefore the thin-film transistor M5 remains in the ON state. As a result, at time t15 the voltage of the stabilization node netB changes from the low level to the high level. This sets the thin-film transistor M2o, the thin-film transistor M3o, the thin-film transistor M2e, and the thin-film transistor M3e all to the ON state. Setting the thin-film transistor M2o to the ON state sets the voltage of the output control node netAo to the VSS voltage, and setting the thin-film transistor M3o to the ON state sets the voltage of the scanning signal GOUT(n) to the VSS voltage. Similarly, setting the thin-film transistor M2e to the ON state sets the voltage of the output control node netAe to the VSS voltage, and setting the thin-film transistor M3e to the ON state sets the voltage of the scanning signal GOUT(n+1) to the VSS voltage.

As the stage circuit groups SRG each execute the process described above, the gate bus lines GL1 to GLi of the liquid crystal display device are sequentially selected, and the pixel capacitors are written row by row.

Figure 10:
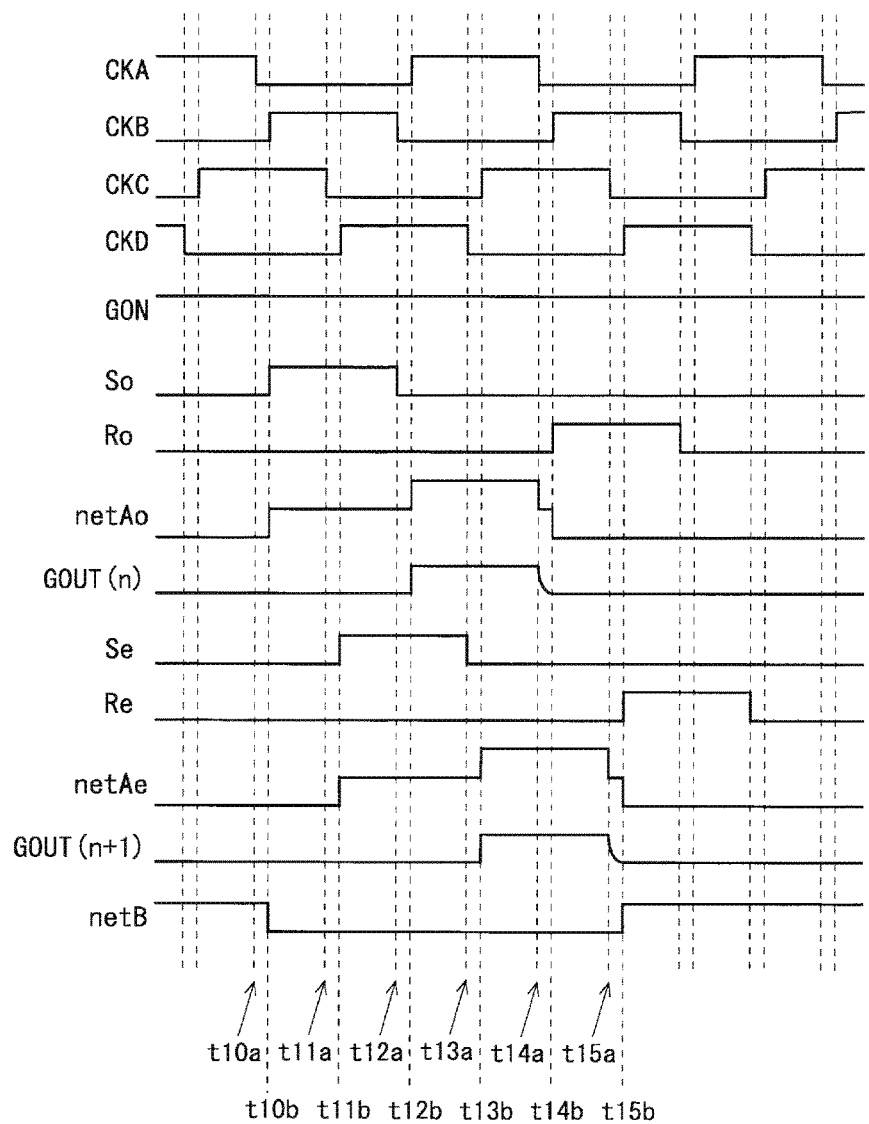
FIG. 10 is a timing chart for explaining a method of driving in Embodiment 1 that illustrates timings more realistically.

In the present embodiment, the gate clock signals GCK that are used as the clock signals for controlling the operation of the stage circuits SR have an on-duty ratio (duty cycle) of 4/8. Strictly speaking, as illustrated in FIG. 10, for two clock signals in which the phases are shifted by 180° from one another, as in this case, a prescribed interval of time known as an offset period must be allocated between the time at which one clock signal falls and the time at which the other clock signal rises. For example, the time t10 in FIG. 8 corresponds to the period from time t10a to t10b in FIG. 10, and the time t11 in FIG. 8 corresponds to the period from time t11a to t11b in FIG. 10. In the stage circuits SR, the voltage of the scanning signals GOUT is changed to the VSS voltage during these offset periods.

Next, the normal operation periods in FIG. 8 will be described. During the normal operation periods, the voltage of the output control node netAo and the voltage of the output control node netAe are maintained at the low level, and therefore the thin-film transistor M4o and the thin-film transistor M4e remain in the OFF state. Moreover, as described above, the stabilization control signal GON is maintained at the high level, and therefore the thin-film transistor M5 remains in the ON state. As a result, during the normal operation periods the voltage of the stabilization node netB is maintained at the high level. However, during the normal operation periods, the first gate clock signal CKA switches from the low level to the high level at prescribed time intervals. This can potentially cause the voltage of the output control node netAo to fluctuate due to the parasitic capacitance of the thin-film transistor M1o. In other words, during the normal operation periods, the voltage of the output control node netAo can potentially enter a floating state at those prescribed time intervals. However, as described above, during the normal operation periods the voltage of the stabilization node netB is maintained at the high level. Therefore, the thin-film transistor M2o remains in the ON state, which keeps the voltage of the output control node netAo equal to the VSS voltage. Similarly, the voltage of the output control node netAe can potentially enter a floating state at prescribed time intervals. However, keeping the thin-film transistor M2e in the ON state keeps the voltage of the output control node netAe equal to the VSS voltage. In this way, the voltage of the output control node netAo and the voltage of the output control node netAe are prevented from floating during the normal operation periods.

<1.5 Effects>

Figure 11:
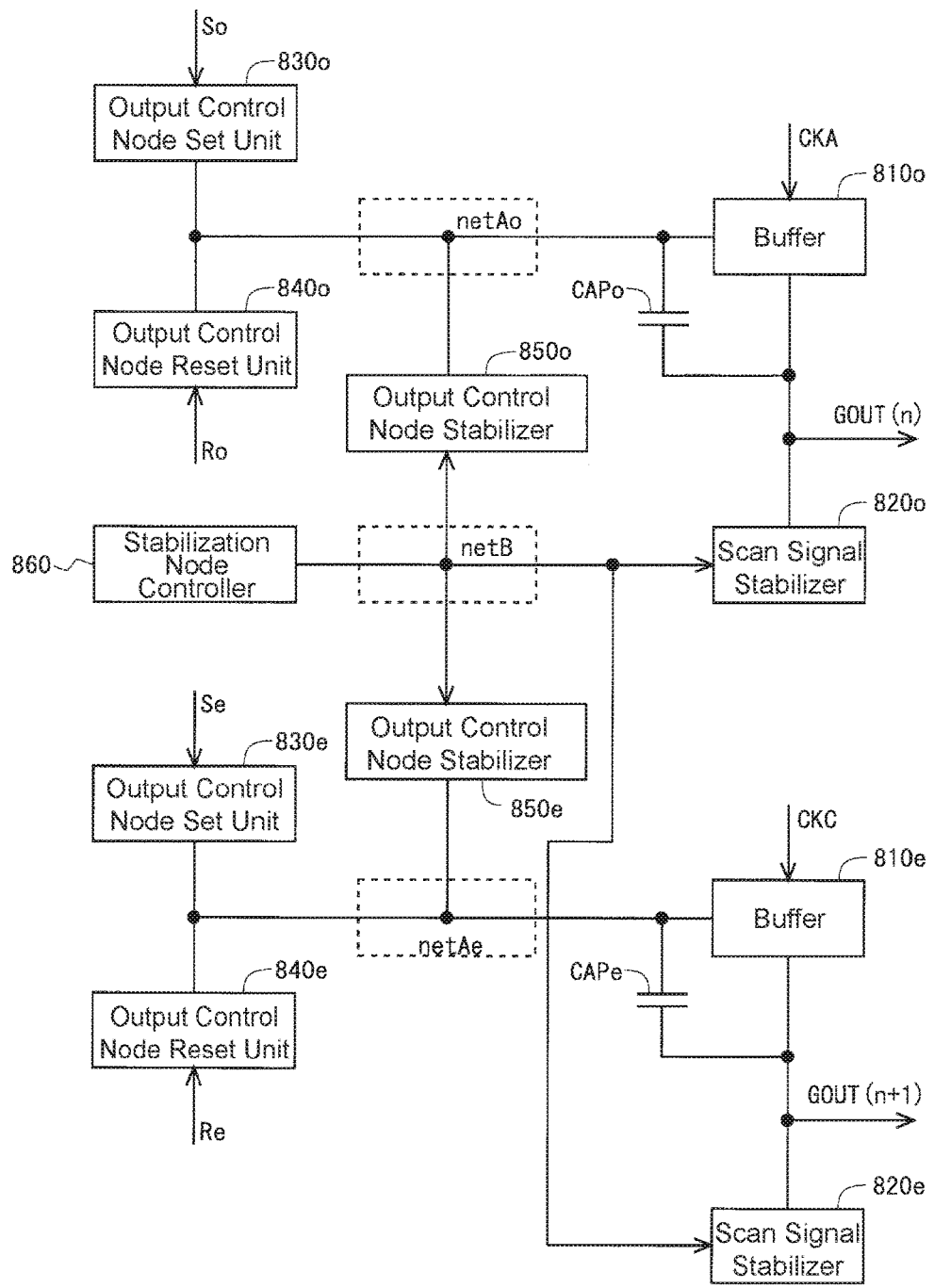
FIG. 11 is a block diagram for explaining the effects of Embodiment 1.
Figure 12:
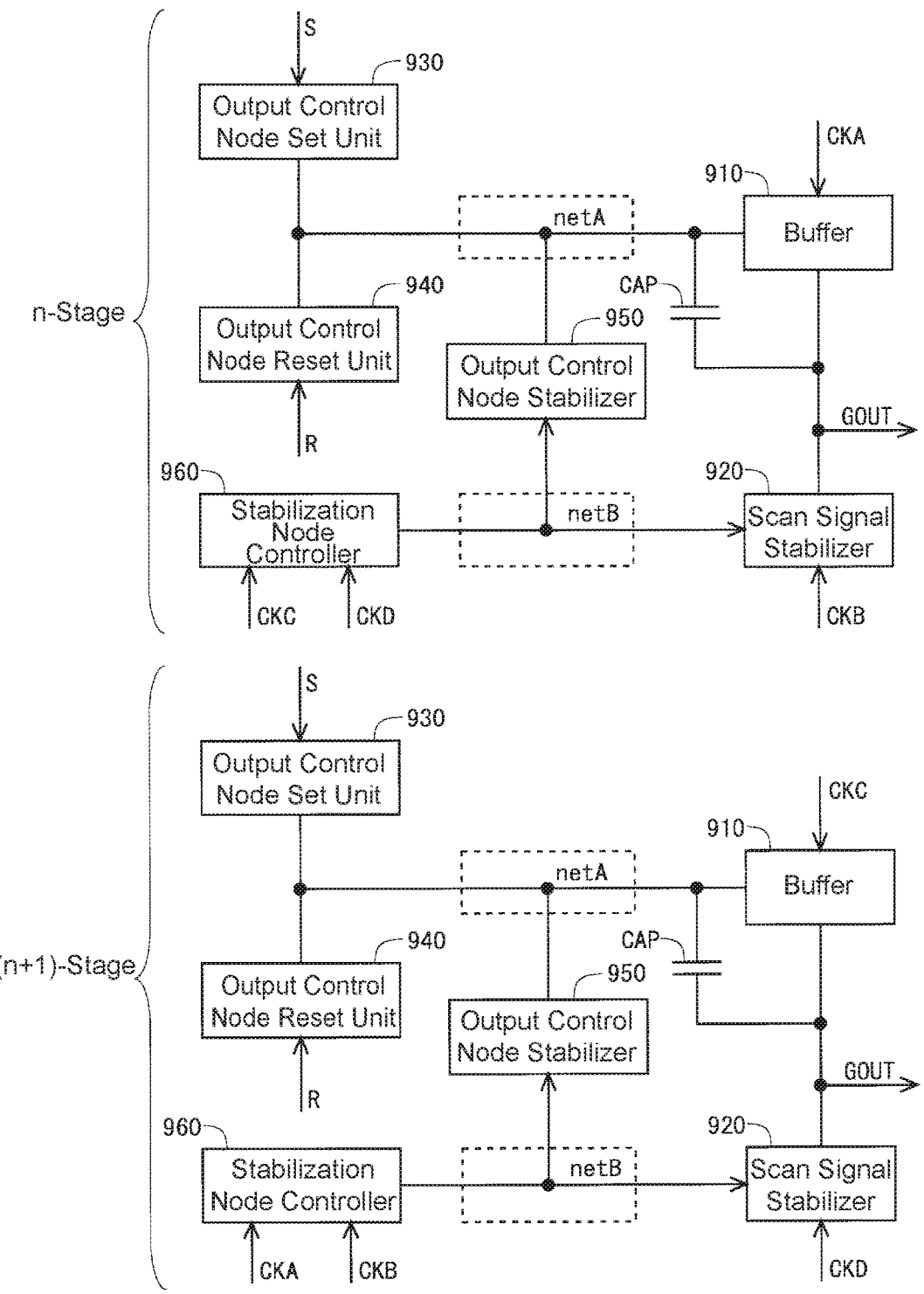
FIG. 12 is a block diagram for explaining the effects of Embodiment 1.
Figure 41:
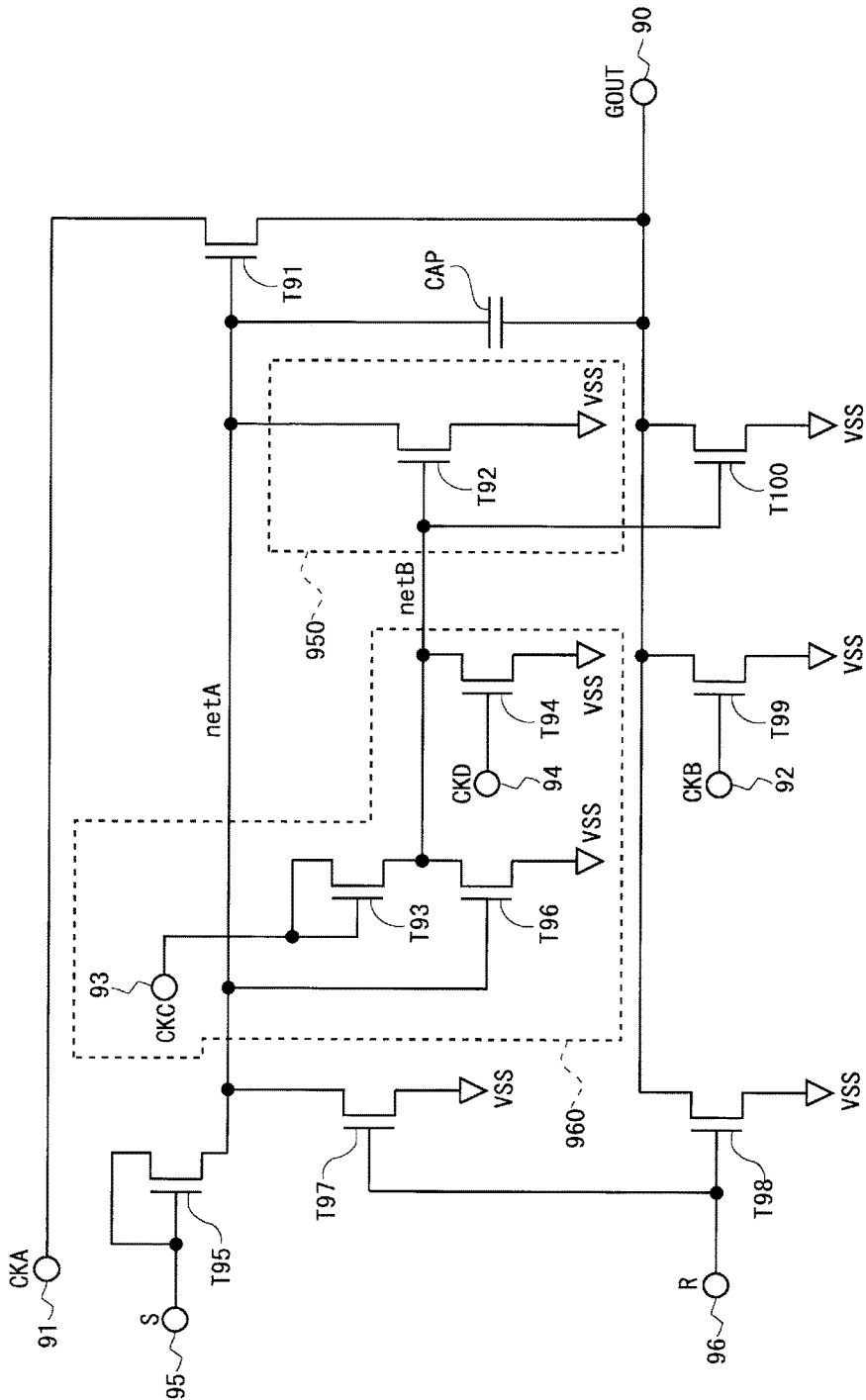
FIG. 41 is a circuit diagram illustrating the configuration of the stage circuit disclosed in WO 2010/067641 Pamphlet.
Figure 42:
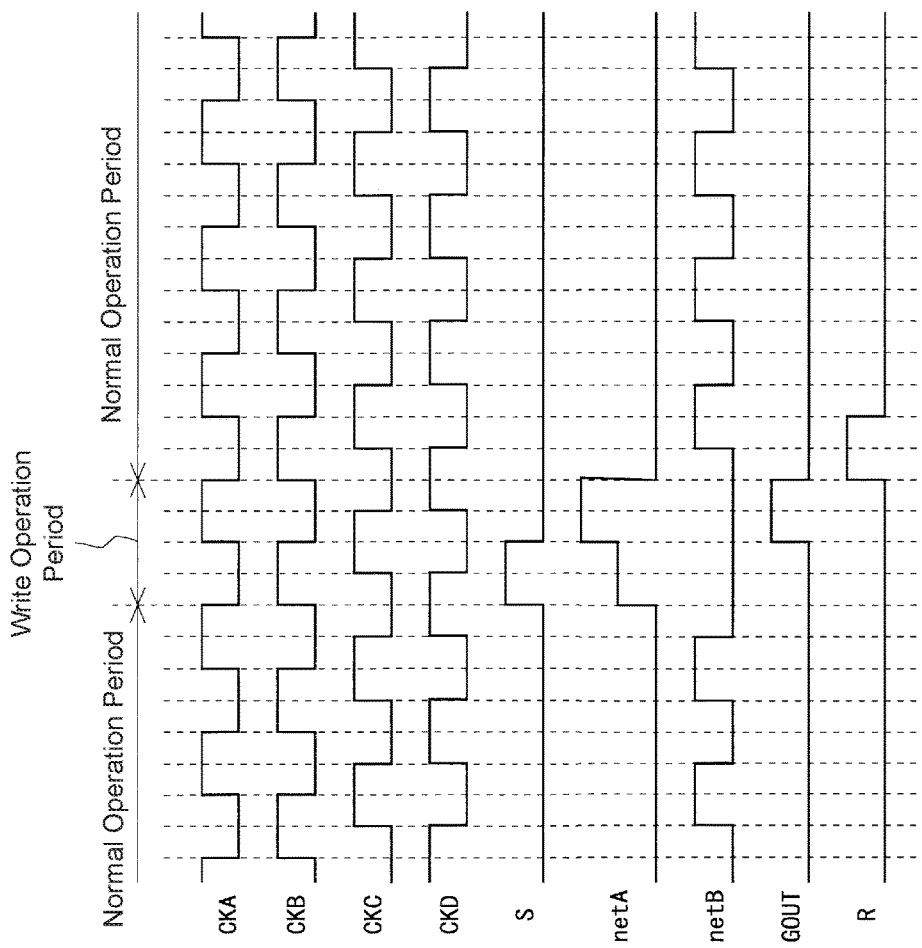
FIG. 42 is a timing chart for explaining the operation of the stage circuit configured as illustrated in FIG. 41.

As illustrated in FIG. 1, in the present embodiment the stage circuit SR of a given odd-numbered stage and the stage circuit SR of the corresponding even-numbered stage share the same stabilization node netB. FIG. 11 schematically illustrates such a configuration (a stage circuit group SRG) that includes the stage circuits SR for two stages. The stabilization node controller 860 illustrated in FIG. 11 includes the thin-film transistor M4o, the thin-film transistor M4e, and the thin-film transistor M5 illustrated in FIG. 1. Here, the stabilization node controller 860 is a component for controlling the voltage of the stabilization node netB in order to control output control node stabilizers 850o and 850e. Compare the configuration of the present embodiment with FIG. 12, which schematically illustrates a configuration that includes the stage circuits SR for two stages in a conventional configuration (the configuration illustrated in FIG. 41). As illustrated in FIG. 12, in this conventional configuration, each stage circuit SR includes its own stabilization node netB and its own stabilization node controller 960. Each of the stabilization node controllers 960 illustrated in FIG. 12 includes the thin-film transistor T93, the thin-film transistor T94, and the thin-film transistor T96 illustrated in FIG. 41. Therefore, the number of thin-film transistors required for the stabilization node controllers is six transistors per two shift register stages in the conventional configuration but only three transistors per two shift register stages in the present embodiment. In other words, the present embodiment requires fewer thin-film transistors to control the output control node stabilizers than conventional configurations. This makes it possible to provide a monolithic gate driver that includes fewer elements than in conventional configurations. This, in turn, makes it possible to reduce the thickness of the bezels in a display device. Moreover, in the conventional configuration, the stabilization node controller 960 includes two thin-film transistors to which clock signals are input. In contrast, in the present embodiment, the stabilization node controller 860 does not include any thin-film transistors to which a clock signal is input, and the only thin-film transistors to which a clock signal is input are the thin-film transistors M1o and M1e. This reduces the clock load in comparison with conventional configurations. This, in turn, reduces power consumption in comparison with conventional configurations.

As described above, in the present embodiment, the voltage of the stabilization node netB is maintained at the high level during the normal operation periods. Therefore, the threshold shift resulting from the bias voltage applied to the gate terminals of the thin-film transistors M2o, M2e, M3o, and M3e can potentially cause undesirable effects. However, using thin-film transistors such as oxide TFTs or LTPS-TFTs that exhibit low threshold shift, as described above, makes it possible to prevent abnormal operation.

<1.6 Modification Examples>

Next, modification examples of Embodiment 1 will be described. Note that in the following descriptions, redundant descriptions of aspects that are the same as in Embodiment 1 will be omitted.

<1.6.1 Modification Example 1>

In Embodiment 1 as described above, the on-duty ratio of the gate clock signals GCK was 4/8. However, the present invention is not limited to this example. Therefore, Modification Example 1 will be described using an example in which the on-duty ratio of the gate clock signals GCK is 3/8.

Figure 13:
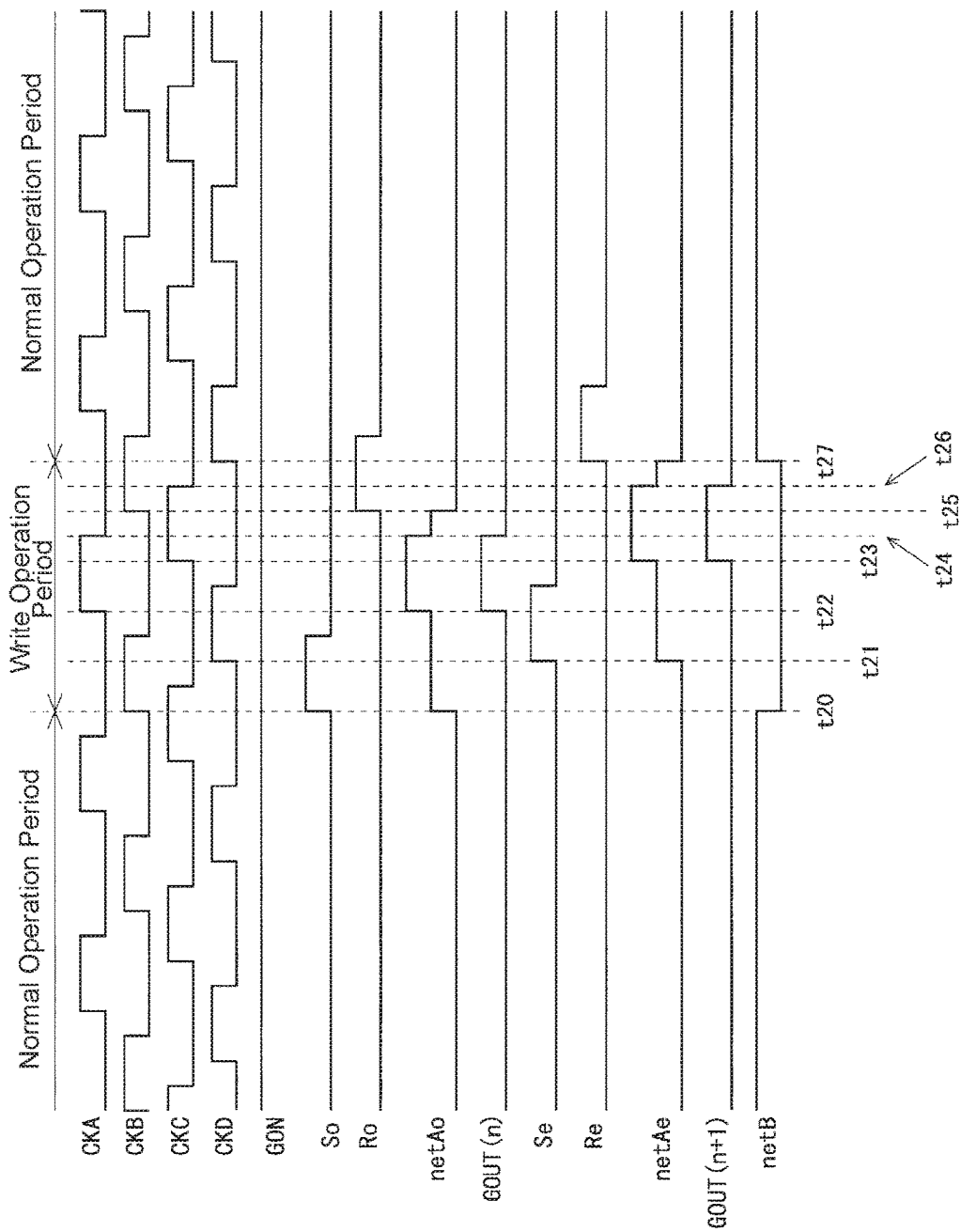
FIG. 13 is a timing chart for explaining a method of driving in Modification Example 1 of Embodiment 1.
Figure 14:
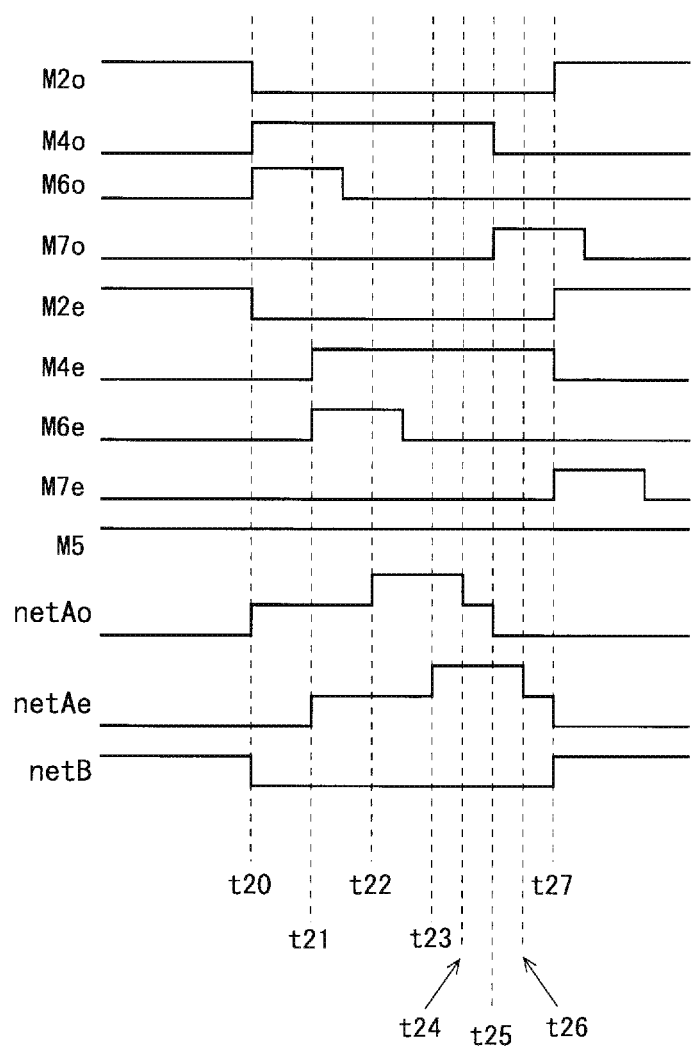
FIG. 14 is a timing chart illustrating changes in the states of thin-film transistors for controlling the states of an output control node and a stabilization node in Modification Example 1 of Embodiment 1.

FIG. 13 is a timing chart for explaining a method of driving in Modification Example 1 of Embodiment 1. FIG. 14 is a timing chart illustrating the changes in the states of the thin-film transistors for controlling the states of the output control node netAo and the stabilization node netB. In FIG. 13, the period from time t20 to time t27 corresponds to the write operation period, and the period prior to time t20 as well as the period after time t27 correspond to normal operation periods.

During the period prior to time t20, the voltages of the output control node netAo, the output control node netAe, the scanning signal GOUT(n), and the scanning signal GOUT(n+1) are all maintained at the low level, and the voltage of the stabilization node netB is maintained at the high level.

At time t20, the same operation as at time t10 in Embodiment 1 (see FIG. 8) is performed. In other words, at time t20, the voltage of the output control node netAo increases, and the voltage of the stabilization node netB is set to the low level. At time t21, the same operation as at time t11 in Embodiment 1 is performed. In other words, at time t21, the voltage of the output control node netAe increases, and the voltage of the stabilization node netB is set to the VSS voltage.

At time t22, the same operation as at time t12 in Embodiment 1 is performed. In other words, at time t22, the voltage of the output control node netAo further increases, and the voltage of the scanning signal GOUT(n) increases to the level required to select the gate bus line GLn that is connected to the output terminal 49o of the stage circuit SR(n) of the nth stage. At time t23, the same operation as at time t13 in Embodiment 1 is performed. In other words, at time t23, the voltage of the output control node netAe further increases, and the voltage of the scanning signal GOUT(n+1) increases to the level required to select the gate bus line GLn+1 that is connected to the output terminal 49e of the stage circuit SR(n+1) of the (n+1)th stage.

At time t24, the first gate clock signal CKA switches from the high level to the low level. The resulting decrease in the voltage of the input terminal 41o causes the voltage of the output terminal 49o (that is, the voltage of the scanning signal GOUT(n)) to decrease as well. This decrease in the voltage of the output terminal 49o causes the voltage of the output control node netAo to decrease as well due to the connection via the capacitor CAPo.

At time t25, the reset signal Ro switches from the low level to the high level. This sets the thin-film transistor M7o to the ON state. As a result, the voltage of the output control node netAo is set to the low level. Moreover, due to the connection via the capacitor CAPo, the voltage of the output terminal 49o (that is, the voltage of the scanning signal GOUT(n)) is set to the VSS voltage. Note that although the voltage of the output control node netAo being set to the low level at time t25 sets the thin-film transistor M4o to the OFF state, the voltage of the stabilization node netB remains at the low level because the thin-film transistor M4e is still in the ON state.

At time t26, the third gate clock signal CKC switches from the high level to the low level. The resulting decrease in the voltage of the input terminal 41e causes the voltage of the output terminal 49e (that is, the voltage of the scanning signal GOUT(n+1)) to decrease as well. This decrease in the voltage of the output terminal 49e causes the voltage of the output control node netAe to decrease as well due to the connection via the capacitor CAPe.

At time t27, the reset signal Re switches from the low level to the high level. This sets the thin-film transistor M7e to the ON state. As a result, the voltage of the output control node netAe is set to the low level. Moreover, due to the connection via the capacitor CAPe, the voltage of the output terminal 49e (that is, the voltage of the scanning signal GOUT(n+1)) is set to the VSS voltage.

Furthermore, when the voltage of the output control node netAe is set to the low level at time t27, the thin-film transistor M4e is set to the OFF state. Here, the thin-film transistor M4o has already been set to the OFF state at time t25. Moreover, while the shift register 410 is operating, the stabilization control signal GON is maintained at the high level, and therefore the thin-film transistor M5 remains in the ON state. As a result, at time t27 the voltage of the stabilization node netB changes from the low level to the high level. This sets the thin-film transistor M2o, the thin-film transistor M3o, the thin-film transistor M2e, and the thin-film transistor M3e all to the ON state. Setting the thin-film transistor M2o to the ON state sets the voltage of the output control node netAo to the VSS voltage, and setting the thin-film transistor M3o to the ON state sets the voltage of the scanning signal GOUT(n) to the VSS voltage. Similarly, setting the thin-film transistor M2e to the ON state sets the voltage of the output control node netAe to the VSS voltage, and setting the thin-film transistor M3e to the ON state sets the voltage of the scanning signal GOUT(n+1) to the VSS voltage.

As the stage circuit groups SRG each execute the process described above, the gate bus lines GL1 to GLi of the liquid crystal display device are sequentially selected, and the pixel capacitors are written row by row. Moreover, similar to in Embodiment 1, the voltage of the output control node netAo and the voltage of the output control node netAe are prevented from floating during the normal operation periods.

Figure 15:
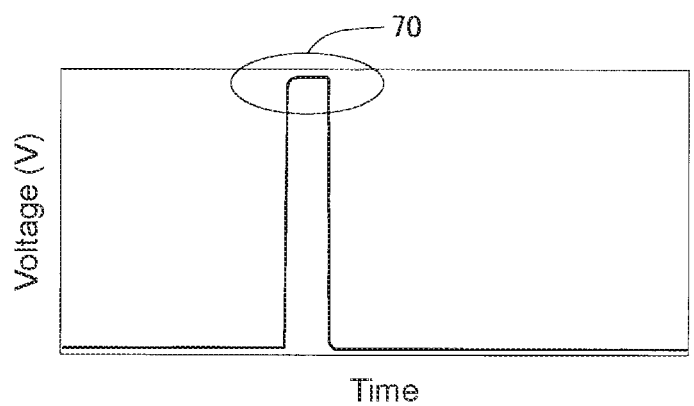
FIG. 15 is a waveform diagram for explaining the effects of Modification Example 1 of Embodiment 1.
Figure 16:
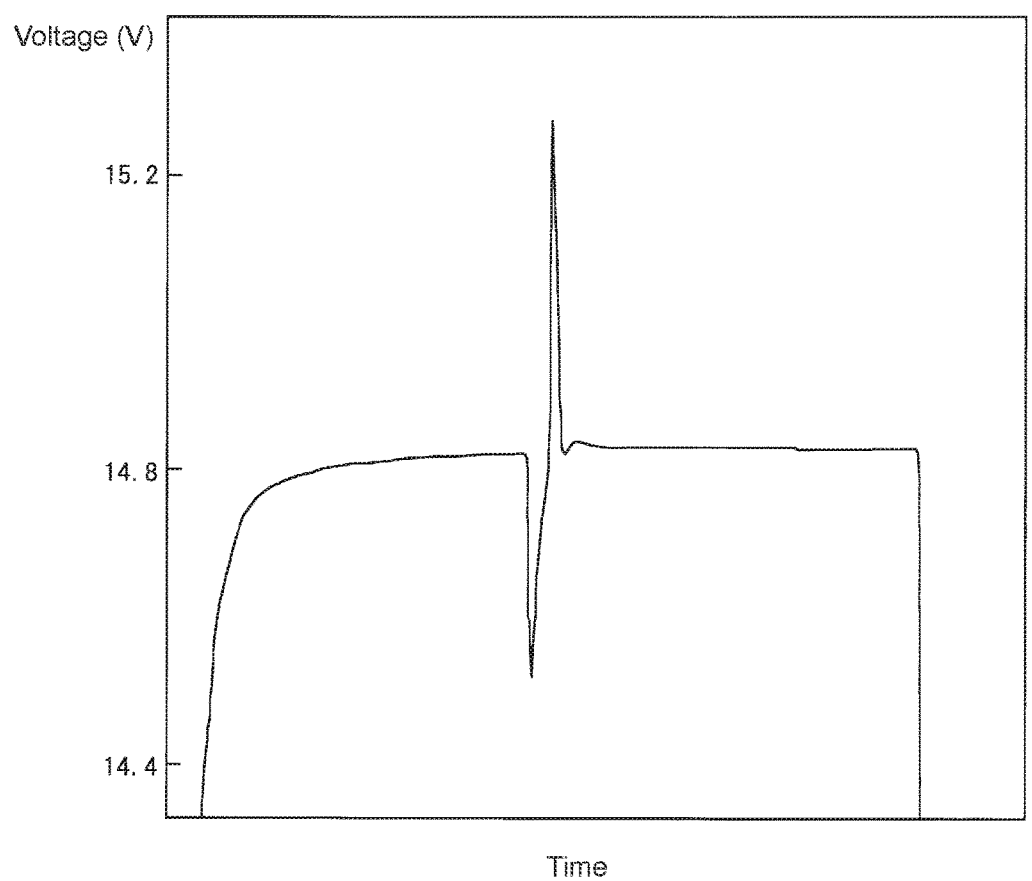
FIG. 16 is a waveform diagram for explaining the effects of Modification Example 1 of Embodiment 1.
Figure 17:
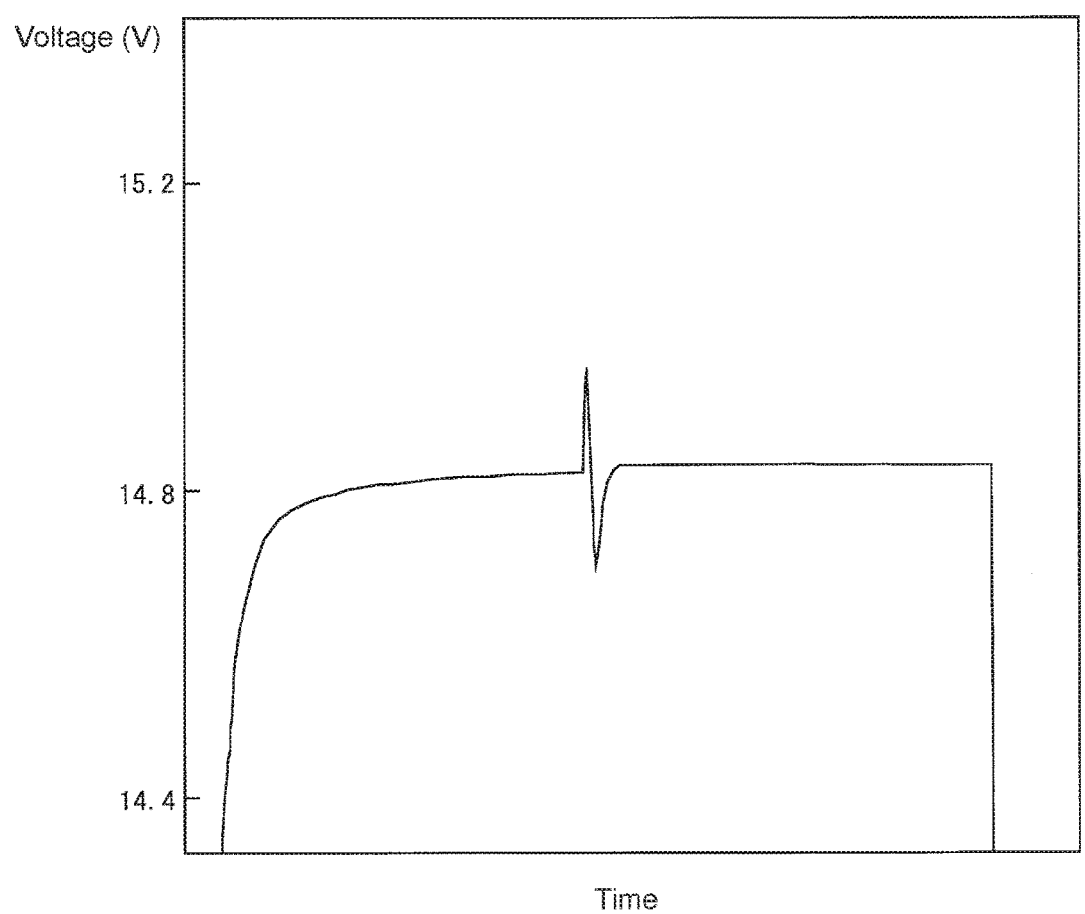
FIG. 17 is a waveform diagram for explaining the effects of Modification Example 1 of Embodiment 1.

In the present modification example, the gate clock signals GCK that are used as the clock signals for controlling the operation of the stage circuits SR have an on-duty ratio of 3/8. Therefore, unlike in Embodiment 1, offset periods are not required. Here, the difference between a case in which an offset period is allocated and a case in which an offset period is not allocated will be described in terms of the magnitude of noise present in the scanning signals GOUT. The stage circuits SR each output a scanning signal GOUT that has a waveform of the type illustrated in FIG. 15. When the portion of the waveform indicated by the reference character 70 in FIG. 15 is enlarged, the waveform would appear as illustrated in FIG. 16 for the case in which the offset period is allocated, but would appear as illustrated in FIG. 17 for the case in which an offset period is not allocated. As illustrated in FIGS. 16 and 17, in the case in which the offset period is allocated, a large amount of noise occurs due to the difference in timing between when one clock signal falls and when the other clock signal rises in the two clock signals in which the phases are shifted by 180° from one another. However, in the present modification example, an offset period of the type required in Embodiment 1 does not need to be allocated, and therefore this large amount of noise is not present in the scanning signals GOUT.

<1.6.2 Modification Example 2>

In Embodiment 1, a four-phase clock signal was used for the gate clock signals GCK. However, the present invention is not limited to this example. A clock signal with a number of phases other than four, such as a six-phase clock signal or an eight-phase clock signal, for example, may also be used for the gate clock signals GCK. Therefore, Modification Example 2 will be described using an example in which an eight-phase clock signal is used for the gate clock signals GCK.

Figure 18:
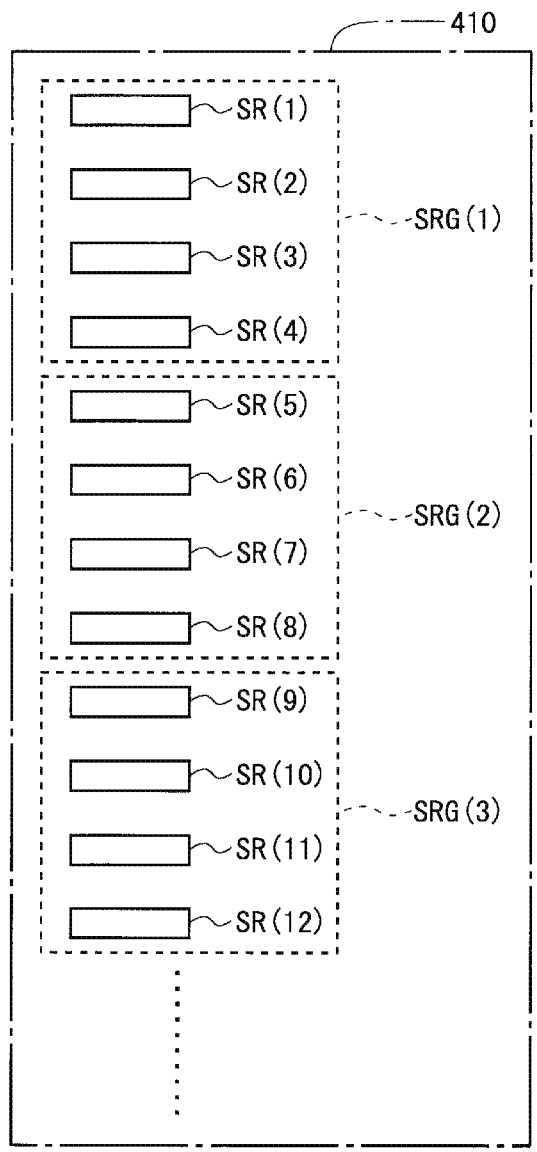
FIG. 18 is a block diagram for explaining stage circuit groups in Modification Example 2 of Embodiment 1.

FIG. 18 is a block diagram for explaining a stage circuit group SRG of the present modification example. As illustrated in FIG. 18, in the present modification example, four adjacent stage circuits SR are treated as one stage circuit group SRG. In other words, the stabilization control node netB and the stabilization node controller 860 illustrated in FIG. 11 are shared by four stage circuits SR.

Figure 19:
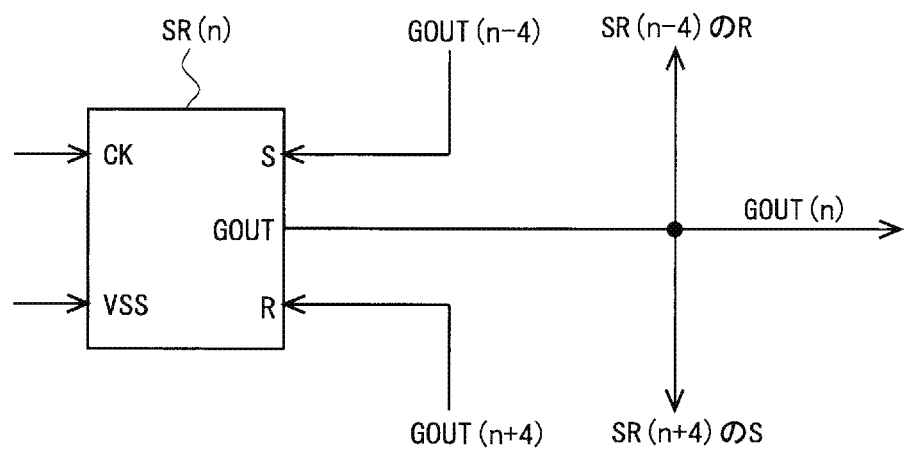
FIG. 19 is a diagram for explaining input and output signals in a stage circuit in Modification Example 2 of Embodiment 1.

As illustrated in FIG. 19, in a given stage (here, the nth stage), the scanning signal GOUT(n−4) output from the stage circuit SR(n−4) of the (n−4)th stage is input as a set signal, and the scanning signal GOUT(n+4) output from the stage circuit SR(n+4) of the (n+4)th stage is input as a reset signal. Moreover, the scanning signal GOUT(n) output from a given stage is applied to the gate bus line GLn of the nth row, input to the stage circuit SR(n−4) of the (n−4)th stage as a reset signal, and input to the stage circuit SR(n+4) of the (n+4)th stage as a set signal.

Figure 20:
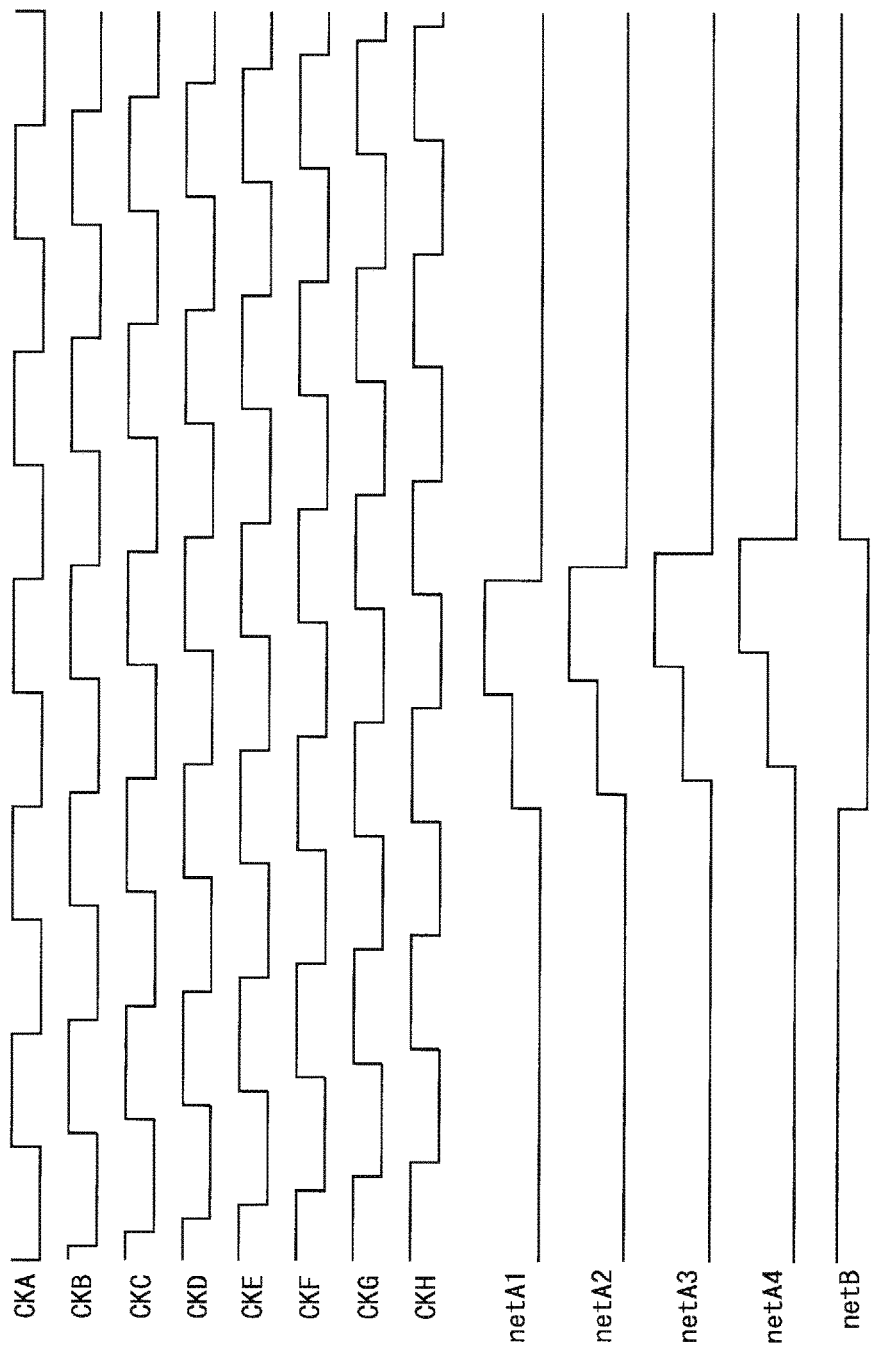
FIG. 20 is a timing chart for explaining the operation of a shift register in Modification Example 2 of Embodiment 1.

When the eight-phase gate clock signals GCK are input to the shift register 410 that includes the stage circuits SR configured as described above, the stage circuits SR operate in the same manner as in Embodiment 1 except in that four adjacent stage circuits SR are treated as one stage circuit group SRG Therefore, as illustrated in FIG. 20, during the period in which the stabilization node netB in the stage circuit group SRG is at the low level, the voltages of the output control nodes in the four stage circuits SR that form that stage circuit group SRG sequentially increase and then sequentially decrease. Note that in FIG. 20, the output control nodes of the four adjacent stage circuits SR that form the stage circuit group SRG are respectively denoted by netA1 to netA4 for the first to fourth stages.

Figure 40:
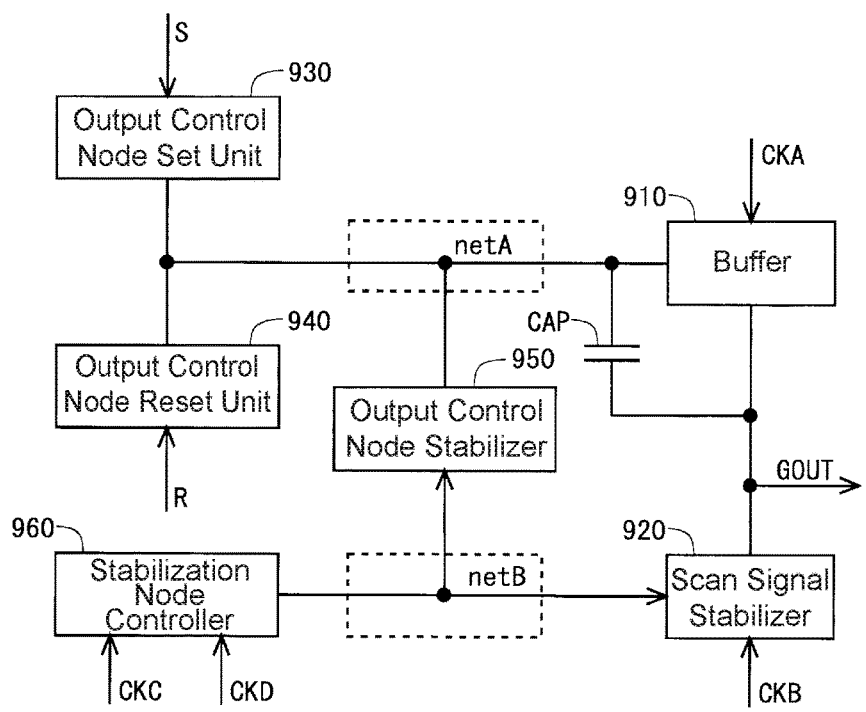
FIG. 40 schematically illustrates a configuration of a stage circuit that includes an output control node stabilizer and a stabilization node controller.

As described above, in the conventional configuration, each stage circuit SR includes its own stabilization node controller 960 (see FIG. 40). Therefore, in this conventional configuration, the number of thin-film transistors required for the stabilization node controllers 960 would be 12 transistors per four shift register stages (see FIG. 41). In contrast, in the present modification example, the stabilization node controller 860 is shared by four stage circuits SR. Therefore, in the present modification example, the number of thin-film transistors required for the stabilization node controller 860 is only three transistors per four shift register stages. The present modification example thus requires significantly fewer thin-film transistors to control the output control node stabilizers than conventional configurations. This makes it possible to provide a monolithic gate driver that includes significantly fewer elements than in conventional configurations. This, in turn, significantly reduces power consumption in comparison with conventional configurations.

When the stabilization node controller 860 is shared by four stage circuits SR as in the present modification example, the second and third stages of those four stage circuits SR do not necessarily need to include the thin-film transistors for changing the voltage of the stabilization node netB to the VSS voltage (that is, transistors corresponding to the thin-film transistors M4o and M4e in Embodiment 1). However, it is preferable that the second and third stages do include these thin-film transistors for changing the voltage of the stabilization node netB to the VSS voltage in order to further stabilize the operation of the shift register 410 by dividing the load applied to the output control node equally among the four stage circuits SR.

Moreover, when a k-phase clock signal is used for the gate clock signals GCK, the stabilization control node netB and the stabilization node controller 860 illustrated in FIG. 11 can be shared by up to (k/2) stages.

<1.6.3 Modification Example 3>

In Embodiment 1 as described above, the elements of the gate driver 400 (that is, the elements of the stage circuits SR) were all formed in a region outside of the display region. However, the present invention is not limited to this example. All of the elements of the gate driver 400 may instead be formed inside of the display region (inside of the pixel region), as in the present modification example.

Figure 21:
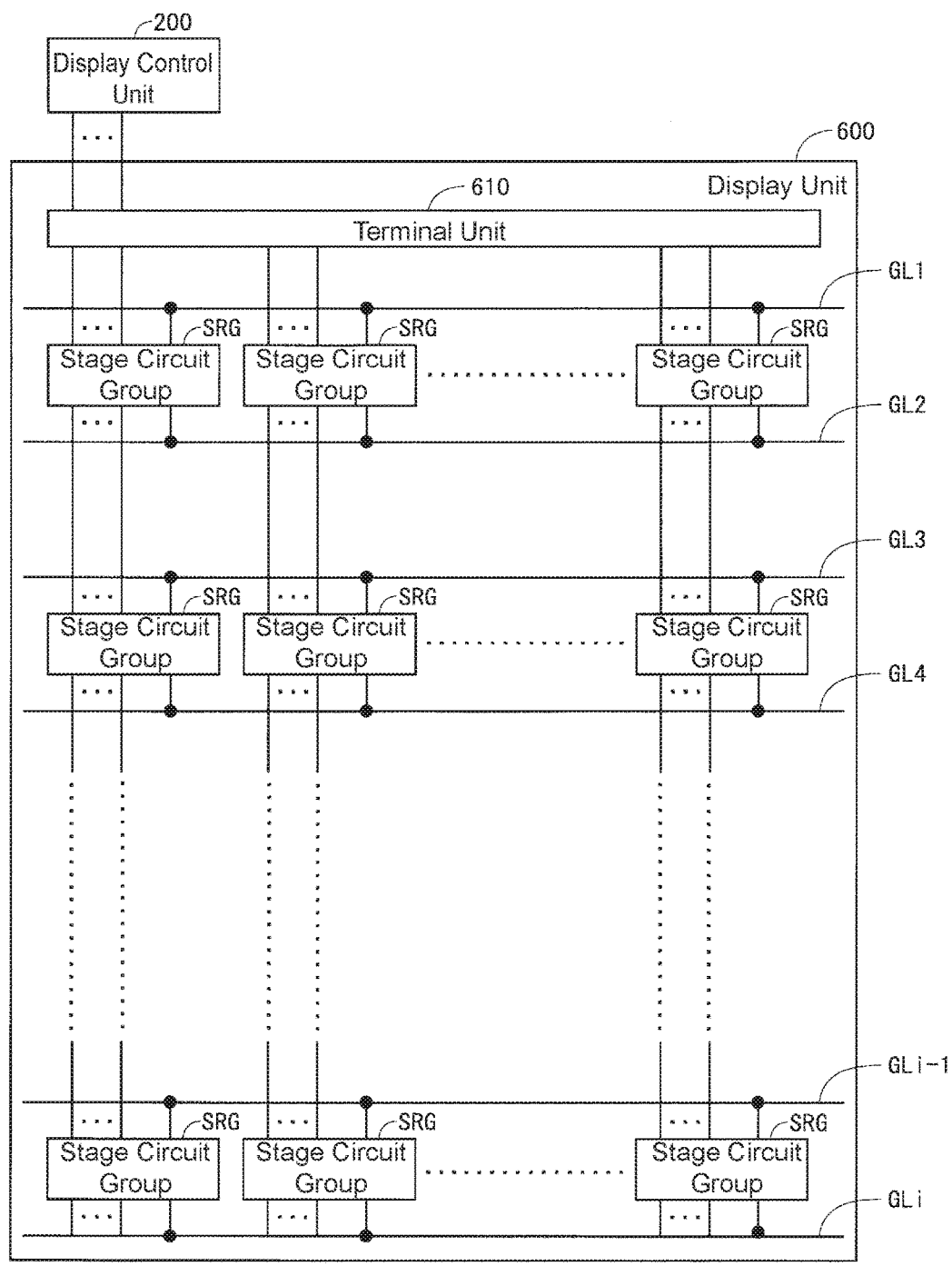
FIG. 21 is a block diagram illustrating a configuration of a gate driver in Modification Example 3 of Embodiment 1.

FIG. 21 is a block diagram for explaining a configuration of a gate driver 400 in the present modification example. Note that in FIG. 21, the source bus lines are not illustrated. As illustrated in FIG. 21, in the present modification example, stage circuit groups SRG that each include the stage circuit SR of an odd-numbered stage and the stage circuit SR of an even-numbered stage are formed in regions between the gate bus lines of odd-numbered rows and the gate bus lines of even-numbered rows. As a result, all of the elements of the gate driver 400 are formed inside of the display region (inside of the pixel region). Moreover, the stage circuit groups SRG are formed at substantially equal intervals along the gate bus lines. Control signals such as the gate clock signals GCK are sent from the display control circuit 200 to these stage circuit groups SRG via a terminal unit 610 that is arranged along an edge of the display unit 600.

In comparison with the configuration in which the gate driver is arranged in a region outside of the display region and the scanning signals are input via the ends of the gate bus lines, the present modification example reduces scanning signal rounding (waveform rounding) on the gate bus lines and makes it possible to drive the gate bus lines at a higher speed. Moreover, because multiple stage circuit groups SRG are connected to each gate bus line, scanning signals will continue to be supplied to the gate bus lines even if a disconnection occurs along those gate bus lines, and therefore the appropriate image can continue to be displayed. Furthermore, arranging the terminal unit 610 for routing the control signals such as the gate clock signals GCK on the same side along which the source driver is arranged makes it possible to reduce the thickness of the bezel regions on the other three sides along which the source driver is not arranged.

Note that all of the elements of the gate driver 400 may be formed inside of the display region (inside of the pixel region) in a manner similar to in the present modification example in Embodiment 2 and Embodiment 3 as well.

<1.6.4 Modification Example 4>

In Modification Example 3 as described above, all of the elements of the gate driver 400 were formed inside of the display region. Alternatively, however, only some of the elements of the gate driver 400 may be formed inside of the display region, as in the present modification example.

Figure 22:
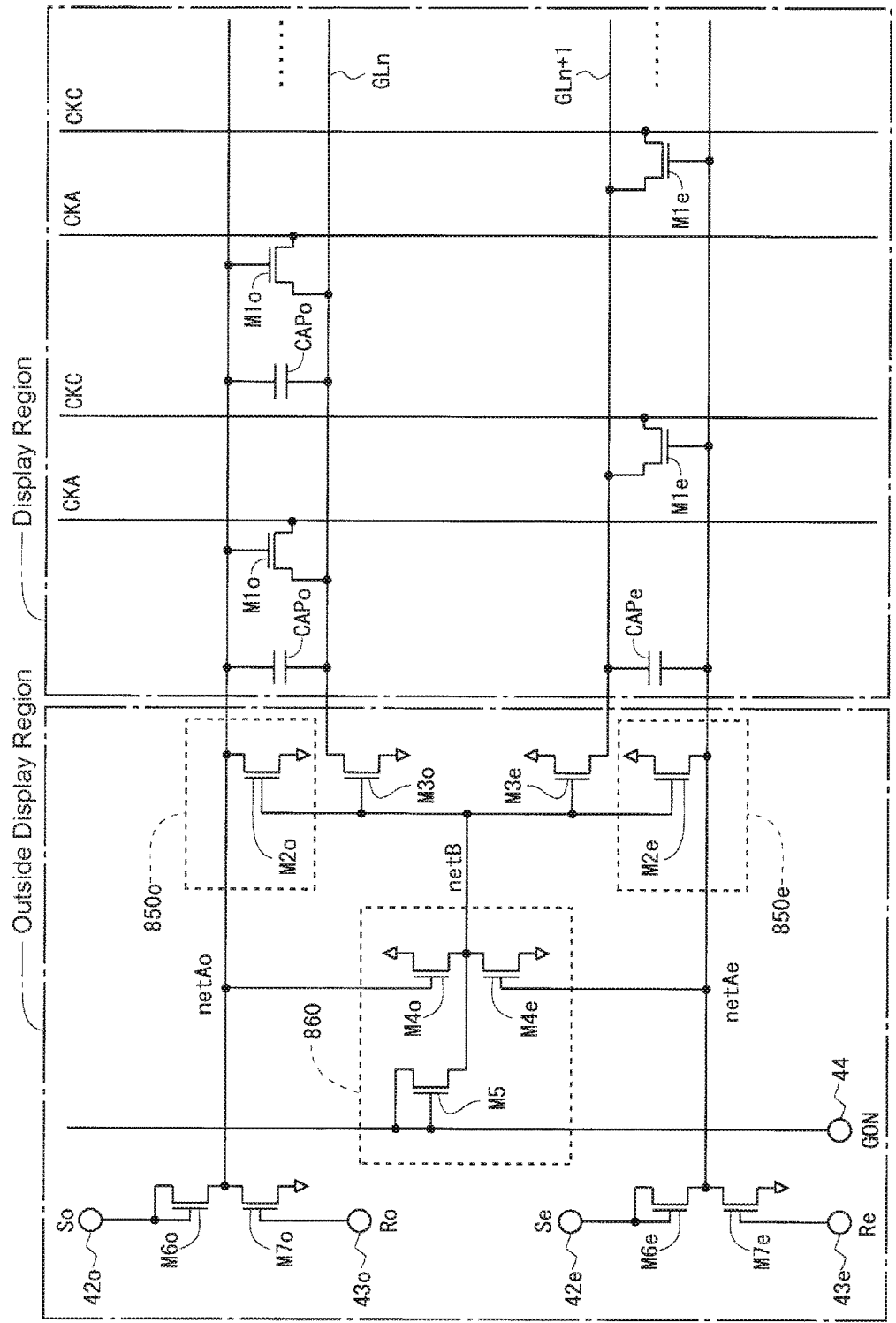
FIG. 22 is a circuit diagram illustrating a configuration of a stage circuit group (the stage circuits for two stages) in Modification Example 4 of Embodiment 1.

FIG. 22 is a circuit diagram illustrating a configuration of a stage circuit group SRG (the stage circuits for two stages) in the present modification example. Note that in FIG. 22, the source bus lines are not illustrated. As illustrated in FIG. 22, in the present modification example, of the circuit elements included in the stage circuit group SRG, the thin-film transistors M1o and M1e and the capacitors CAPo and CAPe are formed inside of the display region, and the other circuit elements are formed in a region outside of the display region. As also illustrated in FIG. 22, multiple thin-film transistors (M1o or M1e) and multiple capacitors (CAPo or CAPe) are formed along each row in the display region. The present invention can still be applied when the gate driver 400 is configured as described above.

Note that only some of the elements of the gate driver 400 may be formed inside of the display region (inside of the pixel region) in a manner similar to in the present modification example in Embodiment 2 and Embodiment 3 as well.

<1.6.5 Other Modification Example>

In Embodiment 1 as described above, a diode-connected configuration was used in the thin-film transistors M5, M6o, and M6e. However, the present invention is not limited to this example. Instead, a configuration in which a high-level DC supply voltage VDD is applied to the drain terminal may be used in the thin-film transistors M5, M6o, and M6e. This also applies to the thin-film transistors M5o, M5e, M5o, and M5e that will be described later.

<2. Embodiment 2>

Next, Embodiment 2 of the present invention will be described. In the present embodiment, a gate driver 400 is a monolithic gate driver that has a vertical inversion feature (a feature for switching the order in which the gate bus lines are scanned). To implement this vertical inversion feature, in the present embodiment, a first scanning order instruction signal UD1 and a second scanning order instruction signal UD2 are input to the gate driver 400 from a display control circuit 200 in addition to a gate start pulse signal GSP, a gate end pulse signal GEP, gate clock signals GCK, and a stabilization control signal GON. Note that in the present specification, scanning the gate bus lines in the "first row, second row, . . . , (i−1)th row, ith row" order will be referred to as "forward scanning," while scanning the gate bus lines in the "ith row, (i−1)th row, . . . , second row, first row" order will be referred to as "reverse scanning."

<2.1 Configuration of Gate Driver>

Figure 23:
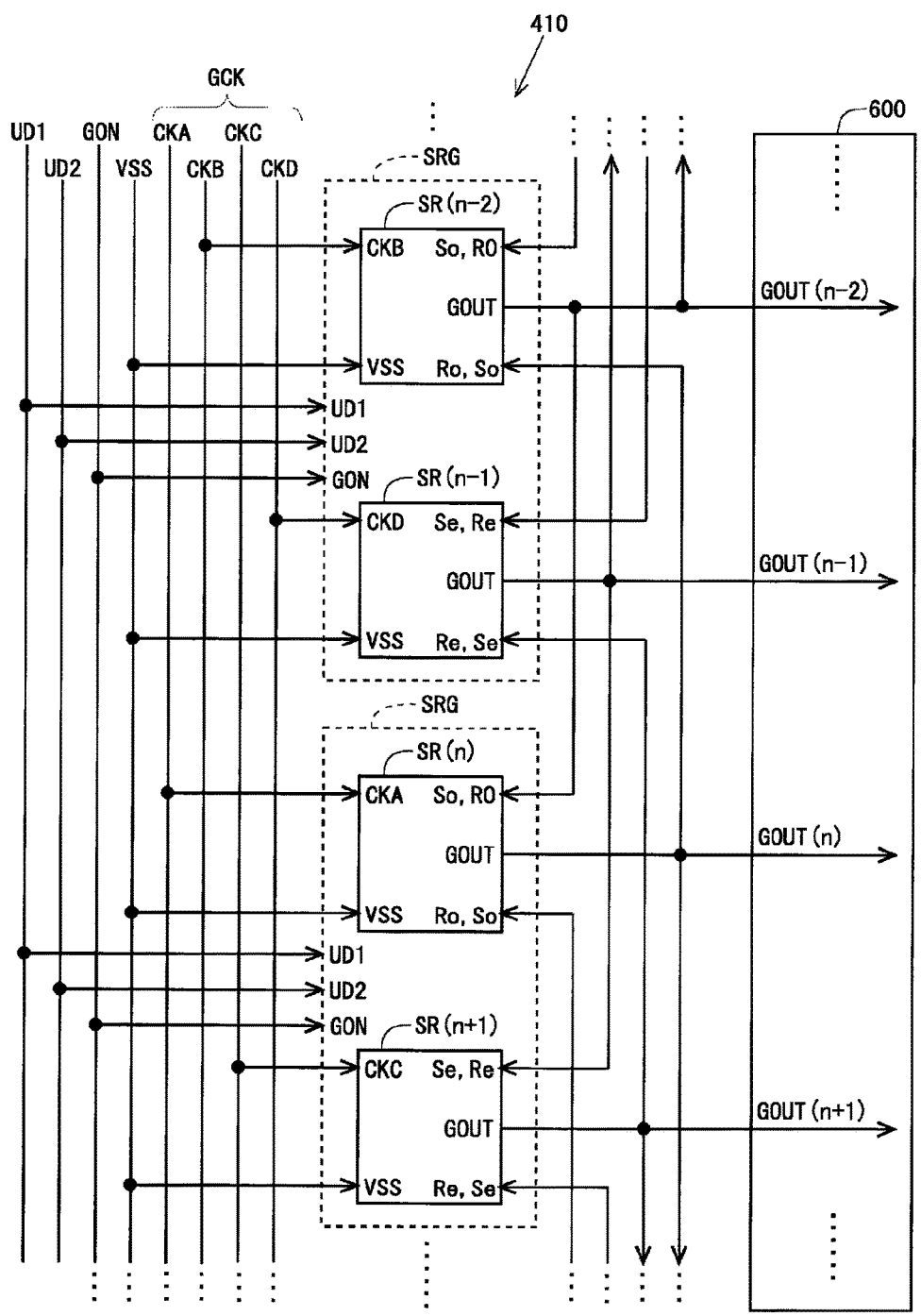
FIG. 23 is a block diagram illustrating a configuration of a shift register in a gate driver in Embodiment 2 of the present invention.

FIG. 23 is a block diagram illustrating a configuration of a shift register 410 in the gate driver 400 in Embodiment 2 of the present invention. Similar to in Embodiment 1, in the present embodiment, two adjacent stage circuits SR are treated as one stage circuit group SRG. As illustrated in FIG. 23, in the present embodiment, each stage circuit group SRG includes an input terminal for receiving the stabilization control signal GON, an input terminal for receiving the first scanning order instruction signal UD1, and an input terminal for receiving the second scanning order instruction signal UD2. Each stage circuit group SRG also includes input terminals for a set signal and a reset signal, where the input terminal that functions as the set signal input terminal during forward scanning functions as the reset signal input terminal during reverse scanning, and the input terminal that functions as the reset signal input terminal during forward scanning functions as the set signal input terminal during reverse scanning.

<2.2 Configuration of Stage Circuit Group>

Figure 24:
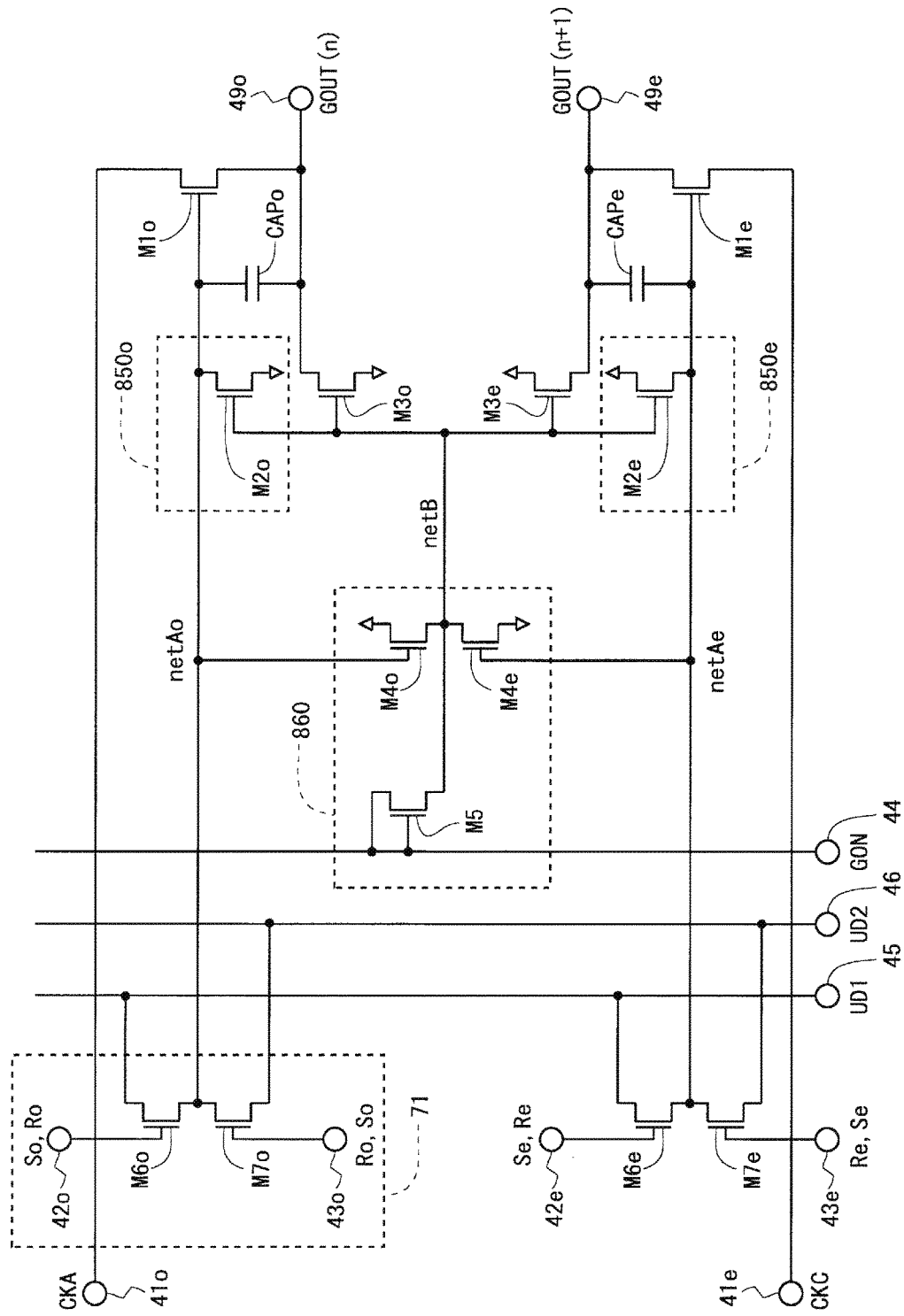
FIG. 24 is a circuit diagram illustrating a configuration of a stage circuit group (the stage circuits for two stages) in Embodiment 2.

FIG. 24 is a circuit diagram illustrating a configuration of one of the stage circuit groups SRG (the stage circuits SR for two stages) in the present embodiment. Here, the input terminal for receiving the first scanning order instruction signal UD1 is denoted by the reference character 45, and the input terminal for receiving the second scanning order instruction signal UD2 is denoted by the reference character 46. In a thin-film transistor M6o, the gate terminal is connected to an input terminal 42o, the drain terminal is connected to the input terminal 45, and the source terminal is connected to an output control node netAo. In a thin-film transistor M7o, the gate terminal is connected to an input terminal 43o, the drain terminal is connected to the output control node netAo, and the source terminal is connected to the input terminal 46. A thin-film transistor M6e and a thin-film transistor M7e are respectively configured in the same manner as the thin-film transistor M6o and the thin-film transistor M7o. Other than in the respects described above, the configuration of the present embodiment is the same as Embodiment 1. The stage circuit group SRG illustrated in FIG. 24 includes the stage circuit SR(n) of the nth stage and the stage circuit SR(n+1) of the (n+1)th stage.

In the present embodiment, the thin-film transistors M6o and M6e form a first output control node ON/OFF-switching element, and the thin-film transistors M7o and M7e form a second output control node ON/OFF-switching element.

<2.3 Method of Driving>

Next, a method of driving in the present embodiment will be described. Similar to in Embodiment 1, in the present embodiment, the scanning signal GOUT(n−2) output from the stage circuit SR(n−2) of the (n−2)th stage is input to the input terminal 42o, the scanning signal GOUT(n−1) output from the stage circuit SR(n−1) of the (n−1)th stage is input to the input terminal 42e, the scanning signal GOUT(n+2) output from the stage circuit SR(n+2) of the (n+2)th stage is input to the input terminal 43o, and the scanning signal GOUT(n+3) output from the stage circuit SR(n+3) of the (n+3)th stage is input to the input terminal 43e. In this configuration, when the first scanning order instruction signal UD1 is at the high level and the second scanning order instruction signal UD2 is at the low level, setting the signal input to the input terminal 42o to the high level causes the voltage of the output control node netAo to increase, and setting the signal input to the input terminal 43o to the high level causes the voltage of the output control node netAo to decrease, while setting the signal input to the input terminal 42e to the high level causes the voltage of the output control node netAe to increase, and setting the signal input to the input terminal 43e to the high level causes the voltage of the output control node netAe to decrease. In this way, in a given stage the voltage of the output control node increases in accordance with the scanning signals output from the stage two stages upstream, while the voltage of the output control node decreases in accordance with the scanning signal output from the stage two stages downstream. This scheme is used to implement forward scanning. Accordingly, during forward scanning, the first scanning order instruction signal UD1 is maintained at the high level and the second scanning order instruction signal UD2 is maintained at the low level for the duration of the operating period of the shift register 410 (that is, the period in which shift operations are performed).

Meanwhile, when the first scanning order instruction signal UD1 is at the low level and the second scanning order instruction signal UD2 is at the high level, setting the signal input to the input terminal 43e to the high level causes the voltage of the output control node netAe to increase, and setting the signal input to the input terminal 42e to the high level causes the voltage of the output control node netAe to decrease, while setting the signal input to the input terminal 43o to the high level causes the voltage of the output control node netAo to increase, and setting the signal input to the input terminal 42o to the high level causes the voltage of the output control node netAo to decrease. In this way, in a given stage the voltage of the output control node increases in accordance with the scanning signals output from the stage two stages downstream, while the voltage of the output control node decreases in accordance with the scanning signal output from the stage two stages upstream. This scheme is used to implement reverse scanning. Accordingly, during reverse scanning, the first scanning order instruction signal UD1 is maintained at the low level and the second scanning order instruction signal UD2 is maintained at the high level for the duration of the operating period of the shift register 410 (that is, the period in which shift operations are performed).

<2.3.1 Forward Scanning>

Figure 25:
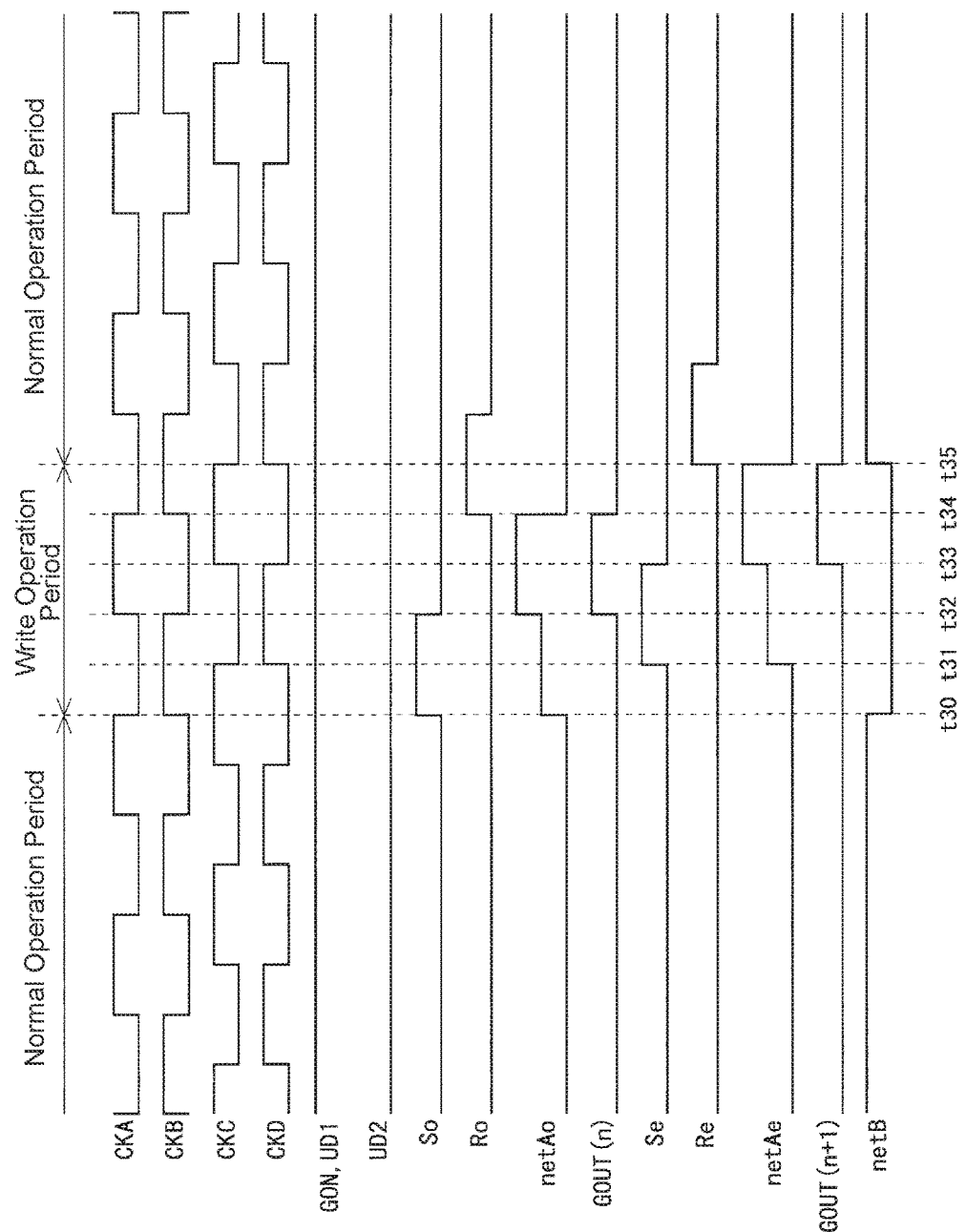
FIG. 25 is a timing chart for explaining a method of driving during forward scanning in Embodiment 2.

FIG. 25 is a timing chart for explaining the method of driving during forward scanning. In FIG. 25, the period from time t30 to time t35 corresponds to the write operation period, and the period prior to time t30 as well as the period after time t35 correspond to normal operation periods.

As described above, during forward scanning, the first scanning order instruction signal UD1 is maintained at the high level and the second scanning order instruction signal UD2 is maintained at the low level for the duration of the operating period of the shift register 410. Moreover, similar to in Embodiment 1, the signal input to the input terminal 42o serves as the set signal So, the signal input to the input terminal 43o serves as the reset signal Ro, the signal input to the input terminal 42e serves as the set signal Se, and the signal input to the input terminal 43e serves as the reset signal Re. In this way, the voltage of the output control node netAo is controlled via the thin-film transistor M6o and the thin-film transistor M7o in a manner similar to in Embodiment 1, and the voltage of the output control node netAe is controlled via the thin-film transistor M6e and the thin-film transistor M7e in a manner similar to in Embodiment 1. Therefore, during forward scanning, the operation is the same as in Embodiment 1.

<2.3.2 Reverse Scanning>

Figure 26:
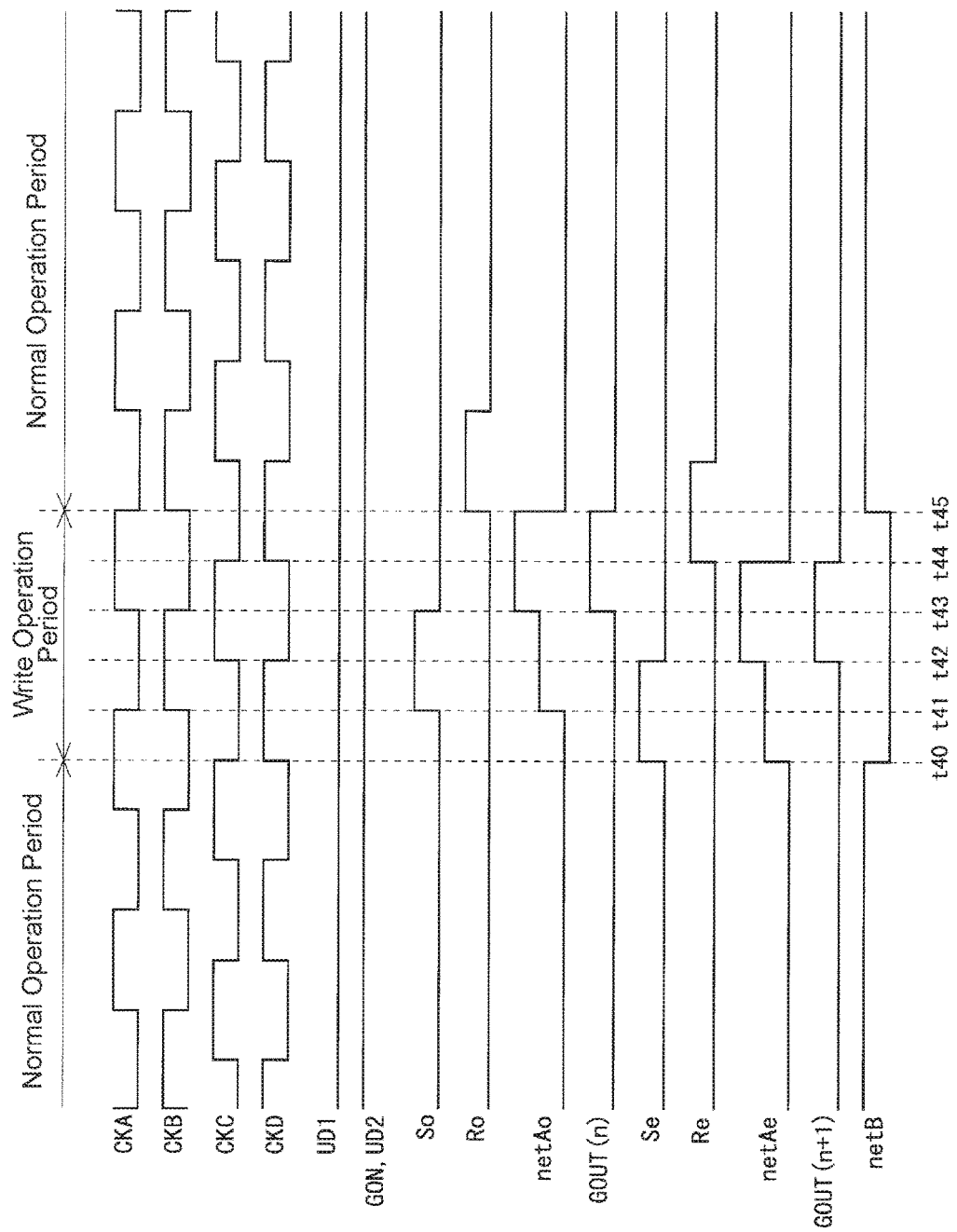
FIG. 26 is a timing chart for explaining a method of driving during reverse scanning in Embodiment 2.

FIG. 26 is a timing chart for explaining the method of driving during reverse scanning. In FIG. 26, the period from time t40 to time t45 corresponds to the write operation period, and the period prior to time t40 as well as the period after time t45 correspond to normal operation periods.

As described above, during reverse scanning, the first scanning order instruction signal UD1 is maintained at the low level and the second scanning order instruction signal UD2 is maintained at the high level for the duration of the operating period of the shift register 410. Moreover, the signal input to the input terminal 43e serves as the set signal Se, the signal input to the input terminal 42e serves as the reset signal Re, the signal input to the input terminal 43o serves as the set signal So, and the signal input to the input terminal 42o serves as the reset signal Ro. As described above, during reverse scanning, the operation of the stage circuit group SRG is different than in Embodiment 1. Therefore, the operation during reverse scanning will be described in more detail below.

During the period prior to time t40, the voltages of the output control node netAo, the output control node netAe, the scanning signal GOUT(n), and the scanning signal GOUT(n+1) are all maintained at the low level, and the voltage of the stabilization node netB is maintained at the high level.

At time t40, the set signal Se switches from the low level to the high level. This sets the thin-film transistor M7e to the ON state. Setting the thin-film transistor M7e to the ON state increases the voltage of the output control node netAe. As a result, the thin-film transistor M1e and the thin-film transistor M4e are both set to the ON state as well. Setting the thin-film transistor M4e to the ON state sets the voltage of the stabilization node netB to the low level. Here, the voltage of the stabilization node netB and the reset signal Re remain at the low level for the duration of the period from time t40 to t44. As a result, the thin-film transistor M2e and the thin-film transistor M7e remain in the OFF state for this entire period. Therefore, the voltage of the output control node netAe never decreases to the low level during this period of time.

At time t41, the set signal So switches from the low level to the high level. This sets the thin-film transistor M7o to the ON state. Setting the thin-film transistor M7o to the ON state increases the voltage of the output control node netAo. As a result, the thin-film transistor M1o and the thin-film transistor M4o are both set to the ON state as well. Setting the thin-film transistor M4o to the ON state sets the voltage of the stabilization node netB to the VSS voltage. Here, the voltage of the stabilization node netB and the reset signal Ro remain at the low level for the duration of the period from time t41 to t45. As a result, the thin-film transistor M2o and the thin-film transistor M7o remain in the OFF state for this entire period. Therefore, the voltage of the output control node netAe never decreases to the low level during this period of time.

At time t42, the third gate clock signal CKC switches from the low level to the high level. Because the thin-film transistor M1e is in the ON state at this time, as the voltage of the input terminal 41e increases, the voltage of the output terminal 49e also increases. Here, as illustrated in FIG. 24, the capacitor CAPe is connected between the output control node netAe and the output terminal 49e, and therefore the increase in the voltage of the output terminal 49e causes an increase in the voltage of the output control node netAe as well (the output control node netAe is bootstrapped). As a result, a large voltage is applied to the gate terminal of the thin-film transistor M1e, and the voltage of the scanning signal GOUT(n+1) increases to the level required to select the gate bus line GLn+1 that is connected to the output terminal 49e of the stage circuit SR(n+1) of the (n+1)th stage. Here, during the period from time t42 to t44, the voltage of the stabilization node netB is at the low level, and therefore the thin-film transistor M3e remains in the OFF state. As a result, the voltage of the scanning signal GOUT(n+1) never decreases during this period of time.

At time t43, the first gate clock signal CKA switches from the low level to the high level. Because the thin-film transistor M1o is in the ON state at this time, as the voltage of the input terminal 41o increases, the voltage of the output terminal 49o also increases. Here, as illustrated in FIG. 24, the capacitor CAPo is connected between the output control node netAo and the output terminal 49o, and therefore the increase in the voltage of the output terminal 49o causes an increase in the voltage of the output control node netAo as well (the output control node netAo is bootstrapped). As a result, a large voltage is applied to the gate terminal of the thin-film transistor M1o, and the voltage of the scanning signal GOUT(n) increases to the level required to select the gate bus line GLn that is connected to the output terminal 49o of the stage circuit SR(n) of the nth stage. Here, during the period from time t43 to t45, the voltage of the stabilization node netB is at the low level, and therefore the thin-film transistor M3o remains in the OFF state. As a result, the voltage of the scanning signal GOUT(n) never decreases during this period of time.

At time t44, the third gate clock signal CKC switches from the high level to the low level. The resulting decrease in the voltage of the input terminal 41e causes the voltage of the output terminal 49e (that is, the voltage of the scanning signal GOUT(n+1)) to decrease as well. This decrease in the voltage of the output terminal 49e causes the voltage of the output control node netAe to decrease as well due to the connection via the capacitor CAPe. Moreover, at time t44, the reset signal Re switches from the low level to the high level. This sets the thin-film transistor M6e to the ON state. As a result, the voltage of the output control node netAe is set to the low level. Moreover, due to the connection via the capacitor CAPe, the voltage of the output terminal 49e (that is, the voltage of the scanning signal GOUT(n+1)) is set to the VSS voltage. Note that although the voltage of the output control node being set to the low level at time t44 sets the thin-film transistor M4e to the OFF state, the voltage of the stabilization node netB remains at the low level because the thin-film transistor M4o is still in the ON state.

At time t45, the first gate clock signal CKA switches from the high level to the low level. The resulting decrease in the voltage of the input terminal 41o causes the voltage of the output terminal 49o (that is, the voltage of the scanning signal GOUT(n)) to decrease as well. This decrease in the voltage of the output terminal 49o causes the voltage of the output control node netAo to decrease as well due to the connection via the capacitor CAPo. Moreover, at time t45, the reset signal Ro switches from the low level to the high level. This sets the thin-film transistor M6o to the ON state. As a result, the voltage of the output control node netAo is set to the low level. Moreover, due to the connection via the capacitor CAPo, the voltage of the output terminal 49o (that is, the voltage of the scanning signal GOUT(n)) is set to the VSS voltage.

Furthermore, when the voltage of the output control node netAo is set to the low level at time t45, the thin-film transistor M4o is set to the OFF state. Here, the thin-film transistor M4e has already been set to the OFF state at time t44. Moreover, while the shift register 410 is operating, the stabilization control signal GON is maintained at the high level, and therefore the thin-film transistor M5 remains in the ON state. As a result, at time t45 the voltage of the stabilization node netB changes from the low level to the high level. This sets the thin-film transistor M2o, the thin-film transistor M3o, the thin-film transistor M2e, and the thin-film transistor M3e all to the ON state. Setting the thin-film transistor M2o to the ON state sets the voltage of the output control node netAo to the VSS voltage, and setting the thin-film transistor M3o to the ON state sets the voltage of the scanning signal GOUT(n) to the VSS voltage. Similarly, setting the thin-film transistor M2e to the ON state sets the voltage of the output control node netAe to the VSS voltage, and setting the thin-film transistor M3e to the ON state sets the voltage of the scanning signal GOUT(n+1) to the VSS voltage.

As the stage circuit groups SRG each execute the process described above, the gate bus lines are sequentially selected in the "ith row, (i−1)th row, . . . , second row, first row" order, and the pixel capacitors are written row by row. Moreover, similar to in Embodiment 1, the voltage of the output control node netAo and the voltage of the output control node netAe are prevented from floating during the normal operation periods.

<2.4 Effects>

Figure 27:
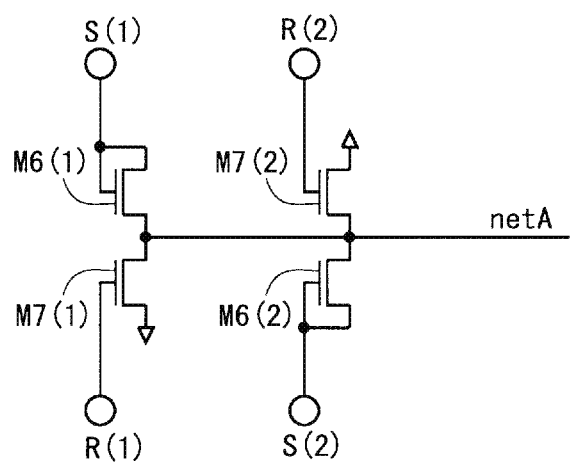
FIG. 27 is a diagram for explaining the effects of Embodiment 2.

In the present embodiment, the first scanning order instruction signal UD1 is input to the drain terminal of the thin-film transistor M6o and the drain terminal of the thin-film transistor M6e, and the second scanning order instruction signal UD2 is input to the drain terminal of the thin-film transistor M7o and the drain terminal of the thin-film transistor M7e. Using this configuration makes it possible to implement a vertical inversion feature simply by including two thin-film transistors on the input side of the output control node (the portion denoted by the reference character 71 in FIG. 24, for example) in each stage circuit SR and then controlling the levels of the first scanning order instruction signal UD1 and the second scanning order instruction signal UD2. In contrast, as illustrated in FIG. 27, to implement a vertical inversion feature in a conventional configuration, four thin-film transistors would be required on the input side of the output control node in each stage circuit SR. In FIG. 27, the set signal used during forward scanning is denoted by the reference character S(1), the reset signal used during forward scanning is denoted by the reference character R(1), the set signal used during reverse scanning is denoted by the reference character S(2), and the reset signal used during reverse scanning is denoted by the reference character R(2).

As described above, the present embodiment requires fewer thin-film transistors to implement a vertical inversion feature than conventional configurations. Moreover, similar to Embodiment 1, the present embodiment also requires fewer thin-film transistors to control the output control node stabilizers than conventional configurations. This makes it possible to provide a monolithic gate driver that has a vertical inversion feature using fewer elements than in conventional configurations.

<2.5 Modification Examples>
<2.5.1 Modification Example 1>

In Embodiment 2 as described above, the on-duty ratio of the gate clock signals GCK was 4/8. However, the present invention is not limited to this example. Therefore, Modification Example 1 will be described using an example in which the on-duty ratio of the gate clock signals GCK is 3/8.

Figure 28:
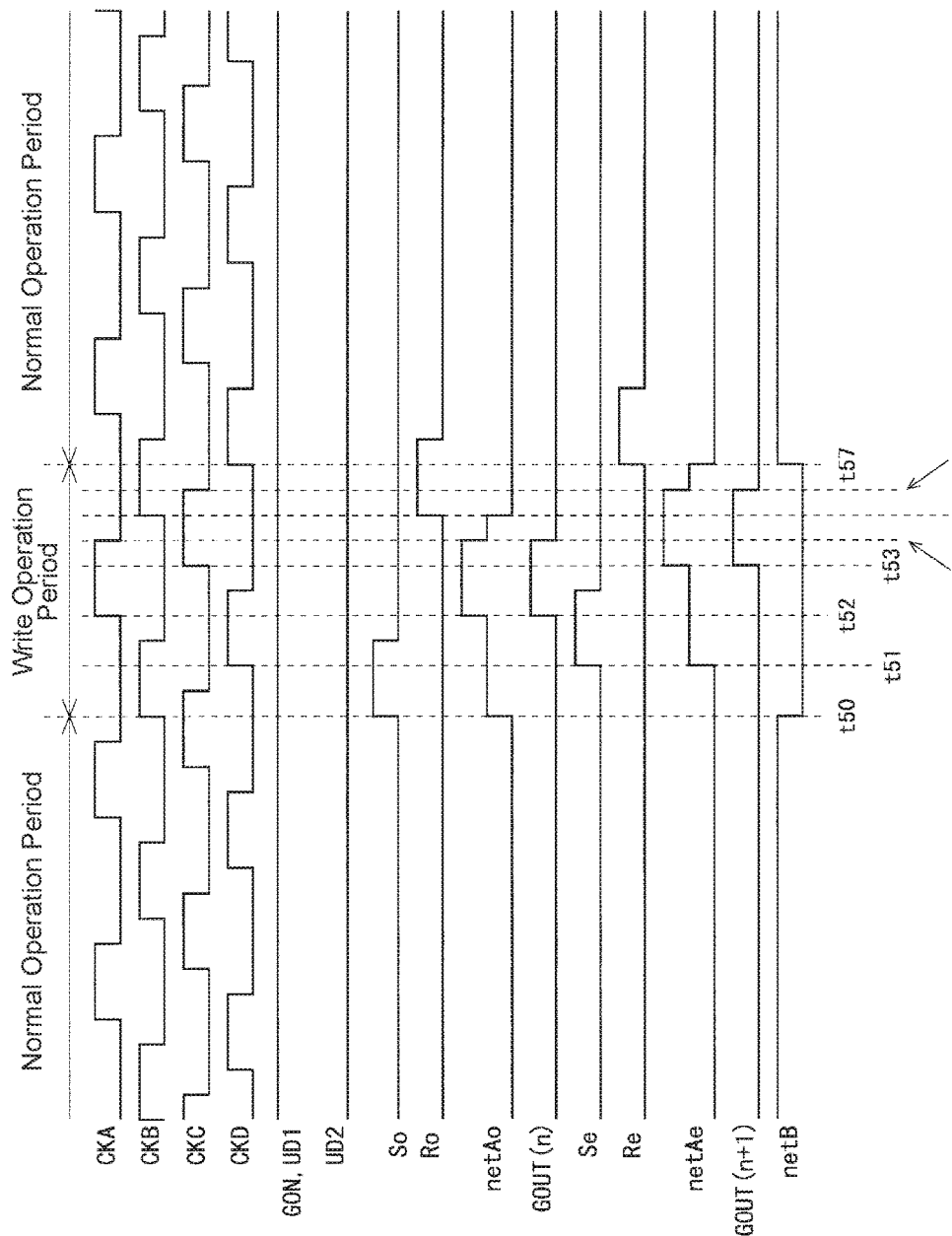
FIG. 28 is a timing chart for explaining a method of driving during forward scanning in Modification Example 1 of Embodiment 2.

FIG. 28 is a timing chart for explaining the method of driving during forward scanning in the present modification example. In FIG. 28, the period from time t50 to time t57 corresponds to the write operation period, and the period prior to time t50 as well as the period after time t57 correspond to normal operation periods.

During forward scanning, the first scanning order instruction signal UD1 is maintained at the high level and the second scanning order instruction signal UD2 is maintained at the low level for the duration of the operating period of the shift register 410. Moreover, similar to in Embodiment 1, during forward scanning, the signal input to the input terminal 42o serves as the set signal So, the signal input to the input terminal 43o serves as the reset signal Ro, the signal input to the input terminal 42e serves as the set signal Se, and the signal input to the input terminal 43e serves as the reset signal Re. In this way, the voltage of the output control node netAo is controlled via the thin-film transistor M6o and the thin-film transistor M7o in a manner similar to in Embodiment 1, and the voltage of the output control node netAe is controlled via the thin-film transistor M6e and the thin-film transistor M7e in a manner similar to in Embodiment 1. Here, however, the on-duty ratio of the gate clock signals GCK is 3/8. Therefore, during forward scanning, the operation is the same as in Modification Example 1 of Embodiment 1.

Figure 29:
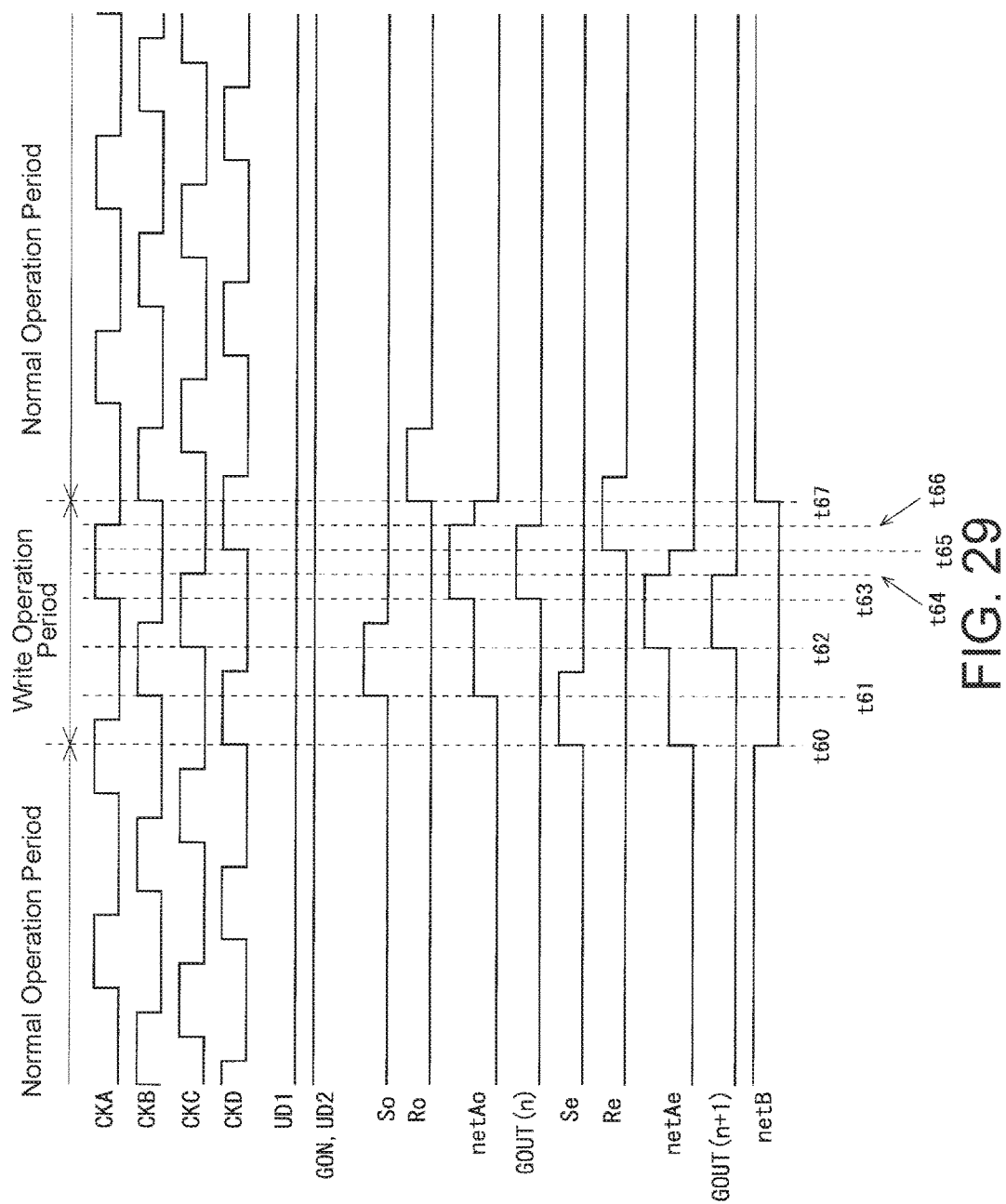
FIG. 29 is a timing chart for explaining a method of driving during reverse scanning in Modification Example 1 of Embodiment 2.

FIG. 29 is a timing chart for explaining the method of driving during reverse scanning in the present modification example. In FIG. 29, the period from time t60 to time t67 corresponds to the write operation period, and the period prior to time t60 as well as the period after time t67 correspond to normal operation periods. Moreover, similar to in Embodiment 2, during reverse scanning, the signal input to the input terminal 42o serves as the reset signal Ro, the signal input to the input terminal 43o serves as the set signal So, the signal input to the input terminal 42e serves as the reset signal Re, and the signal input to the input terminal 43e serves as the set signal Se. Next, the operation during reverse scanning will be described in more detail.

During the period prior to time t60, the voltages of the output control node netAo, the output control node netAe, the scanning signal GOUT(n), and the scanning signal GOUT(n+1) are all maintained at the low level, and the voltage of the stabilization node netB is maintained at the high level.

At time t60, the same operation as at time t40 in Embodiment 2 (see FIG. 26) is performed. In other words, at time t60, the voltage of the output control node netAe increases, and the voltage of the stabilization node netB is set to the low level. At time t61, the same operation as at time t41 in Embodiment 2 is performed. In other words, at time t61, the voltage of the output control node netAo increases, and the voltage of the stabilization node netB is set to the VSS voltage.

At time t62, the same operation as at time t42 in Embodiment 2 is performed. In other words, at time t62, the voltage of the output control node netAe further increases, and the voltage of the scanning signal GOUT(n+1) increases to the level required to select the gate bus line GLn+1 that is connected to the output terminal 49e of the stage circuit SR(n+1) of the (n+1)th stage. At time t63, the same operation as at time t43 in Embodiment 2 is performed. In other words, at time t63, the voltage of the output control node netAo further increases, and the voltage of the scanning signal GOUT(n) increases to the level required to select the gate bus line GLn that is connected to the output terminal 49o of the stage circuit SR(n) of the nth stage.

At time t64, the third gate clock signal CKC switches from the high level to the low level. The resulting decrease in the voltage of the input terminal 41e causes the voltage of the output terminal 49e (that is, the voltage of the scanning signal GOUT(n+1)) to decrease as well. This decrease in the voltage of the output terminal 49e causes the voltage of the output control node netAe to decrease as well due to the connection via the capacitor CAPe.

At time t65, the reset signal Re switches from the low level to the high level. This sets the thin-film transistor M6e to the ON state. As a result, the voltage of the output control node netAe is set to the low level. Moreover, due to the connection via the capacitor CAPe, the voltage of the output terminal 49e (that is, the voltage of the scanning signal GOUT(n+1)) is set to the VSS voltage. Note that although the voltage of the output control node netAe being set to the low level at time t65 sets the thin-film transistor M4e to the OFF state, the voltage of the stabilization node netB remains at the low level because the thin-film transistor M4o is still in the ON state.

At time t66, the first gate clock signal CKA switches from the high level to the low level. The resulting decrease in the voltage of the input terminal 41o causes the voltage of the output terminal 49o (that is, the voltage of the scanning signal GOUT(n)) to decrease as well. This decrease in the voltage of the output terminal 49o causes the voltage of the output control node netAo to decrease as well due to the connection via the capacitor CAPo.

At time t67, the reset signal Ro switches from the low level to the high level. This sets the thin-film transistor M6o to the ON state. As a result, the voltage of the output control node netAo is set to the low level. Moreover, due to the connection via the capacitor CAPo, the voltage of the output terminal 49o (that is, the voltage of the scanning signal GOUT(n)) is set to the VSS voltage.

Furthermore, when the voltage of the output control node netAo is set to the low level at time t67, the thin-film transistor M4o is set to the OFF state. Here, the thin-film transistor M4e has already been set to the OFF state at time t65. Moreover, while the shift register 410 is operating, the stabilization control signal GON is maintained at the high level, and therefore the thin-film transistor M5 remains in the ON state. As a result, at time t67 the voltage of the stabilization node netB changes from the low level to the high level. Therefore, similar to at time t45 in Embodiment 2, the voltage of the output control node netAo, the voltage of the scanning signal GOUT(n), the voltage of the output control node netAe, and the voltage of the scanning signal GOUT(n+1) are all set to the VSS voltage.

As the stage circuit groups SRG each execute the process described above, the gate bus lines are sequentially selected in the "ith row, (i−1)th row, . . . , second row, first row" order, and the pixel capacitors are written row by row.

Similar to Modification Example 1 of Embodiment 1, the present modification example makes it unnecessary to allocate an offset period. This makes it possible to prevent a large amount of noise from occurring in the scanning signals and also makes it possible to provide a monolithic gate driver that has a vertical inversion feature using fewer elements than in a conventional configuration.

<2.5.2 Modification Example 2>

In Embodiment 2 as described above, the stabilization control signal GON was used as the signal for maintaining the voltage of the stabilization node netB at the high level during the normal operation periods. However, the present invention is not limited to this example. The first scanning order instruction signal UD1 and the second scanning order instruction signal UD2 may also be used as the signal for maintaining the voltage of the stabilization node netB, as in the present modification example.

Figure 30:
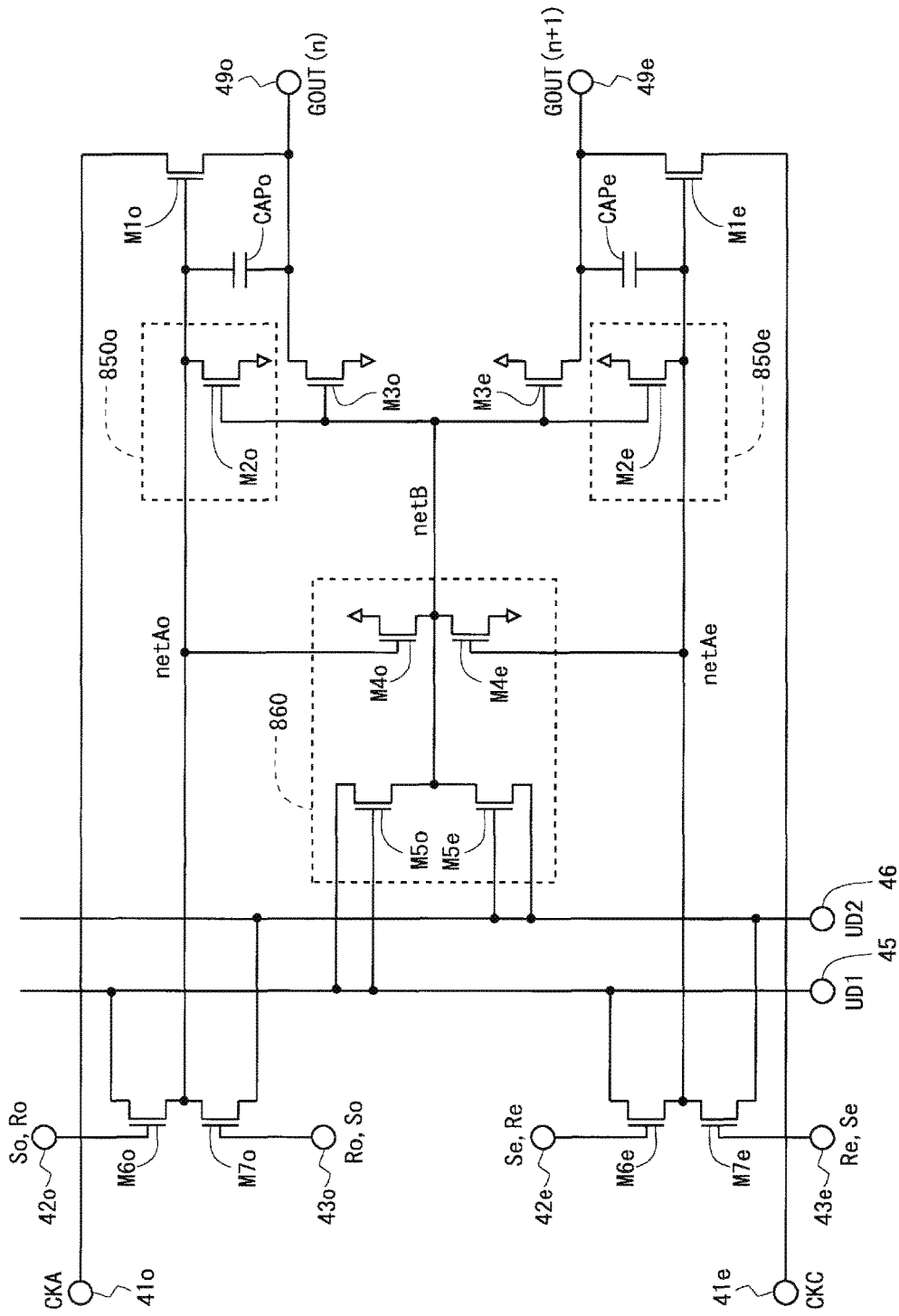
FIG. 30 is a circuit diagram illustrating a configuration of a stage circuit group (the stage circuits for two stages) in Modification Example 2 of Embodiment 2.

FIG. 30 is a circuit diagram illustrating a configuration of a stage circuit group SRG (the stage circuits SR for two stages) in the present modification example. In the present modification example, the stage circuit group SRG includes a thin-film transistor M5o and a thin-film transistor M5e instead of the thin-film transistor M5 of Embodiment 2 (see FIG. 24). In the thin-film transistor M5o, the gate terminal and the drain terminal are both connected (that is, are diode-connected) to the input terminal 45 for the first scanning order instruction signal UD1, and the source terminal is connected to the stabilization node netB. In the thin-film transistor M5e, the gate terminal and the drain terminal are both connected (that is, are diode-connected) to the input terminal 46 for the second scanning order instruction signal UD2, and the source terminal is connected to the stabilization node netB.

Moreover, in the present embodiment, the thin-film transistor M5o forms a first stabilization node ON-switching element, and the thin-film transistor M5e forms a second stabilization node ON-switching element.

Here, when the first scanning order instruction signal UD1 is at the high level and the second scanning order instruction signal UD2 is at the low level, the high-level voltage is applied to the gate terminal and the drain terminal of the thin-film transistor M5o, and the low-level voltage is applied to the gate terminal and the drain terminal of the thin-film transistor M5e. Therefore, the thin-film transistor M5o functions in the same manner as the thin-film transistor M5 of Embodiment 2. Meanwhile, when the first scanning order instruction signal UD1 is at the low level and the second scanning order instruction signal UD2 is at the high level, the low-level voltage is applied to the gate terminal and the drain terminal of the thin-film transistor M5o, and the high-level voltage is applied to the gate terminal and the drain terminal of the thin-film transistor M5e. Therefore, the thin-film transistor M5e functions in the same manner as the thin-film transistor M5 of Embodiment 2.

In this way, during forward scanning, maintaining the first scanning order instruction signal UD1 at the high level and the second scanning order instruction signal UD2 at the low level allows the thin-film transistor M5o to function in the same manner as the thin-film transistor M5 of Embodiment 2. Similarly, during reverse scanning, maintaining the first scanning order instruction signal UD1 at the low level and the second scanning order instruction signal UD2 at the high level allows the thin-film transistor M5e to function in the same manner as the thin-film transistor M5 of Embodiment 2. This makes it possible to operate the shift register 410 in the same manner as in Embodiment 2 but without using the stabilization control signal GON.

Similar to Embodiment 2, the present modification example also makes it possible to provide a monolithic gate driver that has a vertical inversion feature using fewer elements than in conventional configurations.

<2.5.3 Modification Example 3>

In Embodiment 2 as described above, a four-phase clock signal was used for the gate clock signals GCK. However, the present invention is not limited to this example. A clock signal with a number of phases other than four, such as a six-phase clock signal or an eight-phase clock signal, for example, may also be used for the gate clock signals GCK.

Similar to in Modification Example 2 of Embodiment 1, for example, using an eight-phase clock signal for the gate clock signals GCK makes it possible for the stabilization control node netB and the stabilization node controller 860 illustrated in FIG. 11 to be shared by four stage circuits SR. This makes it possible to provide a monolithic gate driver that has a vertical inversion feature using significantly fewer elements than in a conventional configuration.

<3. Embodiment 3>

Next, Embodiment 3 of the present invention will be described. Similar to in Embodiment 2 as described above, in the present embodiment a gate driver 400 is a monolithic gate drivers that has a vertical inversion feature. Unlike Embodiment 2, however, the present embodiment utilizes a configuration in which the first scanning order instruction signal UD1 and the second scanning order instruction signal UD2 are not used.

<3.1 Configuration of Gate Driver>

Figure 31:
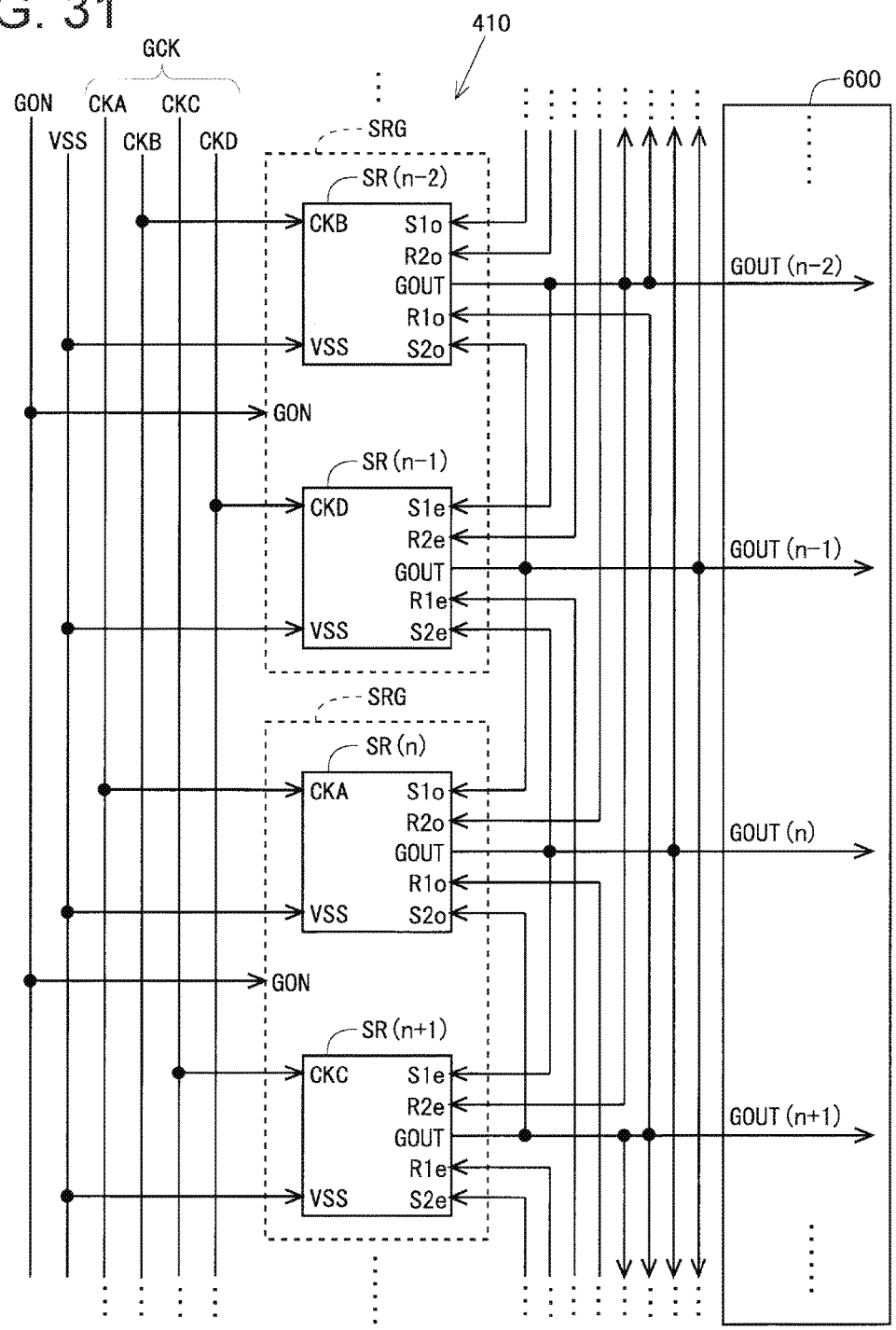
FIG. 31 is a block diagram illustrating a configuration of a shift register in a gate driver in Embodiment 3 of the present invention.

FIG. 31 is a block diagram illustrating a configuration of a shift register 410 in the gate driver 400 in Embodiment 3 of the present invention. Similar to in Embodiment 1, in the present embodiment, two adjacent stage circuits SR are treated as one stage circuit group SRG. The stage circuit SR of each odd-numbered stage includes an input terminal for receiving one of the gate clock signals GCK, an input terminal for receiving a low-level DC supply voltage VSS, an input terminal for receiving a set signal S1o, an input terminal for receiving a reset signal R1o, an input terminal for receiving a set signal S2o, an input terminal for receiving a reset signal R2o, and an output terminal for outputting a scanning signal GOUT. The stage circuit SR of each even-numbered stage similarly includes an input terminal for receiving one of the gate clock signals GCK, an input terminal for receiving a low-level DC supply voltage VSS, an input terminal for receiving a set signal S1e, an input terminal for receiving a reset signal R1e, an input terminal for receiving a set signal S2e, an input terminal for receiving a reset signal R2e, and an output terminal for outputting a scanning signal GOUT. Here, the set signal S1o and the set signal S1e are set signals for forward scanning, and the set signal S2o and the set signal S2e are set signals for reverse scanning. Similarly, the reset signal R1o and the reset signal R1e are reset signals for forward scanning, and the reset signal R2o and the reset signal R2e are reset signals for reverse scanning.

As illustrated in FIG. 31, the following signals are input to the input terminals of each stage (each stage circuit SR) of the shift register 410. The gate clock signals GCK, the low-level DC supply voltage VSS, and a stabilization control signal GON are input to the same input terminals as in Embodiment 1. In the odd-numbered stages, the scanning signal output from the previous stage is input as the set signal S1o, the scanning signal output from the next stage is input as the set signal S2o, the scanning signal output from the stage three stages downstream is input as the reset signal R1o, and the scanning signal output from the stage three stages upstream is input as the reset signal R2o. In the even-numbered stages, the scanning signal output from the previous stage is input as the set signal S1e, the scanning signal output from the next stage is input as the set signal S2e, the scanning signal output from the stage three stages downstream is input as the reset signal R1e, and the scanning signal output from the stage three stages upstream is input as the reset signal R2e.

<3.2 Configuration of Stage Circuit Group>

Figure 32:
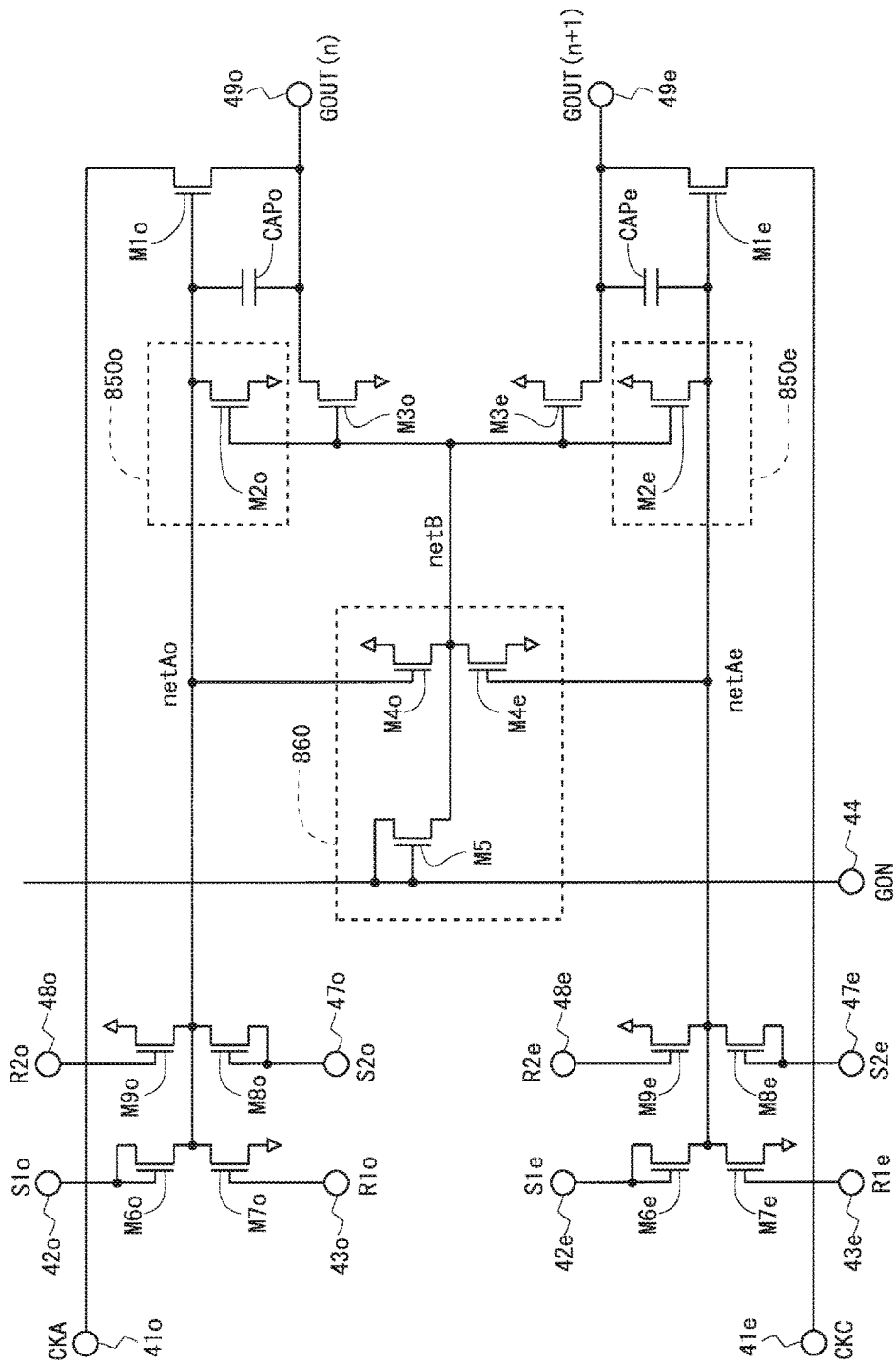
FIG. 32 is a circuit diagram illustrating a configuration of a stage circuit group (the stage circuits for two stages) in Embodiment 3.

FIG. 32 is a circuit diagram illustrating a configuration of one of the stage circuit groups SRG (the stage circuits SR for two stages) in the present embodiment. In the present embodiment, the stage circuit group SRG includes four thin-film transistors (M8o, M8e, M9o, and M9e) and four input terminals (47o, 47e, 48o, and 48e) in addition to the components included in Embodiment 1 (see FIG. 1). In FIG. 32, the input terminal that receives the set signal S1o is denoted by the reference character 42o, the input terminal that receives the set signal S1e is denoted by the reference character 42e, the input terminal that receives the reset signal R1o is denoted by the reference character 43o, the input terminal that receives the reset signal R1e is denoted by the reference character 43e, the input terminal that receives the set signal S2o is denoted by the reference character 47o, the input terminal that receives the set signal S2e is denoted by the reference character 47e, the input terminal that receives the reset signal R2o is denoted by the reference character 48o, and the input terminal that receives the reset signal R2e is denoted by the reference character 48e.

In the thin-film transistor M8o, the gate terminal and the drain terminal are both connected to the input terminal 47o (that is, are diode-connected), and the source terminal is connected to an output control node netAo. In the thin-film transistor M9o, the gate terminal is connected to the input terminal 48o, the drain terminal is connected to the output control node netAo, and the source terminal is connected to the input terminal for the DC supply voltage VSS. A thin-film transistor M8e and a thin-film transistor M9e are respectively configured in the same manner as the thin-film transistor M8o and the thin-film transistor M9o. Other than in the respects described above, the configuration of the present embodiment is the same as Embodiment 1. The stage circuit group SRG illustrated in FIG. 32 includes the stage circuit SR(n) of the nth stage and the stage circuit SR(n+1) of the (n+1)th stage.

In the present embodiment, the thin-film transistors M6o and M6e form a forward scanning ON-switching element, the thin-film transistors M7o and M7e form a forward scanning OFF-switching element, the thin-film transistors M8o and M8e form a reverse scanning ON-switching element, and the thin-film transistors M9o and M9e form a reverse scanning OFF-switching element.

<3.3 Method of Driving>

Figure 33:
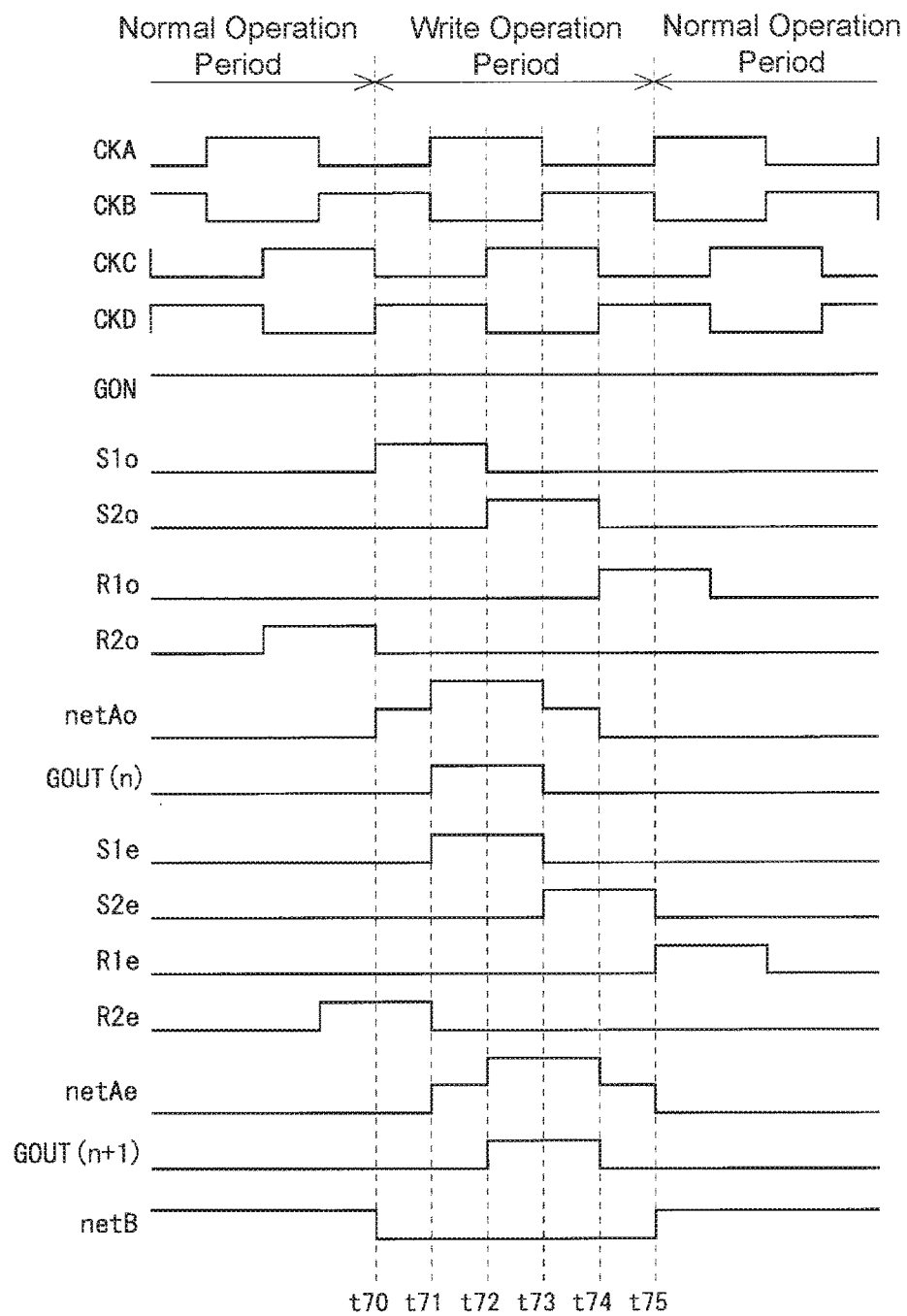
FIG. 33 is a timing chart for explaining a method of driving during forward scanning in Embodiment 3.
Figure 34:
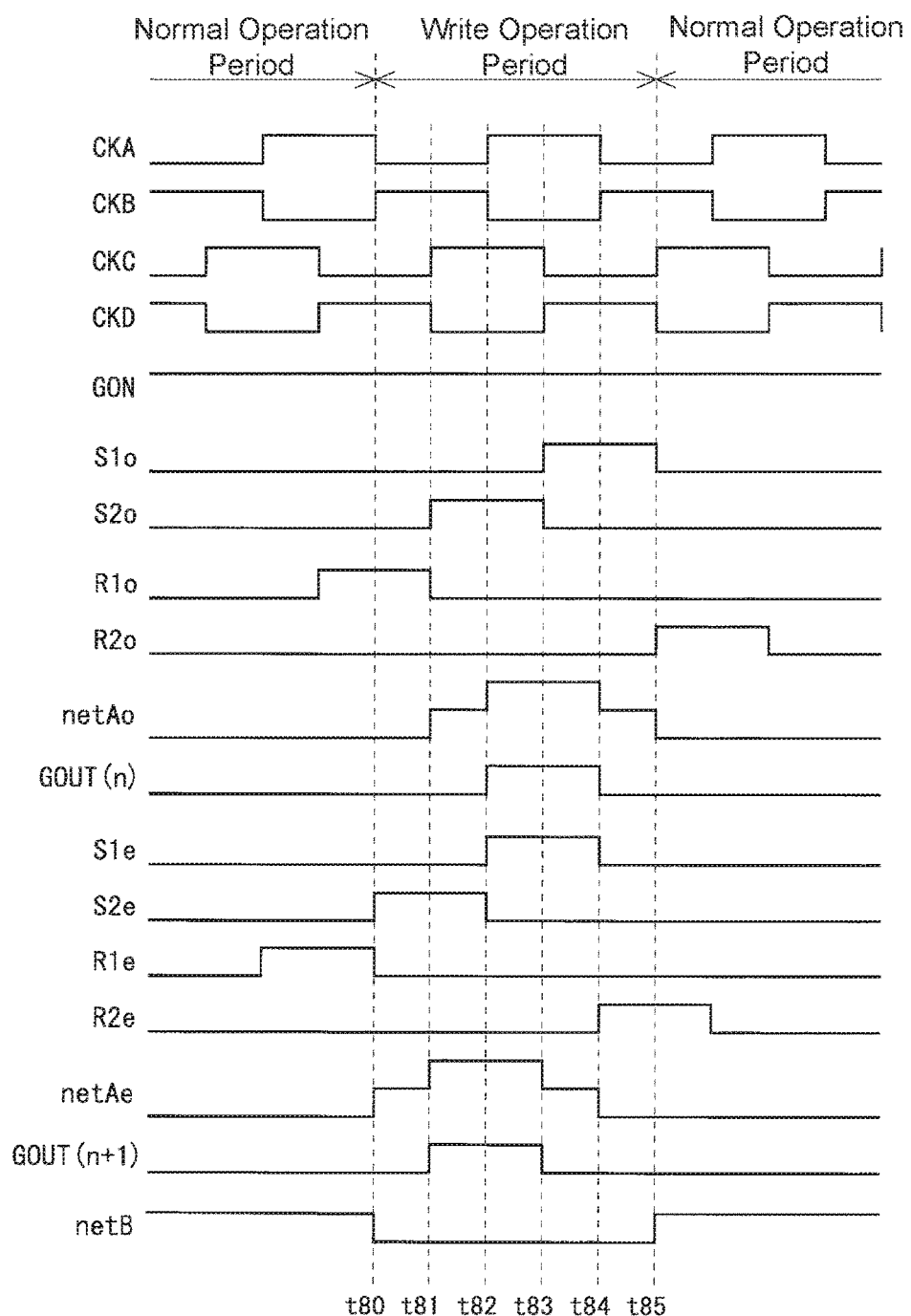
FIG. 34 is a timing chart for explaining a method of driving during reverse scanning in Embodiment 3.

Next, a method of driving of the present embodiment will be described with reference to FIGS. 32, 33, and 34.

<3.3.1 Forward Scanning>

First, the operation during forward scanning will be described. FIG. 33 is a timing chart for explaining the method of driving during forward scanning. In FIG. 33, the period from time t70 to time t75 corresponds to the write operation period, and the period prior to time t70 as well as the period after time t75 correspond to normal operation periods.

During the period prior to time t70, the voltages of the output control node netAo, the output control node netAe, the scanning signal GOUT(n), and the scanning signal GOUT(n+1) are all maintained at the low level, and the voltage of the stabilization node netB is maintained at the high level.

At time t70, the set signal S1o switches from the low level to the high level. As illustrated in FIG. 32, the gate and drain terminals of the thin-film transistor M6o are diode-connected, and therefore this pulse in the set signal S1o sets the thin-film transistor M6o to the ON state. Setting the thin-film transistor M6o to the ON state increases the voltage of the output control node netAo. As a result, the thin-film transistor M1o and the thin-film transistor M4o are both set to the ON state as well. Setting the thin-film transistor M4o to the ON state sets the voltage of the stabilization node netB to the low level. Here, during the period from time t70 to t74, the reset signal R1o, the reset signal R2o, and the voltage of the stabilization node netB all remain at the low level. As a result, the thin-film transistor M7o, the thin-film transistor M9o, and the thin-film transistor M2o all remain in the OFF state for this entire period. Therefore, the voltage of the output control node netAo never decreases to the low level during this period of time.

At time t71, the set signal S1e switches from the low level to the high level. As illustrated in FIG. 32, the gate and drain terminals of the thin-film transistor M6e are diode-connected, and therefore this pulse in the set signal S1e sets the thin-film transistor M6e to the ON state. Setting the thin-film transistor M6e to the ON state increases the voltage of the output control node netAe. As a result, the thin-film transistor M1e and the thin-film transistor M4e are both set to the ON state as well. Setting the thin-film transistor M4e to the ON state sets the voltage of the stabilization node netB to the VSS voltage. Here, during the period from time t71 to t75, the reset signal R1e, the reset signal R2e, and the voltage of the stabilization node netB remain at the low level. As a result, the thin-film transistor M7e, the thin-film transistor M9e, and the thin-film transistor M2e all remain in the OFF state for this entire period. Therefore, the voltage of the output control node netAe never decreases to the low level during this period of time.

At time t71, the first gate clock signal CKA switches from the low level to the high level. Because the thin-film transistor M1o is in the ON state at this time, as the voltage of the input terminal 41o increases, the voltage of the output terminal 49o also increases. Here, as illustrated in FIG. 32, the capacitor CAPo is connected between the output control node netAo and the output terminal 49o, and therefore the increase in the voltage of the output terminal 49o causes an increase in the voltage of the output control node netAo as well (the output control node netAo is bootstrapped). As a result, a large voltage is applied to the gate terminal of the thin-film transistor M1o, and the voltage of the scanning signal GOUT(n) increases to the level required to select the gate bus line GLn that is connected to the output terminal 49o of the stage circuit SR(n) of the nth stage. Here, during the period from time t71 to t73, the voltage of the stabilization node netB is at the low level, and therefore the thin-film transistor M3o remains in the OFF state. As a result, the voltage of the scanning signal GOUT(n) never decreases during this period of time.

At time t72, the third gate clock signal CKC switches from the low level to the high level. Because the thin-film transistor M1e is in the ON state at this time, as the voltage of the input terminal 41e increases, the voltage of the output terminal 49e also increases. Here, as illustrated in FIG. 32, the capacitor CAPe is connected between the output control node netAe and the output terminal 49e, and therefore the increase in the voltage of the output terminal 49e causes an increase in the voltage of the output control node netAe as well (the output control node netAe is bootstrapped). As a result, a large voltage is applied to the gate terminal of the thin-film transistor M1e, and the voltage of the scanning signal GOUT(n+1) increases to the level required to select the gate bus line GLn+1 that is connected to the output terminal 49e of the stage circuit SR(n+1) of the (n+1)th stage. Here, during the period from time t72 to t74, the voltage of the stabilization node netB is at the low level, and therefore the thin-film transistor M3e remains in the OFF state. Therefore, the voltage of the output control node netAe never decreases during this period of time.

At time t73, the first gate clock signal CKA switches from the high level to the low level. The resulting decrease in the voltage of the input terminal 41o causes the voltage of the output terminal 49o (that is, the voltage of the scanning signal GOUT(n)) to decrease as well. This decrease in the voltage of the output terminal 49o causes the voltage of the output control node netAo to decrease as well due to the connection via the capacitor CAPo.

At time t74, the reset signal R1o switches from the low level to the high level. This sets the thin-film transistor M7o to the ON state. As a result, the voltage of the output control node netAo is set to the low level. Moreover, due to the connection via the capacitor CAPo, the voltage of the output terminal 49o (that is, the voltage of the scanning signal GOUT(n)) is set to the VSS voltage. Note that although the voltage of the output control node netAo being set to the low level at time t74 sets the thin-film transistor M4o to the OFF state, the voltage of the stabilization node netB remains at the low level because the thin-film transistor M4e is still in the ON state.

Moreover, at time t74, the third gate clock signal CKC switches from the high level to the low level. The resulting decrease in the voltage of the input terminal 41e causes the voltage of the output terminal 49e (that is, the voltage of the scanning signal GOUT(n+1)) to decrease as well. This decrease in the voltage of the output terminal 49e causes the voltage of the output control node netAe to decrease as well due to the connection via the capacitor CAPe.

At time t75, the reset signal R1e switches from the low level to the high level. This sets the thin-film transistor M7e to the ON state. As a result, the voltage of the output control node netAe is set to the low level. Moreover, due to the connection via the capacitor CAPe, the voltage of the output terminal 49e (that is, the voltage of the scanning signal GOUT(n+1)) is set to the VSS voltage.

Furthermore, when the voltage of the output control node netAe is set to the low level at time t75, the thin-film transistor M4e is set to the OFF state. Here, the thin-film transistor M4o has already been set to the OFF state at time t74. Moreover, while the shift register 410 is operating, the stabilization control signal GON is maintained at the high level, and therefore the thin-film transistor M5 remains in the ON state. As a result, at time t75 the voltage of the stabilization node netB changes from the low level to the high level. This sets the thin-film transistor M2o, the thin-film transistor M3o, the thin-film transistor M2e, and the thin-film transistor M3e all to the ON state. Setting the thin-film transistor M2o to the ON state sets the voltage of the output control node netAo to the VSS voltage, and setting the thin-film transistor M3o to the ON state sets the voltage of the scanning signal GOUT(n) to the VSS voltage. Similarly, setting the thin-film transistor M2e to the ON state sets the voltage of the output control node netAe to the VSS voltage, and setting the thin-film transistor M3e to the ON state sets the voltage of the scanning signal GOUT(n+1) to the VSS voltage.

As the stage circuit groups SRG each execute the process described above, the gate bus lines are sequentially selected in the "first row, second row, . . . , (i−1)th row, ith row" order, and the pixel capacitors are written row by row. Moreover, similar to in Embodiment 1, the voltage of the output control node netAo and the voltage of the output control node netAe are prevented from floating during the normal operation periods.

<3.3.2 Reverse Scanning>

Next, the operation during reverse scanning will be described. FIG. 34 is a timing chart for explaining the method of driving during reverse scanning. In FIG. 34, the period from time t80 to time t85 corresponds to the write operation period, and the period prior to time t80 as well as the period after time t85 correspond to normal operation periods.

During the period prior to time t80, the voltages of the output control node netAo, the output control node netAe, the scanning signal GOUT(n), and the scanning signal GOUT(n+1) are all maintained at the low level, and the voltage of the stabilization node netB is maintained at the high level.

At time t80, the set signal S2e switches from the low level to the high level. As illustrated in FIG. 32, the gate and drain terminals of the thin-film transistor M8e are diode-connected, and therefore this pulse in the set signal S2e sets the thin-film transistor M8e to the ON state. Setting the thin-film transistor M8e to the ON state increases the voltage of the output control node netAe. As a result, the thin-film transistor M1e and the thin-film transistor M4e are both set to the ON state as well. Setting the thin-film transistor M4e to the ON state sets the voltage of the stabilization node netB to the low level. Here, during the period from time t80 to t84, the reset signal R1e, the reset signal R2e, and the voltage of the stabilization node netB all remain at the low level. As a result, the thin-film transistor M7e, the thin-film transistor M9e, and the thin-film transistor M2e all remain in the OFF state for this entire period. Therefore, the voltage of the output control node netAe never decreases to the low level during this period of time.

At time t81, the set signal S2o switches from the low level to the high level. As illustrated in FIG. 32, the gate and drain terminals of the thin-film transistor M8o are diode-connected, and therefore this pulse in the set signal S2o sets the thin-film transistor M8o to the ON state. Setting the thin-film transistor M8o to the ON state increases the voltage of the output control node netAo. As a result, the thin-film transistor M1o and the thin-film transistor M4o are both set to the ON state as well. Setting the thin-film transistor M4o to the ON state sets the voltage of the stabilization node netB to the VSS voltage. Here, during the period from time t81 to t85, the reset signal R1o, the reset signal R2o, and the voltage of the stabilization node netB remain at the low level. As a result, the thin-film transistor M7o, the thin-film transistor M9o, and the thin-film transistor M2o all remain in the OFF state for this entire period. Therefore, the voltage of the output control node netAo never decreases to the low level during this period of time.

At time t81, the third gate clock signal CKC switches from the low level to the high level. Because the thin-film transistor M1e is in the ON state at this time, as the voltage of the input terminal 41e increases, the voltage of the output terminal 49e also increases. Here, as illustrated in FIG. 32, the capacitor CAPe is connected between the output control node netAe and the output terminal 49e, and therefore the increase in the voltage of the output terminal 49e causes an increase in the voltage of the output control node netAe as well (the output control node netAe is bootstrapped). As a result, a large voltage is applied to the gate terminal of the thin-film transistor M1e, and the voltage of the scanning signal GOUT(n+1) increases to the level required to select the gate bus line GLn+1 that is connected to the output terminal 49e of the stage circuit SR(n+1) of the (n+1)th stage. Here, during the period from time t81 to t83, the voltage of the stabilization node netB is at the low level, and therefore the thin-film transistor M3e remains in the OFF state. As a result, the voltage of the scanning signal GOUT(n+1) never decreases during this period of time.

At time t82, the first gate clock signal CKA switches from the low level to the high level. Because the thin-film transistor M1o is in the ON state at this time, as the voltage of the input terminal 41o increases, the voltage of the output terminal 49o also increases. Here, as illustrated in FIG. 32, the capacitor CAPo is connected between the output control node netAo and the output terminal 49o, and therefore the increase in the voltage of the output terminal 49o causes an increase in the voltage of the output control node netAo as well (the output control node netAo is bootstrapped). As a result, a large voltage is applied to the gate terminal of the thin-film transistor M1o, and the voltage of the scanning signal GOUT(n) increases to the level required to select the gate bus line GLn that is connected to the output terminal 49o of the stage circuit SR(n) of the nth stage. Here, during the period from time t82 to t84, the voltage of the stabilization node netB is at the low level, and therefore the thin-film transistor M3o remains in the OFF state. Therefore, the voltage of the output control node netAo never decreases during this period of time.

At time t83, the third gate clock signal CKC switches from the high level to the low level. The resulting decrease in the voltage of the input terminal 41e causes the voltage of the output terminal 49e (that is, the voltage of the scanning signal GOUT(n+1)) to decrease as well. This decrease in the voltage of the output terminal 49e causes the voltage of the output control node netAe to decrease as well due to the connection via the capacitor CAPe.

At time t84, the reset signal R2e switches from the low level to the high level. This sets the thin-film transistor M9e to the ON state. As a result, the voltage of the output control node netAe is set to the low level. Moreover, due to the connection via the capacitor CAPe, the voltage of the output terminal 49e (that is, the voltage of the scanning signal GOUT(n+1)) is set to the VSS voltage. Note that although the voltage of the output control node netAe being set to the low level at time t84 sets the thin-film transistor M4e to the OFF state, the voltage of the stabilization node netB remains at the low level because the thin-film transistor M4o is still in the ON state.

Moreover, at time t84, the first gate clock signal CKA switches from the high level to the low level. The resulting decrease in the voltage of the input terminal 41o causes the voltage of the output terminal 49o (that is, the voltage of the scanning signal GOUT(n)) to decrease as well. This decrease in the voltage of the output terminal 49o causes the voltage of the output control node netAo to decrease as well due to the connection via the capacitor CAPo.

At time t85, the reset signal R2o switches from the low level to the high level. This sets the thin-film transistor M9o to the ON state. As a result, the voltage of the output control node netAo is set to the low level. Moreover, due to the connection via the capacitor CAPo, the voltage of the output terminal 49o (that is, the voltage of the scanning signal GOUT(n)) is set to the VSS voltage.

Furthermore, when the voltage of the output control node netAo is set to the low level at time t85, the thin-film transistor M4o is set to the OFF state. Here, the thin-film transistor M4e has already been set to the OFF state at time t84. Moreover, while the shift register 410 is operating, the stabilization control signal GON is maintained at the high level, and therefore the thin-film transistor M5 remains in the ON state. As a result, at time t85 the voltage of the stabilization node netB changes from the low level to the high level. This sets the thin-film transistor M2o, the thin-film transistor M3o, the thin-film transistor M2e, and the thin-film transistor M3e all to the ON state. Setting the thin-film transistor M2o to the ON state sets the voltage of the output control node netAo to the VSS voltage, and setting the thin-film transistor M3o to the ON state sets the voltage of the scanning signal GOUT(n) to the VSS voltage. Similarly, setting the thin-film transistor M2e to the ON state sets the voltage of the output control node netAe to the VSS voltage, and setting the thin-film transistor M3e to the ON state sets the voltage of the scanning signal GOUT(n+1) to the VSS voltage.

As the stage circuit groups SRG each execute the process described above, the gate bus lines are sequentially selected in the "ith row, (i−1)th row, . . . , second row, first row" order, and the pixel capacitors are written row by row. Moreover, similar to in Embodiment 1, the voltage of the output control node netAo and the voltage of the output control node netAe are prevented from floating during the normal operation periods.

<3.4 Effects>

Similar to Embodiment 1, the present embodiment requires fewer thin-film transistors to control the output control node stabilizers than conventional configurations. The present embodiment also makes it possible to switch the order in which the gate bus lines are scanned. This makes it possible to provide a monolithic gate driver that has a vertical inversion feature using fewer elements than in conventional configurations.

<3.5 Modification Example>

In Embodiment 3, a four-phase clock signal was used for the gate clock signals GCK. However, the present invention is not limited to this example. A clock signal with a number of phases other than four, such as a six-phase clock signal or an eight-phase clock signal, for example, may also be used for the gate clock signals GCK. Therefore, a modification example of Embodiment 3 will be described using an example in which an eight-phase clock signal is used for the gate clock signals GCK.

Figure 35:
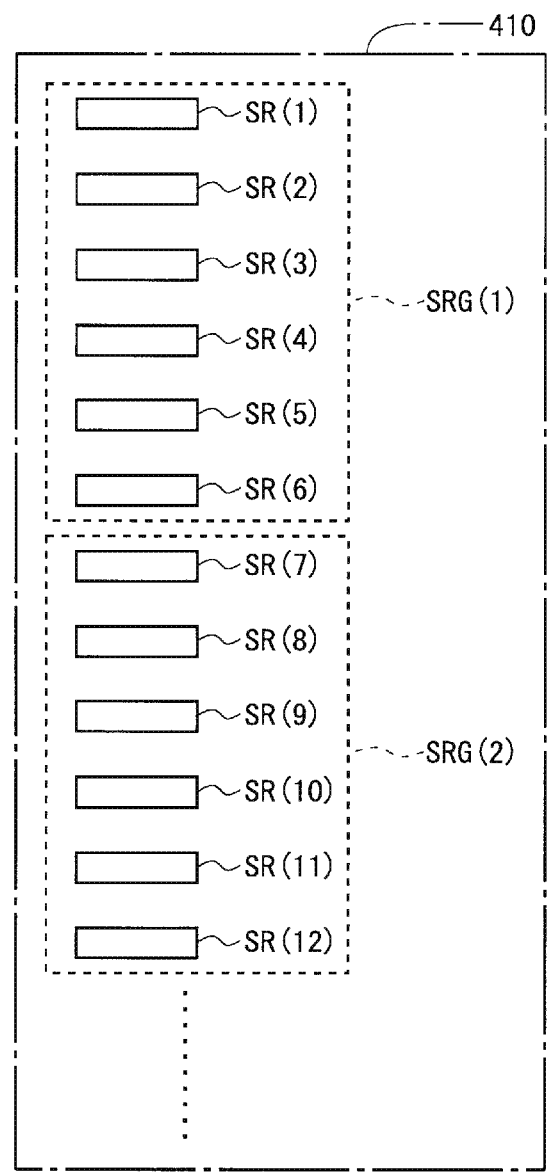
FIG. 35 is a diagram for explaining stage circuit groups in a modification example of Embodiment 3.

FIG. 35 is a diagram for explaining a stage circuit group SRG of the present modification example. As illustrated in FIG. 35, in the present modification example, six adjacent stage circuits SR are treated as one stage circuit group SRG. In other words, the stabilization control node netB and the stabilization node controller 860 illustrated in FIG. 11 are shared by six stage circuits SR.

Figure 36:
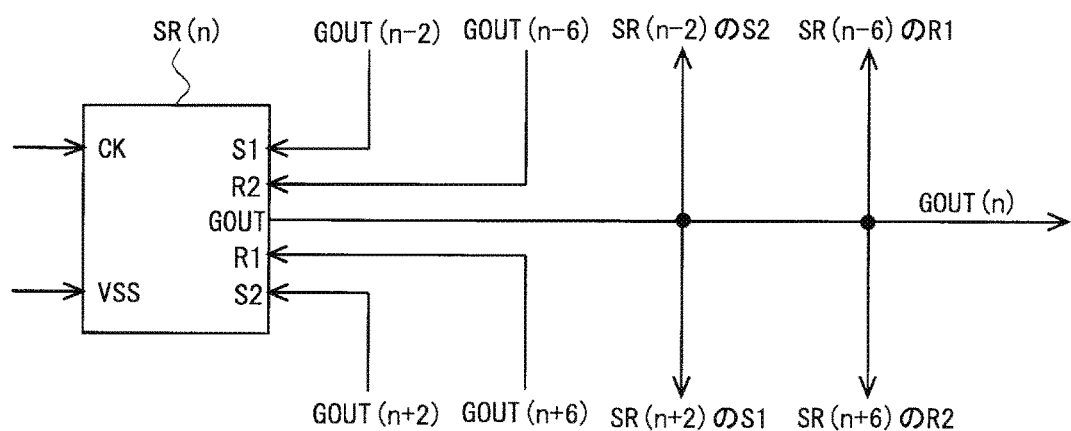
FIG. 36 is a diagram for explaining input and output signals in a stage circuit in the modification example of Embodiment 3.

As illustrated in FIG. 36, in a given stage (here, the nth stage), the scanning signal GOUT(n−2) output from the stage circuit SR(n−2) of the (n−2)th stage is input as a forward scanning set signal S1, the scanning signal GOUT(n+6) output from the stage circuit SR(n+6) of the (n+6)th stage is input as a forward scanning reset signal R1, the scanning signal GOUT(n+2) output from the stage circuit SR(n+2) of the (n+2)th stage is input as a reverse scanning set signal S2, and the scanning signal GOUT(n−6) output from the stage circuit SR(n−6) of the (n−6)th stage is input as a reverse scanning reset signal R2. Moreover, the scanning signal GOUT(n) output from a given stage is applied to the gate bus line GLn of the nth row, input to the stage circuit SR(n+1) of the (n+1)th stage as a set signal S1, input to the stage circuit SR(n−6) of the (n−6)th stage as a reset signal R1, input to the stage circuit SR(n−2) of the (n−2)th stage as a set signal S2, and input to the stage circuit SR(n+6) of the (n+6)th stage as a reset signal R2.

Figure 37:
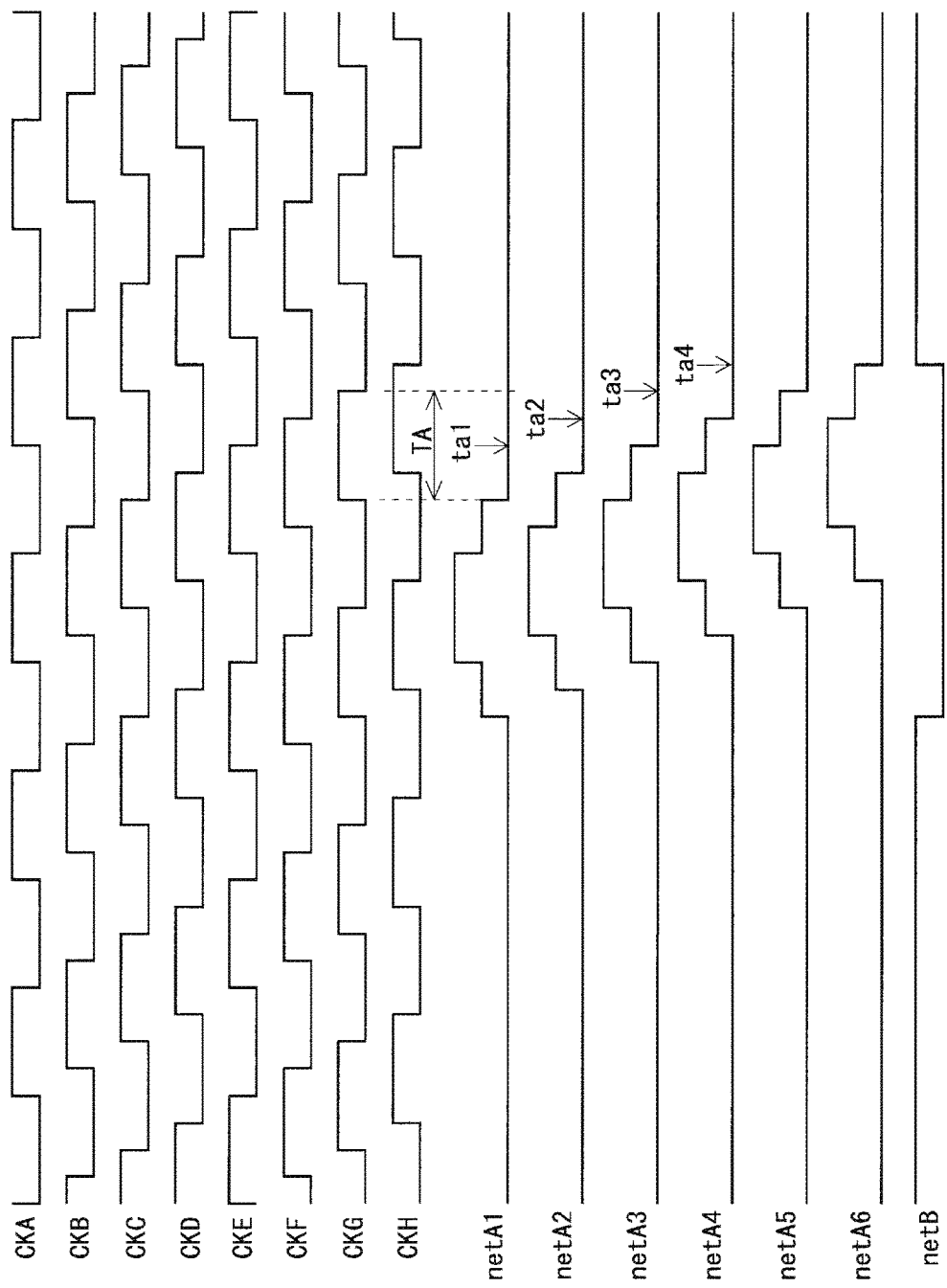
FIG. 37 is a timing chart for explaining the operation of a shift register in the modification example of Embodiment 3.
Figure 38:
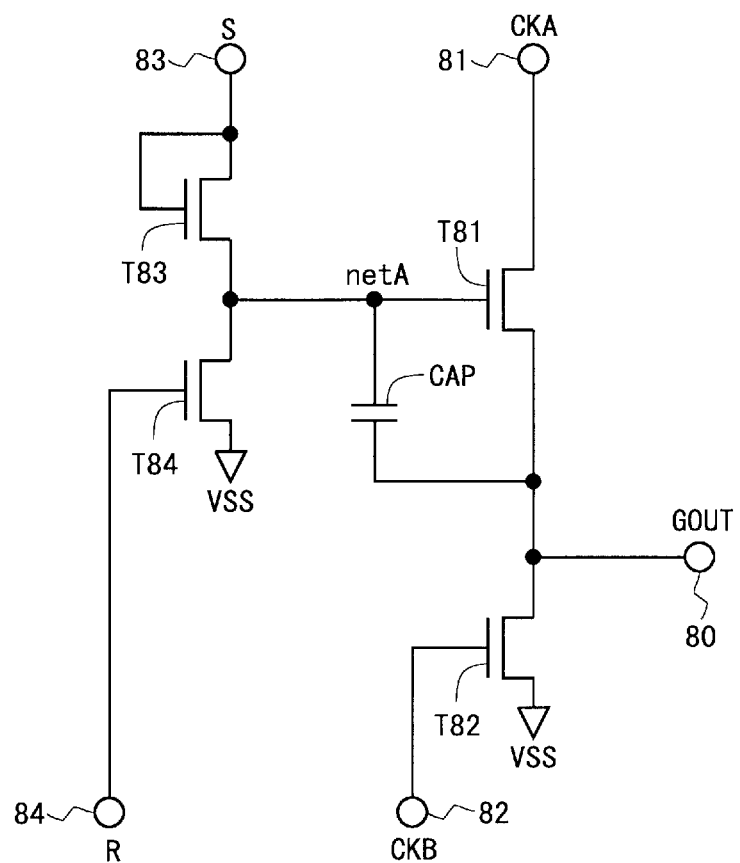
FIG. 38 is a circuit diagram of the most basic conventional configuration of a stage circuit.
Figure 39:
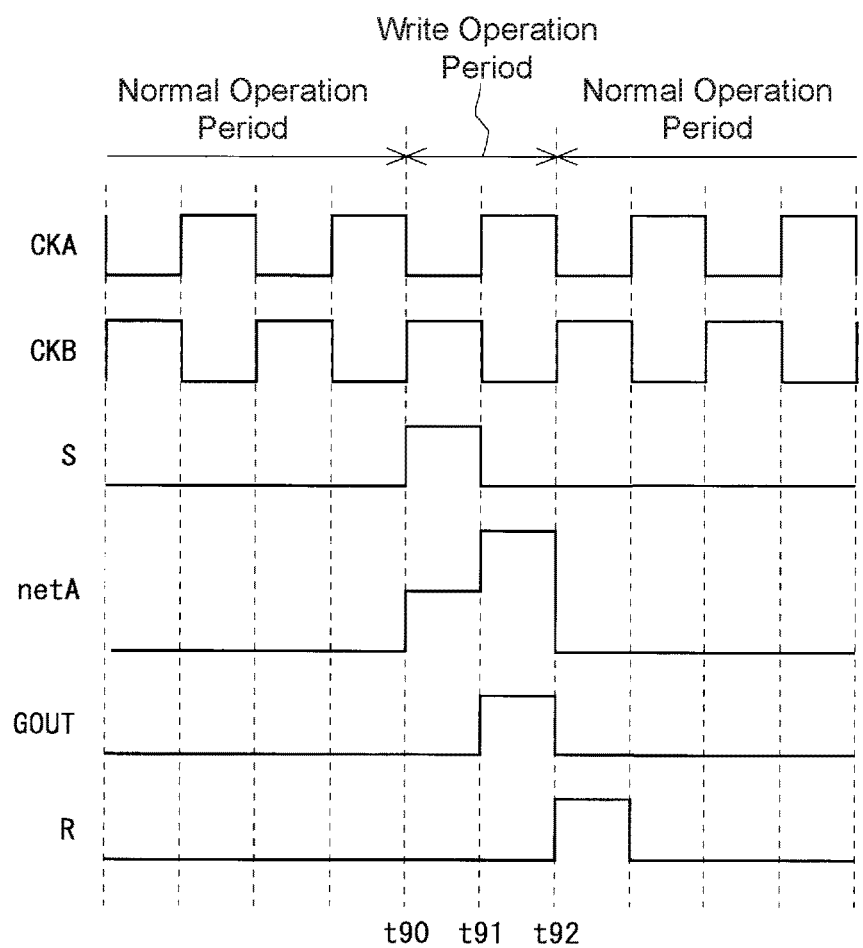
FIG. 39 is a timing chart for explaining the operation of the stage circuit configured as illustrated in FIG. 38.

When the eight-phase gate clock signals GCK are input to the shift register 410 that includes the stage circuits SR configured as described above, the stage circuits SR operate in the same manner as in Embodiment 3 except in that six adjacent stage circuits SR are treated as one stage circuit group SRG Therefore, both when forward scanning and when reverse scanning, during the period in which the stabilization node netB in the stage circuit group SRG is at the low level, the voltages of the output control nodes in the six stage circuits SR that form that stage circuit group SRG sequentially increase and then sequentially decrease. For example, as illustrated in FIG. 37, during forward scanning, the voltages of the output control nodes in the six stage circuits SR that form the stage circuit group SRG sequentially increase and then sequentially decrease. Note that in FIG. 37, the output control nodes of the six adjacent stage circuits SR that form the stage circuit group SRG are respectively denoted by netA1 to netA6 for the first to sixth stages.

At the times indicated by the reference characters ta1 to ta4 in FIG. 37, in the first to fourth stages of the six stages of stage circuits that form the stage circuit group SRG, the corresponding gate clock signals GCK (CKA to CKD) rise while the voltage of the stabilization node netB is at the low level. This can potentially cause the voltages of the output control nodes to float. However, at the points in time at which these corresponding gate clock signals GCK (CKA to CKD) rise, the reset signals for setting the voltages of the corresponding output control nodes to the VSS voltage are at the high level. For example, during the period of time indicated by the arrow TA in FIG. 37, in the stage circuit of the first stage of the six stages of stage circuits that form the stage circuit group SRG, the reset signal for setting the voltage of the output control node netA1 to the VSS voltage is at the high level. As a result, even if the gate clock signals rise while the voltage of the stabilization node netB is at the low level, the voltages of the output control nodes remain set to the VSS voltage, and therefore no abnormal operation occurs.

Moreover, when a k-phase clock signal is used for the gate clock signals GCK, the stabilization control node netB and the stabilization node controller 860 illustrated in FIG. 11 can be shared by up to (k×3/4) stages.

As described above, configuring each stage circuit group SRG to include six adjacent stage circuits SR makes it possible to operate the shift register 410 using the eight-phase gate clock signals GCK. Similar to in Modification Example 2 of Embodiment 1, this makes it possible to provide a monolithic gate driver that includes significantly fewer elements than in conventional configurations. The present modification example also makes it possible to switch the order in which the gate bus lines are scanned. This makes it possible to provide a monolithic gate driver that has a vertical inversion feature using significantly fewer elements than in a conventional configuration.

<4. Other>

Although the embodiments above were described as liquid crystal display devices as an example, the present invention is not limited to this example. The present invention can also be applied to other types of display devices such as organic electroluminescent (EL) display devices.

DESCRIPTION OF REFERENCE CHARACTERS 41o, 41e, 42o, 42e, 43o, 43e, 47o, 47e, 48o, 48e input terminal (of stage circuit)
44, 45, 46 input terminal (of stage circuit group)
49o, 49e output terminal (of stage circuit)
300 source driver (image signal line driver circuit)
400 gate driver (scanning signal line driver circuit)
410 shift register
600 display unit
850o, 850e output control node stabilizer
860 stabilization node controller
CAPo, CAPe capacitor
CKA, CKB, CKC, CKD first gate clock signal, second gate clock signal, third gate clock signal, fourth gate clock signal
GCK gate clock signal
GL1 to GLi gate bus line
GOUT, GOUT(1) to GOUT(i) scanning signal
M1o, M1e, M2o, M2e, M3o, M3e, M4o, M4e, M5, M5o, M5e, M6o, M6e, M7o, M7e, M8o, M8e, M9o, M9e thin-film transistor
netAo, netAe output control node
netB stabilization node
Ro, Re, R1o, R1e, R2o, R2e reset signal
SL1 to SLj source bus line
So, Se, S1o, S1e, S2o, S2e set signal
SR, SR(1) to SR(i) stage circuit
SRG stage circuit group
VSS low-level DC supply voltage

What is claimed is:

1. A shift register for driving scanning signal lines of a display device, the shift register including a plurality of stages each of which comprises a stage circuit that operates in accordance with a plurality of clock signals cyclically alternating between an ON level and an OFF level, wherein each stage circuit that constitutes each stage of the plurality of stages includes:
an output node for outputting a scanning signal to one of the scanning signal lines;
an output control switching element that has a control terminal, a first conduction terminal, and a second conduction terminal, the first conduction terminal receiving a clock signal of the plurality of clock signals that changes from the OFF level to the ON level at a time at which the scanning signal output from the output node should be changed from the OFF level to the ON level, and the second conduction terminal being connected to the output node;
an output control node connected to the control terminal of the output control switching element;
an output control node ON/OFF-switching unit receiving as a set signal one of an upstream-stage scanning signal that is a scanning signal output from an output node of a stage one or more stages upstream and a downstream-stage scanning signal output from an output node of a stage one or more stages downstream, said output control node ON/OFF-switching unit receiving as a reset signal another of the upstream-stage scanning signal and the downstream-stage scanning signal, changing a level of the output control node to the ON level in accordance with the set signal, and changing a level of the output control node to the OFF level in accordance with the reset signal; and
an output control node stabilization switching element including a control terminal, a first conduction terminal, and a second conduction terminal, the first conduction terminal being connected to the output control node, and an OFF-level supply voltage being input to the second conduction terminal,
wherein the plurality of stages are divided into a plurality of stage circuit groups, each of the stage circuit groups including the stage circuits of P adjacent stages, where P is an integer greater than or equal to 2,
wherein each of the stage circuit groups includes a stabilization node that is connected to the control terminal of the output control node stabilization switching element of each of the stage circuits included in the stage circuit group and a stabilization node controller that controls a level of the stabilization node,
wherein the stabilization node controller in each of the stage circuit groups includes:
a first stabilization node OFF-switching element that has a control terminal, a first conduction terminal, and a second conduction terminal, the control terminal thereof being connected to the output control node of the first stage out of the P stage circuits included in the stage circuit group, the first conduction terminal thereof being connected to the stabilization node, and the second conduction terminal thereof being supplied with an OFF-level supply voltage;
a second stabilization node OFF-switching element that has a control terminal, a first conduction terminal, and a second conduction terminal, the control terminal thereof being connected to the output control node of the Pth stage circuit out of the P stage circuits included in the stage circuit group, the first conduction terminal thereof being connected to the stabilization node, and the second conduction terminal thereof being supplied with an OFF-level supply voltage; and one or two stabilization node ON-switching elements that changes the level of the stabilization node to the ON level, and
wherein the stabilization node controller in each of the stage circuit groups includes, as the one or more stabilization node ON-switching element:
a first stabilization node ON-switching element that has a control terminal, a first conduction terminal, and a second conduction terminal, a first scanning order instruction signal that is maintained at a level that depends on a scanning order of the scanning signal lines being input to the control terminal, the first scanning order instruction signal or an ON-level supply voltage being input to the first conduction terminal, and the second conduction terminal being connected to the stabilization node; and a second stabilization node ON-switching element that has a control terminal, a first conduction terminal, and a second conduction terminal, a second scanning order instruction signal that is maintained at a level that depends on the scanning order of the scanning signal lines being input to the control terminal, the second scanning order instruction signal or the ON-level supply voltage being input to the first conduction terminal, and the second conduction terminal being connected to the stabilization node, and wherein the second scanning order instruction signal is maintained at the OFF level when the first scanning order instruction signal is maintained at the ON level, and the second scanning order instruction signal is maintained at the ON level when the first scanning order instruction signal is maintained at the OFF level.

2. The shift register according to claim 1, wherein the output control node ON/OFF-switching unit includes:

a first output control node ON/OFF-switching element that has a control terminal, a first conduction terminal, and a second conduction terminal, the upstream-stage scanning signal being input to the control terminal, the first scanning order instruction signal being input to the first conduction terminal, and the second conduction terminal being connected to the output control node; and a second output control node ON/OFF-switching element that has a control terminal, a first conduction terminal, and a second conduction terminal, the downstream-stage scanning signal being input to the control terminal, the second scanning order instruction signal being input to the first conduction terminal, and second conduction terminal being connected to the output control node.

* * * * *